(12) United States Patent
Dazai et al.

(10) Patent No.: US 8,232,041 B2
(45) Date of Patent: Jul. 31, 2012

(54) POSITIVE RESIST COMPOSITION, METHOD OF FORMING RESIST PATTERN, AND POLYMERIC COMPOUND

(75) Inventors: Takahiro Dazai, Kawasaki (JP);
Tomoyuki Hirano, Kawasaki (JP);
Tasuku Matsumiya, Kawasaki (JP);
Daiju Shiono, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 314 days.

(21) Appl. No.: 12/694,037

(22) Filed: Jan. 26, 2010

(65) Prior Publication Data
US 2010/0209848 A1 Aug. 19, 2010

(30) Foreign Application Priority Data
Feb. 16, 2009 (JP) .................. 2009-033273

(51) Int. Cl.
*G03F 7/039* (2006.01)
*G03F 7/20* (2006.01)
*G03F 7/30* (2006.01)
*C08F 28/06* (2006.01)

(52) U.S. Cl. ............ 430/270.1; 430/910; 430/326; 430/311; 526/256; 526/257

(58) Field of Classification Search .................. None
See application file for complete search history.

(56) References Cited

U.S. PATENT DOCUMENTS

| | | | |
|---|---|---|---|
| 4,458,001 | A | 7/1984 | Taylor |
| 5,945,517 | A | 8/1999 | Nitta et al. |
| 6,153,733 | A | 11/2000 | Yukawa et al. |
| 7,074,543 | B2 | 7/2006 | Iwai et al. |
| 7,078,562 | B2 | 7/2006 | Furukawa et al. |
| 2002/0012874 | A1 | 1/2002 | Namba |
| 2009/0226842 | A1 | 9/2009 | Shimizu et al. |
| 2010/0062364 | A1 | 3/2010 | Dazai et al. |
| 2010/0086873 | A1 | 4/2010 | Seshimo et al. |
| 2010/0136480 | A1 | 6/2010 | Motoike et al. |
| 2010/0178609 | A1 | 7/2010 | Dazai et al. |

(Continued)

FOREIGN PATENT DOCUMENTS
JP 2006-016379 8/1997
(Continued)

OTHER PUBLICATIONS

Office Action in U.S. Appl. No. 12/461,687 mailed Sep. 12, 2011.
Office Action in U.S. Appl. No. 12/721,291 mailed Jan. 6, 2012.
Gil et al., "First Microprocessors with Immersion Lithography," *Optical Microlithography XVIII*, Proceedings of SPIE, vol. 5754, pp. 119-128, 2005.
Kodama et al., "Synthesis of Novel Fluoropolymer for 157nm Photoresists by Cyclo-polymerization", *Advances in Resist Technology and Processing XIX*, Proceedings of SPIE, vol. 4690, pp. 76-83, 2002.
Irie et al., "Surface Property Control for 193nm Immersion Resist" *Journal of Photopolymer Science and Technology*, vol. 19, No. 4, pp. 565-568, 2006.

(Continued)

*Primary Examiner* — Sin J. Lee
(74) *Attorney, Agent, or Firm* — Knobbe Martens Olson & Bear LLP

(57) ABSTRACT

A polymeric compound (A1) includes a structural unit (a0-1) represented by general formula (a0-1), a structural unit (a0-2) represented by general formula (a0-2), and a structural unit (a1-0-1) represented by general formula (a1-0-1), wherein relative to the combined total of all the structural units, the proportion of the structural unit (a0-1) is from 10 to 40 mol %, the proportion of the structural unit (a0-2) is from 5 to 20 mol %, and the proportion of the structural unit (a1-0-1) is from 10 to 55 mol %. [In the formulas, each of $R^1$ and R independently represents a hydrogen atom, an alkyl group of 1 to 5 carbon atoms, or a halogenated alkyl group of 1 to 5 carbon atoms, $R^2$, A and B each represents a divalent linking group, $R^3$ represents a cyclic group containing —$SO_2$— within the ring skeleton thereof, and $R^4$ and $X^1$ each represents an acid-dissociable, dissolution-inhibiting group.]

[Chemical Formula 1]

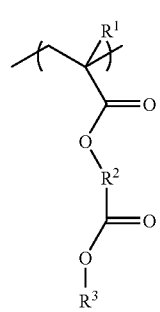

(a0-1)

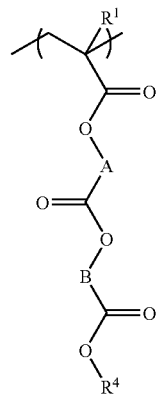

(a0-2)

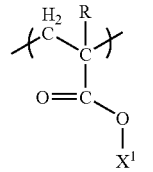

(a1-0-1)

10 Claims, No Drawings

U.S. PATENT DOCUMENTS

| | | | |
|---|---|---|---|
| 2010/0183981 A1 | 7/2010 | Matsumiya et al. | |
| 2010/0196820 A1 | 8/2010 | Kawaue et al. | |
| 2010/0196821 A1 | 8/2010 | Dazai et al. | |
| 2010/0233623 A1 | 9/2010 | Kurosawa et al. | |
| 2010/0233624 A1 | 9/2010 | Kakinoya et al. | |
| 2010/0233625 A1 | 9/2010 | Hirano et al. | |
| 2010/0233626 A1 | 9/2010 | Shimizu et al. | |
| 2011/0009661 A1* | 1/2011 | Tanaka et al. | 560/117 |
| 2011/0117497 A1* | 5/2011 | Sato et al. | 430/270.1 |
| 2011/0236824 A1 | 9/2011 | Hirano et al. | |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2005-037888 | 2/2005 |
| JP | A-2007-031355 | 2/2007 |
| WO | WO 2004/074242 | 9/2004 |
| WO | WO 2009/104753 A1 * | 8/2009 |
| WO | WO 2010/001913 A1 * | 1/2010 |

OTHER PUBLICATIONS

Notice of Allowance issued in U.S. Appl. No. 12/461,687 on Jan. 25, 2012.

Office Action issued in U.S. Appl. No. 12/717,870 on Sep. 14, 2011.

Office Action issued in U.S. Appl. No. 12/717,870 on Jan. 26, 2012.

* cited by examiner

POSITIVE RESIST COMPOSITION, METHOD OF FORMING RESIST PATTERN, AND POLYMERIC COMPOUND

BACKGROUND OF THE INVENTION

1. Field of the Invention

The present invention relates to a novel polymeric compound which can be used as a base component for a positive resist composition, a positive resist composition containing this polymeric compound, and a method of forming a resist pattern using this positive resist composition.

Priority is claimed on Japanese Patent Application No. 2009-033273, filed Feb. 16, 2009, the content of which is incorporated herein by reference.

2. Description of Related Art

In lithography techniques, for example, a resist film composed of a resist material is formed on a substrate, and this resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter than these excimer lasers, such as $F_2$ excimer lasers, electron beam, extreme ultraviolet radiation (EUV), and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits changed solubility in an alkali developing solution under action of acid and an acid generator that generates acid upon exposure.

For example, a chemically amplified positive resist composition typically contains a resin component (base resin) that exhibits increased solubility in an alkali developing solution under the action of acid, and an acid generator. If the resist film formed using the resist composition is selectively exposed during formation of a resist pattern, then within the exposed portions, acid is generated from the acid generator, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are widely used as base resins for resists that use ArF excimer laser lithography, as they exhibit excellent transparency in the vicinity of 193 nm (for example, see Patent Documents 1 and 2).

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

Further, in order to improve various lithography properties, a resin having a plurality of structural units is currently used as the base resin for a chemically amplified resist. For example, in the case of a positive resist, a base resin containing a structural unit having an acid-dissociable, dissolution-inhibiting group that is dissociated by the action of acid generated from the acid generator, a structural unit having a polar group such as a hydroxyl group, and a structural unit having a lactone structure and the like is typically used. Among these structural units, a structural unit having a lactone structure is generally considered as being effective in improving the adhesion between the resist film and the substrate, and increasing the compatibility with an alkali developing solution, thereby contributing to improvement in various lithography properties.

[Patent Document 1] Japanese Unexamined Patent Application, First Publication No. 2003-241385
[Patent Document 2] Japanese Unexamined Patent Application, First Publication No. 2006-016379

Problems to be Solved by the Invention

As further progress is made in lithography techniques and the application field for lithography techniques expands, development of novel materials for use in lithography will be desired. For example, as the miniaturization of resist patterns progresses, improvement will be demanded for resist materials with respect to various lithography properties such as resolution and the like.

Mask error factor (MEF) is one such lithography property. The MEF is a parameter that indicates how faithfully mask patterns of differing dimensions can be reproduced by using the same exposure dose with fixed pitch and changing the mask size (namely, the mask reproducibility).

In the formation of a resist pattern using a conventional resist composition, when the mask size (such as the hole diameter of a hole pattern, or the line width of a line and space pattern) is changed, the amount of light irradiated on exposed portions is changed. As a result, disadvantages are likely to be caused in that the actual size of the formed pattern is deviated from the mask size, and pattern collapse occurs in the formation of an extremely fine pattern with a narrow pitch. For example, when a hole pattern having a hole diameter of not more than approximately 100 nm is formed, the circularity of the holes is likely to deteriorate.

The present invention takes the above circumstances into consideration, with an object of providing a novel polymeric compound which can be used as a base component for a positive resist composition, a compound useful as a monomer for this polymeric compound, a positive resist composition containing the polymeric compound, and a method of forming a resist pattern using this positive resist composition.

SUMMARY OF THE INVENTION

In order to achieve the above object, the present invention employs the following aspects.

Specifically, a first aspect of the present invention is a positive resist composition including a base component (A) that exhibits increased solubility in an alkali developing solution under action of acid and an acid-generator component (B) that generates acid upon exposure, the base component (A) including a polymeric compound (A1) containing a structural unit (a0-1) represented by general formula (a0-1) shown below, a structural unit (a0-2) represented by general formula (a0-2) shown below, and a structural unit (a1-0-1) represented by general formula (a1-0-1) shown below, wherein relative to the combined total of all the structural units that constitute the polymeric compound (A1), the proportion of the structural unit (a0-1) is within a range from 10 to 40 mol %, the proportion of the structural unit (a0-2) is within a range from 5 to 20 mol %, and the proportion of the structural unit (a1-0-1) is within a range from 10 to 55 mol %.

A second aspect of the present invention is a method of forming a resist pattern, including applying a positive resist composition according to the first aspect onto a substrate to form a resist film, subjecting the resist film to exposure, and subjecting the resist film to alkali developing to form a resist pattern.

A third aspect of the present invention is a polymeric compound (A1) containing a structural unit (a0-1) represented by general formula (a0-1) shown below, a structural unit (a0-2) represented by general formula (a0-2) shown below, and a structural unit (a1-0-1) represented by general formula (a1-0-1) shown below, wherein relative to the combined total of all the structural units that constitute the polymeric compound (A1), the proportion of the structural unit (a0-1) is within a range from 10 to 40 mol %, the proportion of the structural unit (a0-2) is within a range from 5 to 20 mol %, and the proportion of the structural unit (a1-0-1) is within a range from 10 to 55 mol %.

[Chemical Formula 1]

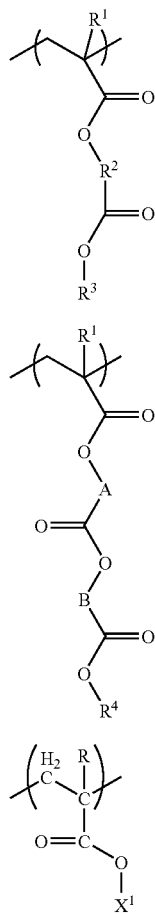

[Chemical Formula 2]

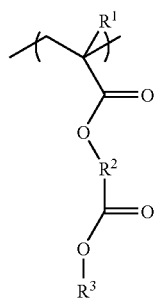

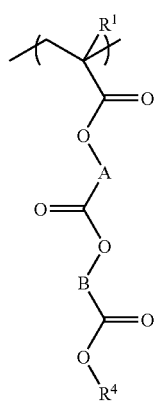

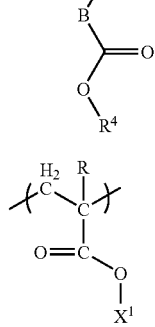

In the formula, each of $R^1$ and R independently represents a hydrogen atom, an alkyl group of 1 to 5 carbon atoms, or a halogenated alkyl group of 1 to 5 carbon atoms, $R^2$, A and B each represents a divalent linking group, $R^3$ represents a cyclic group containing —$SO_2$— within the ring skeleton thereof, and $R^4$ and $X^1$ each represents an acid-dissociable, dissolution-inhibiting group.

In the present description and claims, the term "aliphatic" is a relative concept used in relation to the term "aromatic", and defines a group or compound or the like that has no aromaticity.

The term "alkyl group" includes linear, branched or cyclic, monovalent saturated hydrocarbon groups, unless otherwise specified.

The term "alkylene group" includes linear, branched or cyclic divalent saturated hydrocarbon groups, unless otherwise specified. The same applies for the alkyl group within an alkoxy group.

A "halogenated alkyl group" is a group in which some or all of the hydrogen atoms of an alkyl group have been substituted with halogen atoms. Examples of these halogen atoms include fluorine atoms, chlorine atoms, bromine atoms and iodine atoms.

A "fluorinated alkyl group" or a "fluorinated alkylene group" is a group in which some or all of the hydrogen atoms of an alkyl group or an alkylene group have been substituted with fluorine atoms.

A "halogen atom" refers to a fluorine atom, chlorine atom, bromine atom or iodine atom, unless otherwise specified.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

The term "acrylate ester" is a generic term that includes the acrylate ester having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group.

Hereafter, an alkyl group of 1 to 5 carbon atoms and a halogenated alkyl group of 1 to 5 carbon atoms are frequently referred to as a lower alkyl group and a halogenated lower alkyl group respectively. A carbon atom on the α-position of an acrylate ester refers to the carbon atom bonded to the carbonyl group, unless specified otherwise.

The term "exposure" is used as a general concept that includes irradiation with any form of radiation.

Effect of the Invention

According to the present invention, there are provided a novel polymeric compound which can be used as a base component for a positive resist composition, a positive resist composition containing this polymeric compound, and a method of forming a resist pattern using the positive resist composition.

DETAILED DESCRIPTION OF THE INVENTION PREFERRED EMBODIMENTS

<<Positive Resist Composition>>

The positive resist composition of the present invention (hereafter, frequently referred to simply as the "resist composition") includes a base component (A) (hereafter, referred to as "component (A)") that exhibits increased solubility in an alkali developing solution under action of acid and an acid-generator component (B) (hereafter, referred to as "component (B)") that generates acid upon exposure.

In the positive resist composition, when radial rays are irradiated (when exposure is conducted), acid is generated from the component (B), and the solubility of the component (A) in an alkali developing solution is increased by the action of this generated acid. Therefore, in the formation of a resist pattern, by conducting selective exposure of a resist film formed by using the positive resist composition of the present invention, the solubility of the exposed portions in an alkali developing solution is increased, whereas the solubility of the unexposed portions in an alkali developing solution is unchanged, and hence, a resist pattern can be formed by alkali developing.

Here, the term "base component" refers to an organic compound capable of forming a film. As the base component, an organic compound having a molecular weight of 500 or more is preferably used. When the organic compound has a molecular weight of 500 or more, the film-forming ability is improved, and a resist pattern of nano level can be easily formed.

The "organic compound having a molecular weight of 500 or more" which can be used as a base component is broadly classified into non-polymers and polymers.

In general, as a non-polymer, any of those which have a molecular weight in the range of 500 to less than 4,000 can be used. Hereafter, a non-polymer having a molecular weight in the range of 500 to less than 4,000 is referred to as a low molecular weight compound.

As a polymer, any of those which have a molecular weight of 2,000 or more can be used. Hereafter, a polymer having a molecular weight of 2,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

<Component (A)>

In the positive resist composition of the present invention, the base component (A) contains the polymeric compound (A1).

[Polymeric Compound (A1)]

The polymeric compound (A1) (hereafter, referred to as "component (A1)") includes a structural unit (a0-1) represented by general formula (a0-1) shown above, a structural unit (a0-2) represented by general formula (a0-2) shown above, and a structural unit (a1-0-1) represented by general formula (a1-0-1) shown above, wherein relative to the combined total of all the structural units that constitute the polymeric compound (A1), the proportion of the structural unit (a0-1) is within a range from 10 to 40 mol %, the proportion of the structural unit (a0-2) is within a range from 5 to 20 mol %, and the proportion of the structural unit (a1-0-1) is within a range from 10 to 55 mol %.

The component (A1) preferably includes a structural unit (a2) derived from an acrylate ester containing a lactone-containing cyclic group, as well as the structural units (a0-1), (a0-2) and (a1-0-1).

Furthermore, the component (A1) preferably includes a structural unit (a3) derived from an acrylate ester containing a polar group-containing aliphatic hydrocarbon group, as well as either the structural units (a0-1), (a0-2) and (a1-0-1), or the structural units (a0-1), (a0-2), (a1-0-1) and (a2).

Moreover, the component (A1) preferably includes a structural unit (a1') derived from an acrylate ester containing an acid-dissociable, dissolution-inhibiting group which does not fall under the category of the aforementioned structural units, as well as the structural units (a0-1), (a0-2), (a1-0-1) and (a3).

(Structural Unit (a0-1))

In general formula (a0-1), $R^1$ represents a hydrogen atom, a lower alkyl group or a halogenated lower alkyl group.

The lower alkyl group for $R^1$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group or neopentyl group.

The halogenated lower alkyl group for $R^1$ is a group in which some or all of the hydrogen atoms of the aforementioned alkyl group is substituted with halogen atoms. Examples of the halogen atoms include fluorine atoms, chlorine atoms, bromine atoms and iodine atoms, and fluorine atoms are particularly desirable.

As $R^1$, a hydrogen atom, a lower alkyl group or a fluorinated alkyl group is preferable, and a hydrogen atom or a methyl group is particularly desirable in terms of industrial availability.

In general formula (a0-1), $R^2$ represents a divalent linking group.

Preferable examples of $R^2$ include divalent hydrocarbon groups which may have a substituent, and divalent linking groups containing a hetero atom.

The expression that the hydrocarbon "may have a substituent" means that some or all of the hydrogen atoms within the hydrocarbon group may be substituted with groups or atoms other than hydrogen atom.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

Specific examples of the aliphatic hydrocarbon group include linear or branched aliphatic hydrocarbon groups, and aliphatic hydrocarbon groups containing a ring in the structure thereof.

The linear or branched aliphatic hydrocarbon group preferably contains 1 to 10 carbon atoms, more preferably 1 to 8, still more preferably 1 to 5, and most preferably 1 or 2 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and pentamethylene group [—$(CH_2)_5$—].

As the branched aliphatic hydrocarbon group, a branched alkylene group is preferable, and specific examples include alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated lower alkyl group of 1 to 5 carbon atoms, and an oxygen atom (=O).

Examples of the aliphatic hydrocarbon group containing a ring in the structure thereof include cyclic aliphatic hydrocarbon groups (groups in which two hydrogen atoms have been removed from an aliphatic hydrocarbon ring), and groups in which this cyclic aliphatic hydrocarbon group is bonded to the terminal of the aforementioned chain-like aliphatic hydrocarbon group or interposed within the aforementioned chain-like aliphatic hydrocarbon group.

The cyclic aliphatic hydrocarbon group preferably contains 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of substituents include lower alkyl groups of 1 to 5 carbon atoms, a fluorine atom, fluorinated lower alkyl groups of 1 to 5 carbon atoms, and an oxygen atom (=O).

In the "divalent linking group containing a hetero atom", the hetero atom is an atom other than carbon and hydrogen, and examples thereof include an oxygen atom, a nitrogen atom, a sulfur atom and a halogen atom.

Specific examples of the divalent linking group containing a hetero atom include —O—, —C(=O)—, —C(=O)—O—, a carbonate bond (—O—C(=O)—O—), —NH—, —$NR^{04}$— (wherein $R^{04}$ represents an alkyl group), —NH—C(=O)—, and =N—. Further, a combination of any one of these "divalent linking groups containing a hetero atom" with a divalent hydrocarbon group can also be used. Examples of the divalent hydrocarbon group include the same groups as those described above for the hydrocarbon group which may have a substituent, and a linear or branched aliphatic hydrocarbon group is preferable.

$R^2$ may or may not have an acid-dissociable portion in the structure thereof. An "acid-dissociable portion" refers to a portion within this organic group that is dissociated from the organic group by action of the acid generated upon exposure. When the $R^2$ group has an acid-dissociable portion, it preferably has an acid-dissociable portion having a tertiary carbon atom.

In the present invention, as the divalent linking group for $R^2$, an alkylene group, a divalent aliphatic cyclic group or a divalent linking group containing a hetero atom is preferable. Among these, an alkylene group is particularly desirable.

When $R^2$ represents an alkylene group, this alkylene group preferably has 1 to 10 carbon atoms, more preferably 1 to 6, still more preferably 1 to 4, and most preferably 1 to 3 carbon atoms. Specific examples of the alkylene group include the aforementioned linear alkylene groups and branched alkylene groups.

When $R^2$ represents a divalent aliphatic cyclic group, examples of the aliphatic cyclic group include the same groups as the cyclic aliphatic hydrocarbon groups described above for the "aliphatic hydrocarbon group containing a ring in the structure thereof".

As this aliphatic cyclic group, a group in which two or more hydrogen atoms have been removed from cyclopentane, cyclohexane, norbornane, isobornane, adamantane, tricyclodecane or tetracyclododecane is particularly desirable.

When $R^2$ represents a divalent linking group containing a hetero atom, preferred examples of the linking group include —O—, —C(=O)—O—, —C(=O)—, —O—C(=O)—O—, —C(=O)—NH—, —NH— (wherein H may be replaced with a substituent such as an alkyl group or acyl group or the like), —S—, —S(=O)$_2$—, —S(=O)$_2$—O—, a group represented by the formula -A'''-O—B'''—, and a group represented by the formula -[A'''-C(=O)—O]$_m$—B'''—. Herein, each of A''' and B''' independently represents a divalent hydrocarbon group which may have a substituent, and m represents an integer of 0 to 3.

When $R^2$ represents —NH—, the H may be replaced with a substituent such as an alkyl group or acyl group or the like. This substituent (an alkyl group or acyl group or the like) preferably has 1 to 10 carbon atoms, more preferably 1 to 8, and most preferably 1 to 5 carbon atoms.

In the group represented by the formula -A'''-O—B'''—, or the formula -[A'''-C(=O)—O]$_m$—B'''—, each of A''' and B''' independently represents a divalent hydrocarbon group which may have a substituent.

Examples of the divalent hydrocarbon groups for A''' and B''' which may have a substituent include the same groups as those described above for the "divalent hydrocarbon group which may have a substituent" that is usable as $R^2$.

As A''', a linear aliphatic hydrocarbon group is preferable, a linear alkylene group is more preferable, a linear alkylene group of 1 to 5 carbon atoms is still more preferable, and a methylene group or an ethylene group is particularly desirable.

As B''', a linear or branched aliphatic hydrocarbon group is preferable, and a methylene group, an ethylene group or an alkylmethylene group is more preferable. The alkyl group within this alkylmethylene group is preferably a linear alkyl group of 1 to 5 carbon atoms, more preferably a linear alkyl group of 1 to 3 carbon atoms, and most preferably a methyl group.

Further, in the group represented by the formula -[A'''-C(=O)—O]$_m$—B'''—, m represents an integer of 0 to 3, preferably an integer of 0 to 2, more preferably 0 or 1, and most preferably 1.

In general formula (a0-1), $R^3$ represents a cyclic group containing —SO$_2$— within the ring skeleton thereof.

Specifically, $R^3$ is a cyclic group in which the sulfur atom (S) in the —SO$_2$— group forms a part of the ring skeleton of the cyclic group.

The cyclic group for $R^3$ refers to a cyclic group including a ring that contains —SO$_2$— within the ring skeleton thereof, and this ring is counted as the first ring. A cyclic group in which this ring that contains —SO$_2$— is the only ring structure is referred to as a monocyclic group, and a group containing other ring structures is described as a polycyclic group regardless of the structure of the other rings. The cyclic group for $R^3$ may be either a monocyclic group or a polycyclic group.

It is particularly desirable that $R^3$ be a cyclic group containing —O—SO$_2$— within the ring skeleton thereof, namely, a cyclic group having a sultone ring in which the —O—S— within the —O—SO$_2$— forms a part of the ring skeleton of the cyclic group.

The cyclic group for $R^3$ preferably has 3 to 30 carbon atoms, more preferably 4 to 20, still more preferably 4 to 15, and most preferably 4 to 12 carbon atoms. Herein, the number of carbon atoms refers to the number of carbon atoms that constitute the ring skeleton, and excludes the number of carbon atoms within substituents.

The cyclic group for $R^3$ may be either an aliphatic cyclic group or an aromatic cyclic group. An aliphatic cyclic group is preferable.

Examples of the aliphatic cyclic group for $R^3$ include the aforementioned cyclic aliphatic hydrocarbon groups in which some of the carbon atoms constituting the ring skeleton thereof have been substituted with —SO$_2$— or —O—SO$_2$—.

More specifically, examples of monocyclic groups include monocycloalkanes in which one hydrogen atom have been removed therefrom and a —CH$_2$— group constituting the ring skeleton thereof has been substituted with —SO$_2$—, and monocycloalkanes in which one hydrogen atom have been removed therefrom and a —CH$_2$—CH$_2$— group constituting the ring skeleton thereof has been substituted with —O—SO$_2$—. Examples of polycyclic groups include polycycloalkanes (such as a bicycloalkane, a tricycloalkane, a tetracycloalkane or the like) in which one hydrogen atom has been removed therefrom and a —CH$_2$— group constituting the ring skeleton thereof has been substituted with —SO$_2$—, and polycycloalkanes in which one hydrogen atom has been removed therefrom and a —CH$_2$—CH$_2$— group constituting the ring skeleton thereof has been substituted with —O—SO$_2$—.

The cyclic group for $R^3$ may have a substituent. Examples of this substituent include an alkyl group, an alkoxy group, a halogen atom, a halogenated alkyl group, a hydroxy group, an oxygen atom (=O), —COOR'', —OC(=O)R'', a hydroxyalkyl group and a cyano group.

The alkyl group for this substituent is preferably an alkyl group of 1 to 6 carbon atoms. Further, this alkyl group is preferably a linear alkyl group or a branched alkyl group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferable, and a methyl group is particularly desirable.

As the alkoxy group for this substituent, an alkoxy group of 1 to 6 carbon atoms is preferable. Further, the alkoxy group is preferably a linear alkoxy group or a branched alkyl group. Specific examples of the alkoxy groups include groups in which an aforementioned alkyl group substituent has an oxygen atom (—O—) bonded thereto.

Examples of halogen atoms for this substituent include a fluorine atom, a chlorine atom, a bromine atom and an iodine atom, and a fluorine atom is preferable.

Examples of halogenated alkyl groups for this substituent include groups in which some or all of the hydrogen atoms within an aforementioned alkyl group have been substituted with the aforementioned halogen atoms. As this halogenated alkyl group, a fluorinated alkyl group is preferable, and a perfluoroalkyl group is particularly desirable.

In the —COOR'' group and the —OC(=O)R'' group, R'' represents a hydrogen atom or a linear, branched or cyclic alkyl group of 1 to 15 carbon atoms.

When R'' represents a linear or branched alkyl group, it is preferably an alkyl group of 1 to 10 carbon atoms, more preferably an alkyl group of 1 to 5 carbon atoms, and most preferably a methyl group or an ethyl group.

When R'' is a cyclic alkyl group, it preferably contains 3 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane.

The hydroxyalkyl group for this substituent preferably has 1 to 6 carbon atoms, and specific examples thereof include the aforementioned alkyl group substituents in which at least one hydrogen atom has been substituted with a hydroxy group.

More specific examples of $R^3$ include groups represented by general formulas (3-1) to (3-4) shown below.

[Chemical Formula 3]

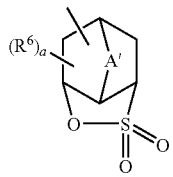
(3-1)

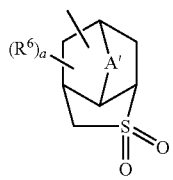
(3-2)

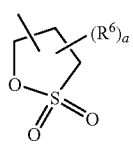
(3-3)

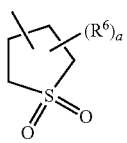
(3-4)

In the formulas, A' represents an oxygen atom, a sulfur atom, or an alkylene group of 1 to 5 carbon atoms which may contain an oxygen atom or a sulfur atom, a represents an integer of 0 to 2, and $R^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom, a sulfur atom, or an alkylene group of 1 to 5 carbon atoms which may contain an oxygen atom (—O—) or a sulfur atom (—S—).

As the alkylene group of 1 to 5 carbon atoms for A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or interposed between carbon atoms within the alkylene group. Specific examples of such alkylene groups include —O—CH$_2$—, —CH$_2$—O—CH$_2$—, —S—CH$_2$—, and —CH$_2$—S—CH$_2$—.

As A', an alkylene group of 1 to 5 carbon atoms or —O— is preferable, an alkylene group of 1 to 5 carbon atoms is more preferable, and a methylene group is the most preferred.

a represents an integer of 0 to 2, and is most preferably 0.

When a is 2, the plurality of $R^2$ groups may be the same or different from each other.

As the alkyl group, alkoxy group, halogenated alkyl group, —COOR" group, —OC(=O)R" group, or hydroxyalkyl group for $R^6$, the same alkyl groups, alkoxy groups, halogenated alkyl groups, —COOR" group, —OC(=O)R" group, and hydroxyalkyl groups as those described above as the substituent with which the cyclic group for $R^3$ may be substituted can be used.

Specific examples of the cyclic groups represented by general formulas (3-1) to (3-4) are shown below. In the formulas shown below, "Ac" represents an acetyl group.

[Chemical Formula 4]

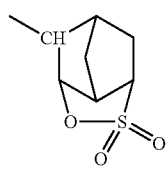
(3-1-1)

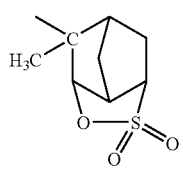
(3-1-2)

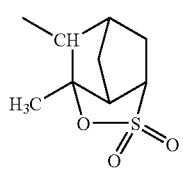
(3-1-3)

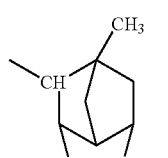
(3-1-4)

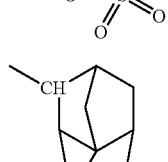
(3-1-5)

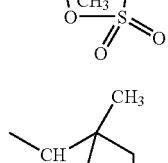
(3-1-6)

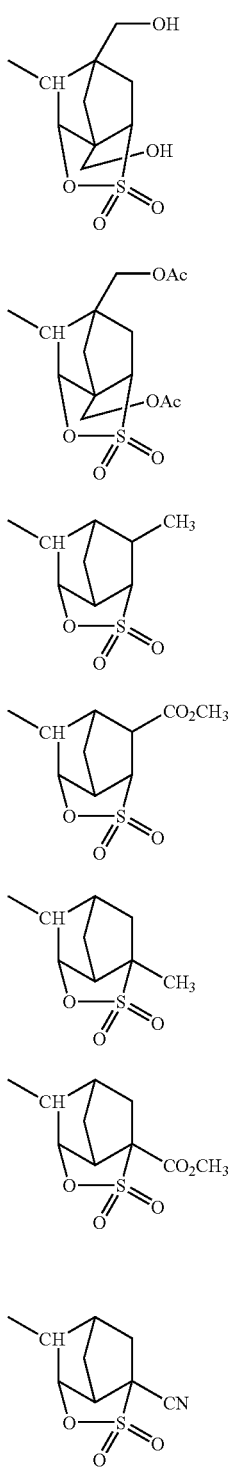
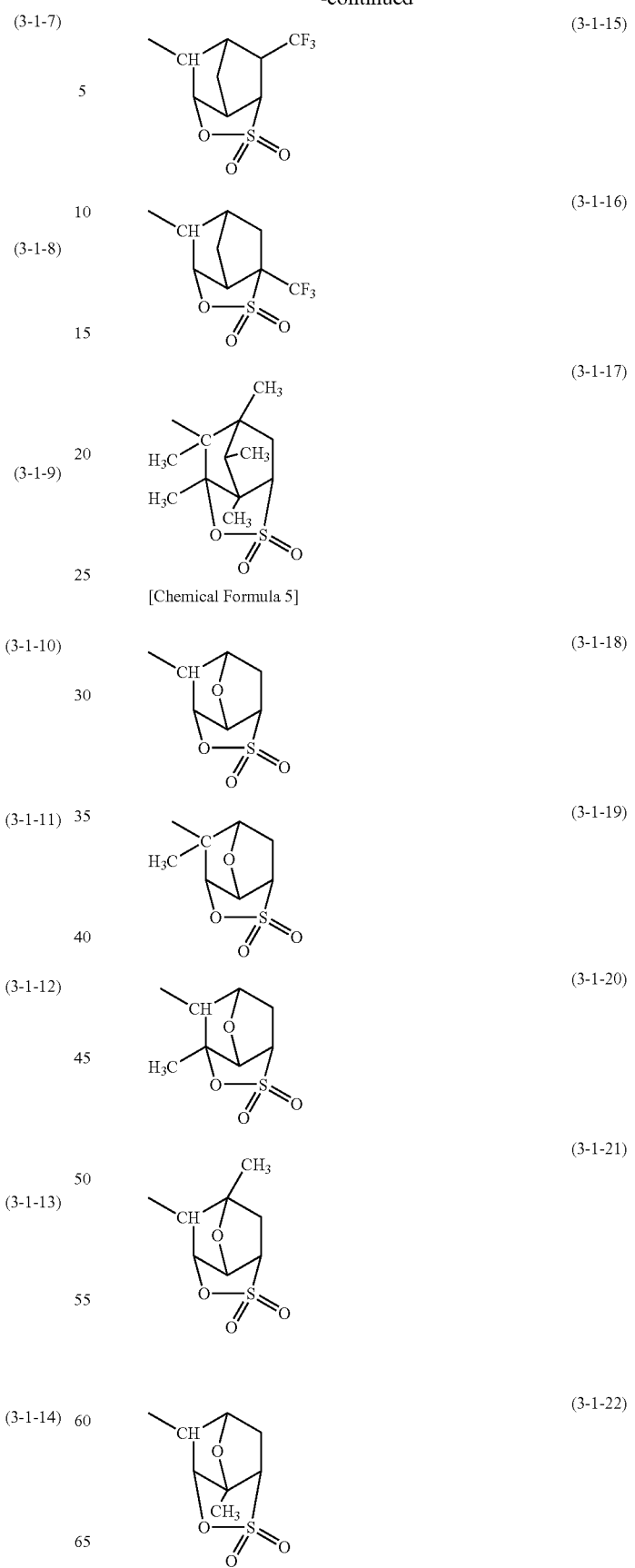

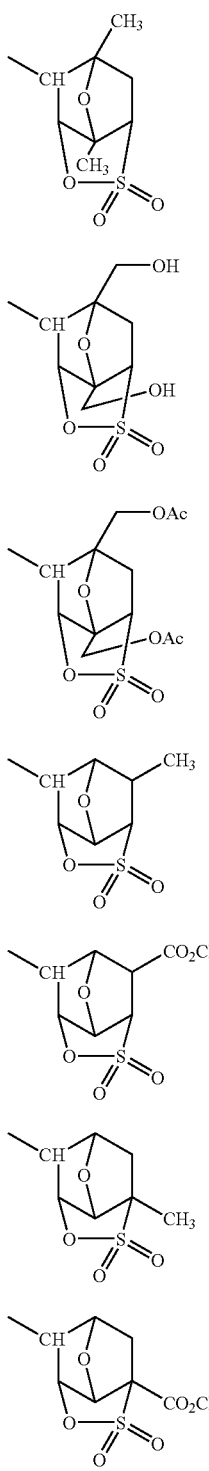
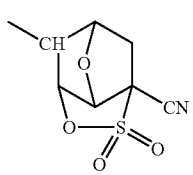
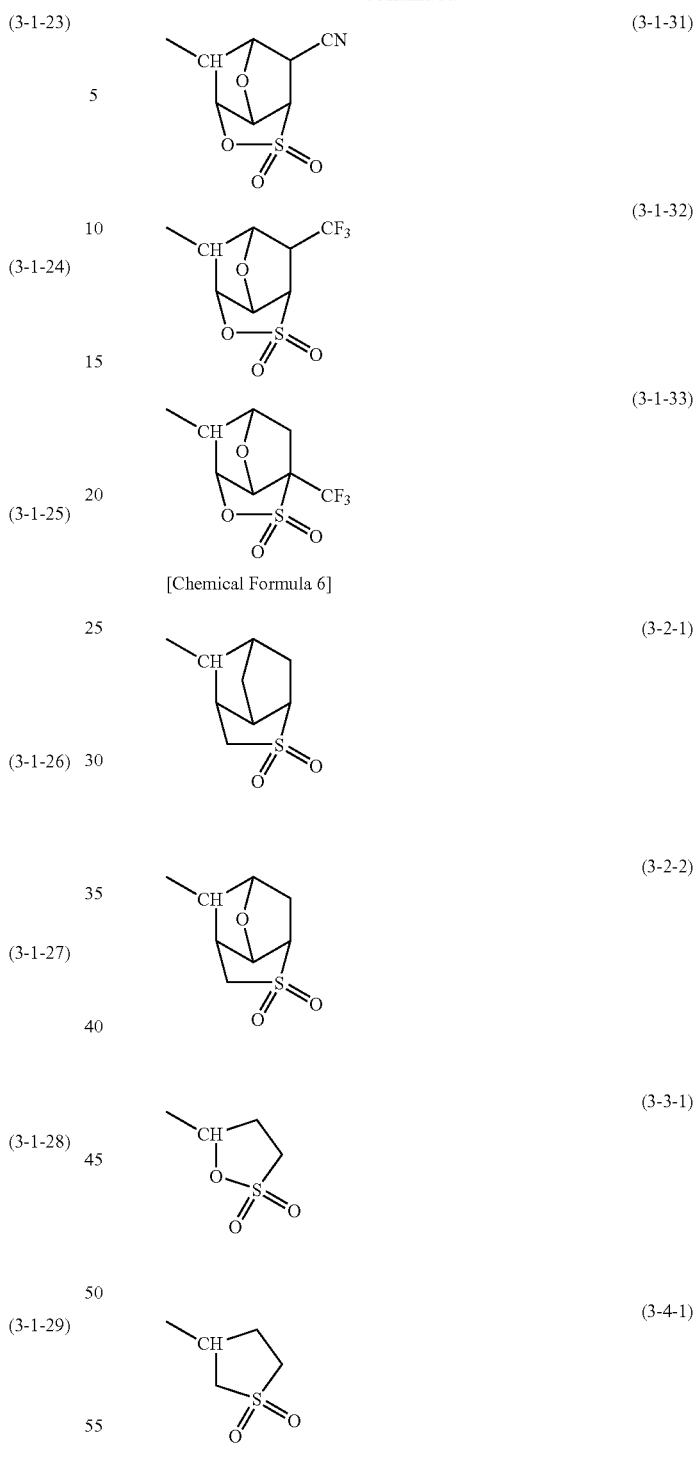

[Chemical Formula 6]

As $R^3$, of the groups shown above, a group represented by general formula (3-1) is preferable, at least one member selected from the group consisting of groups represented by chemical formulas (3-1-1), (3-1-18), (3-3-1) and (3-4-1) is more preferable, and a group represented by chemical formula (3-1-1) is the most preferable.

In the present invention, as the structural unit (a0-1), a structural unit represented by general formula (a0-1-11) shown below is particularly desirable.

[Chemical Formula 7]

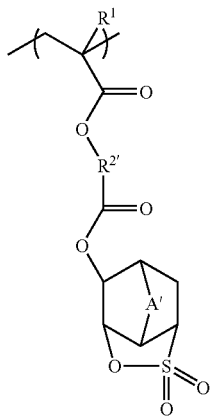

(a0-1-11)

In the formula, $R^1$ is the same as defined above for $R^1$ in general formula (a0-1), $R^{2'}$ represents a linear or branched alkylene group, and A' is the same as defined above for A' in general formula (3-1).

The linear or branched alkylene group for $R^{2'}$ preferably has 1 to 10 carbon atoms, more preferably 1 to 8, still more preferably 1 to 5, still more preferably 1 to 3, and most preferably 1 or 2 carbon atoms.

A' is preferably a methylene group, an oxygen atom (—O—) or a sulfur atom (—S—).

As the structural unit (a0-1), one type of structural unit may be used alone, or two or more types of structural units may be used in combination.

In terms of achieving excellent properties in terms of the MEF, the shape of the formed resist pattern, the CDU (in-plane uniformity of contact holes) and the LWR (line width roughness) and the like upon formation of a resist pattern using a positive resist composition containing the component (A1), the amount of the structural unit (a0-1) within the component (A1), based on the combined total of all the structural units that constitute the component (A1), is preferably within a range from 10 to 40 mol %, and more preferably from 10 to 35 mol %.

(Structural Unit (a0-2))

In general formula (a0-2), $R^1$ is the same as defined above for $R^1$ in general formula (a0-1).

In general formula (a0-2), examples of A include the same divalent linking groups as those exemplified above for $R^2$ within general formula (a0-1).

A is preferably a divalent hydrocarbon group which may have a substituent, is more preferably a linear aliphatic hydrocarbon group, and is still more preferably a linear alkylene group. Of such groups, an alkylene group of 1 to 5 carbon atoms is preferable, and a methylene group or an ethylene group is the most desirable.

In general formula (a0-2), examples of B include the same divalent linking groups as those exemplified above for A.

B is preferably a divalent hydrocarbon group which may have a substituent, is more preferably a linear aliphatic hydrocarbon group, and is still more preferably a linear alkylene group. Of such groups, an alkylene group of 1 to 5 carbon atoms is preferable, and a methylene group or an ethylene group is the most desirable.

$R^4$ is a structural unit derived from an acrylate ester containing an acid-dissociable, dissolution-inhibiting group which does not fall under the category of the aforementioned structural unit (a0-1).

As the acid-dissociable, dissolution-inhibiting group in the structural unit (a0-2), any of the groups that have been proposed as acid-dissociable, dissolution-inhibiting groups for the base resins of chemically amplified resists can be used, provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution. Generally, groups that form either a cyclic or chain-like tertiary alkyl ester with the carboxyl group of the (meth)acrylic acid, and acetal-type acid-dissociable, dissolution-inhibiting groups such as alkoxyalkyl groups are widely known. Here, the term "(meth)acrylate ester" is a generic term that includes either or both of the acrylate ester having a hydrogen atom bonded to the α-position and the methacrylate ester having a methyl group bonded to the α-position.

Here, a "tertiary alkyl ester" describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable, dissolution-inhibiting groups".

Examples of tertiary alkyl ester-type acid-dissociable, dissolution-inhibiting groups include aliphatic branched, acid-dissociable, dissolution-inhibiting groups and aliphatic cyclic group-containing acid-dissociable, dissolution-inhibiting groups.

The term "aliphatic branched" refers to a branched structure having no aromaticity. The structure of an "aliphatic branched, acid-dissociable, dissolution-inhibiting group" is not limited to groups constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of the aliphatic branched, acid-dissociable, dissolution-inhibiting group include, for example, groups represented by the formula —$C(R^{71})(R^{72})(R^{73})$. In this formula, each of $R^{71}$ to $R^{73}$ independently represents a linear alkyl group of 1 to 5 carbon atoms. The group represented by the formula —$C(R^{71})(R^{72})(R^{73})$ preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

The "aliphatic cyclic group" may or may not have a substituent. Examples of the substituent include lower alkyl groups of 1 to 5 carbon atoms, lower alkoxy groups of 1 to 5 carbon atoms, a fluorine atom, fluorinated lower alkyl groups of 1 to 5 carbon atoms, and an oxygen atom (=O).

The basic ring of the "aliphatic cyclic group" excluding substituents is not limited to structures constituted from only carbon and hydrogen (not limited to hydrocarbon groups), but is preferably a hydrocarbon group. Further, the "hydrocarbon group" may be either saturated or unsaturated, but is preferably saturated. The "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane, which may or may not be substituted with a lower alkyl group, a fluorine atom or a fluorinated lower alkyl group, may be used. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Further, in these groups in which either one or more hydrogen atoms have been removed from a monocycloalkane or more hydrogen atoms have been removed from a polycycloalkane, some of the carbon atoms that constitute the ring may be replaced with an ethereal oxygen atom (—O—).

Examples of acid-dissociable, dissolution-inhibiting groups containing an aliphatic cyclic group include:

(i) groups which have a tertiary carbon atom on the ring structure of a monovalent aliphatic cyclic group, and (ii) groups which have a branched alkylene group containing a tertiary carbon atom, and a monovalent aliphatic cyclic group to which the tertiary carbon atom is bonded.

Specific examples of (i), namely groups which have a tertiary carbon atom on the ring structure of a monovalent aliphatic cyclic group, include groups represented by general formulas (1-1) to (1-9) shown below.

Specific examples of (ii), namely groups which have a branched alkylene group containing a tertiary carbon atom and a monovalent aliphatic cyclic group to which the tertiary carbon atom is bonded, include groups represented by general formulas (2-1) to (2-6) shown below.

[Chemical Formula 8]

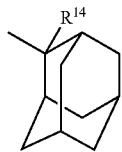
(1-1)

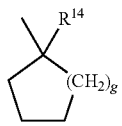
(1-2)

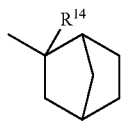
(1-3)

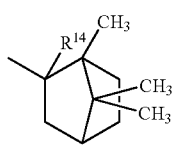
(1-4)

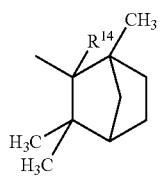
(1-5)

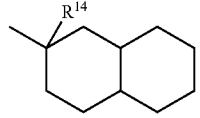
(1-6)

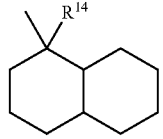
(1-7)

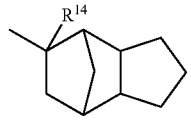
(1-8)

(1-9)

In the formulas, $R^{14}$ represents an alkyl group, and g represents an integer of 0 to 8.

[Chemical Formula 9]

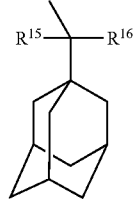
(2-1)

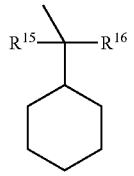
(2-2)

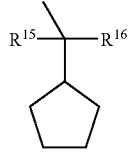
(2-3)

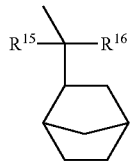
(2-4)

-continued (2-5)

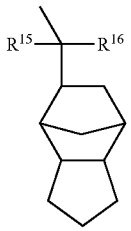

(2-6)

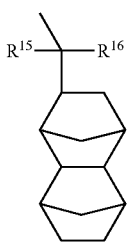

In the formulas, each of $R^{15}$ and $R^{16}$ independently represents an alkyl group.

As the alkyl group for $R^{14}$, a linear or branched alkyl group is preferable.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples include an isopropyl group, an isobutyl group, a tert-butyl group, an isopentyl group and a neopentyl group, and an isopropyl group is particularly desirable.

g is preferably an integer of 0 to 3, more preferably an integer of 1 to 3, and still more preferably 1 or 2.

As the alkyl group for $R^{15}$ and $R^{16}$, the same alkyl groups as those listed above for $R^{14}$ can be used.

In formulas (1-1) to (1-9) and (2-1) to (2-6), some of the carbon atoms that constitute the ring may be replaced with an ethereal oxygen atom (—O—).

Further, in formulas (1-1) to (1-9) and (2-1) to (2-6), one or more of the hydrogen atoms bonded to the carbon atoms that constitute the ring may be substituted with a substituent. Examples of these substituents include a lower alkyl group, a fluorine atom and a fluorinated alkyl group.

An "acetal-type acid-dissociable, dissolution-inhibiting group" generally substitutes a hydrogen atom at the terminal of an alkali-soluble group such as a carboxyl group or hydroxyl group, so as to be bonded with an oxygen atom. When acid is generated upon exposure, this generated acid acts to break the bond between the acetal-type acid-dissociable, dissolution-inhibiting group and the oxygen atom to which the acetal-type, acid-dissociable, dissolution-inhibiting group is bonded.

Examples of acetal-type acid-dissociable, dissolution-inhibiting groups include groups represented by general formula (p1) shown below.

[Chemical Formula 10]

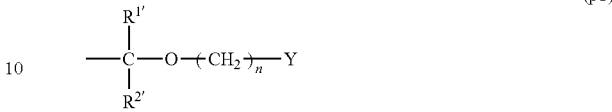

(p1)

In the formula, each of $R^{1'}$ and $R^{2'}$ independently represents a hydrogen atom or a lower alkyl group, n represents an integer of 0 to 3, and Y represents a lower alkyl group or an aliphatic cyclic group.

In general formula (p1) above, n is preferably an integer of 0 to 2, more preferably 0 or 1, and most preferably 0.

As the lower alkyl group for $R^{1'}$ and $R^{2'}$, the same lower alkyl groups as those described above for R can be used, although a methyl group or ethyl group is preferable, and a methyl group is particularly desirable.

In the present invention, it is preferable that at least one of $R^{1'}$ and $R^{2'}$ is a hydrogen atom. That is, it is preferable that the acid-dissociable, dissolution-inhibiting group (p1) is a group represented by general formula (p1-1) shown below.

[Chemical Formula 11]

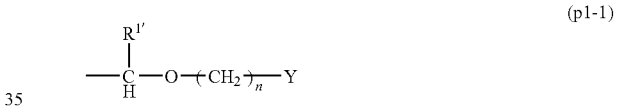

(p1-1)

In the formula, $R^{1'}$, n and Y are the same as defined above for $R^{1'}$, n and Y in general formula (p1).

Examples of the lower alkyl group for Y include the same groups as either those listed above for the lower alkyl group for $R^1$ or those listed below for the lower alkyl group of R.

As the aliphatic cyclic group for Y, any of the aliphatic monocyclic or polycyclic groups which have been proposed for conventional ArF resists and the like can be appropriately selected for use. For example, the same groups described above in connection with the "aliphatic cyclic group" can be used.

Further, as the acetal-type, acid-dissociable, dissolution-inhibiting group, groups represented by general formula (p2) shown below may also be used.

[Chemical Formula 12]

(p2)

In the formula, each of $R^{17}$ and $R^{18}$ independently represents a linear or branched alkyl group or a hydrogen atom, and $R^{19}$ represents a linear, branched or cyclic alkyl group. Alternatively, each of $R^{17}$ and $R^{19}$ may independently represent a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched, although an ethyl group or a methyl group is preferable, and a methyl group is most preferable.

It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of a linear, branched or cyclic group.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, each of $R^{17}$ and $R^{19}$ may independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of this cyclic group include a tetrahydropyranyl group and a tetrahydrofuranyl group.

Specific examples of acetal-type acid-dissociable, dissolution-inhibiting groups include groups represented by formulas (p3-1) to (p3-12) shown below.

[Chemical Formula 13]

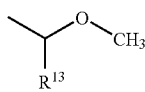

(p3-1)

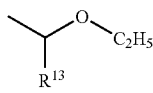

(p3-2)

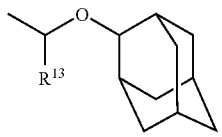

(p3-3)

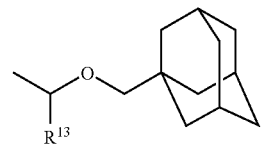

(p3-4)

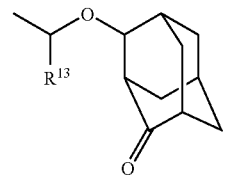

(p3-5)

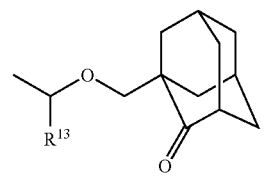

(p3-6)

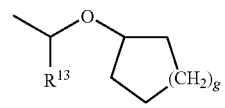

(p3-7)

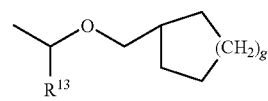

(p3-8)

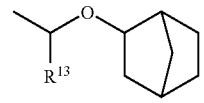

(p3-9)

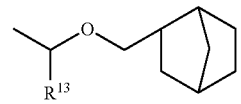

(p3-10)

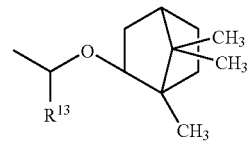

(p3-11)

(p3-12)

In the formulas above, $R^{13}$ represents a hydrogen atom or a methyl group, and g represents an integer of 0 to 8.

g is the same as defined above for g in general formula (1-2).

In the present invention, $R^4$ is preferably a tertiary alkyl ester-type acid-dissociable, dissolution-inhibiting group, is more preferably an aforementioned group (i) which has a tertiary carbon atom on the ring structure of a monovalent aliphatic cyclic group, and of such groups, is preferably a group represented by general formula (1-1).

As the structural unit (a0-2), structural units represented by general formula (a0-2-1) or general formula (a0-2-2) shown below are preferred.

[Chemical Formula 14]

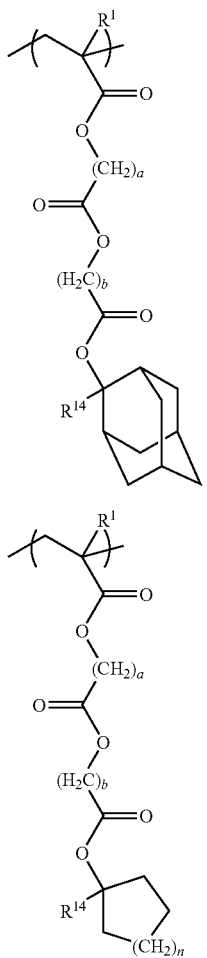

(a0-2-1)

(a0-2-2)

In the formulas, $R^1$ is the same as defined above for $R^1$ in general formula (a0-1), $R^{14}$ is the same as defined above for $R^{14}$ in general formulas (1-1) to (1-9), a represents an integer of 1 to 10, b represents an integer of 1 to 10, and n represents an integer of 0 to 3.

a is preferably an integer of 1 to 5, and most preferably 1 or 2.

b is preferably an integer of 1 to 5, and most preferably 1 or 2.

n is preferably 1 or 2.

As the structural unit (a0-2) contained within the polymeric compound (A1), one type of structural unit may be used alone, or two or more types of structural units may be used in combination.

In terms of achieving improved lithography properties such as resolution, pattern shape and line edge roughness and the like upon formation of a resist pattern using a positive resist composition containing the component (A1), the amount of the structural unit (a0-2) within the component (A1), based on the combined total of all the structural units that constitute the component (A1), is preferably not less than 5 mol %. Further, in terms of achieving favorable thermal properties for the overall component (A1), the amount of the structural unit (a0-2) is preferably not more than 20 mol %, more preferably not more than 18 mol %, and still more preferably 15 mol % or less.

(Structural Unit (a1-0-1))

The structural unit (a1-0-1) is a structural unit represented by general formula (a1-0-1) shown below, and is derived from an acrylate ester containing an acid-dissociable, dissolution-inhibiting group which does not fall under the category of the aforementioned structural units (a0-1) and (a0-2).

[Chemical Formula 15]

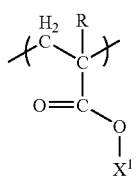

(a1-0-1)

In the formula, R represents a hydrogen atom, a lower alkyl group or a halogenated lower alkyl group, and $X^1$ represents an acid-dissociable, dissolution-inhibiting group.

In general formula (a1-0-1), the lower alkyl group or halogenated lower alkyl group represented by R is the same as defined above for the lower alkyl group or halogenated lower alkyl group represented by $R^1$ in general formula (a0-1).

There are no particular limitations on $X^1$, provided it is an acid-dissociable, dissolution-inhibiting group. Examples thereof include the aforementioned tertiary alkyl ester-type acid-dissociable, dissolution-inhibiting groups and acetal-type acid-dissociable, dissolution-inhibiting groups, and of these, tertiary alkyl ester-type acid-dissociable, dissolution-inhibiting groups are preferable.

Specific examples of the structural unit (a1-0-1) include structural units represented by general formulas (a1-1) and (a1-2) shown below.

[Chemical Formula 16]

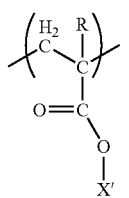

(a1-1)

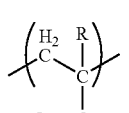

(a1-2)

In the formulas, X' represents a tertiary alkyl ester-type acid-dissociable, dissolution-inhibiting group, Y represents a lower alkyl group of 1 to 5 carbon atoms or an aliphatic cyclic group, n represents an integer of 0 to 3, R is the same as defined above for R in general formula (a1-0-1), and each of $R^{1'}$ and $R^{2'}$ independently represents a hydrogen atom or a lower alkyl group of 1 to 5 carbon atoms.

In the above formulas, examples of X' include the same tertiary alkyl ester-type acid-dissociable, dissolution-inhibiting groups as those exemplified above for $X^1$.

Examples of $R^{1'}$, $R^{2'}$, n and Y include the same groups as those exemplified above for $R^{1'}$, $R^{2'}$, n and Y in general formula (p1) described above in connection with the "acetal-type acid-dissociable, dissolution-inhibiting groups".

Specific examples of structural units represented by general formulas (a1-1) and (a1-2) are shown below.

[Chemical Formula 17]

(a1-1-1)
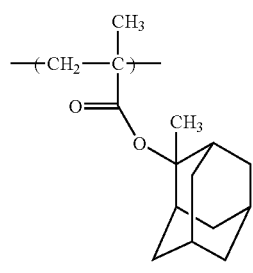

(a1-1-2)
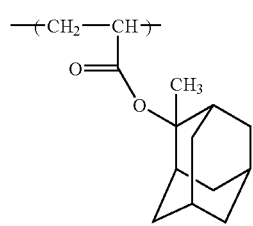

(a1-1-3)
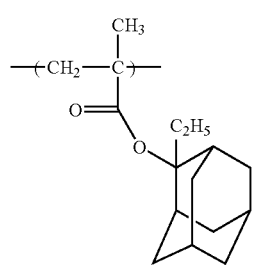

(a1-1-4)
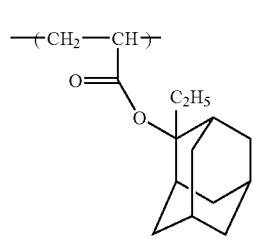

(a1-1-5)
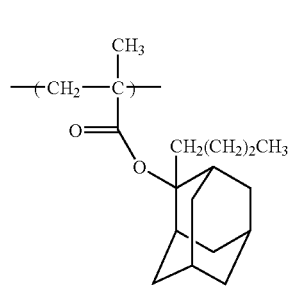

(a1-1-6)
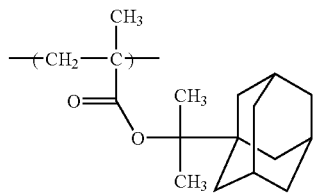

(a1-1-7)
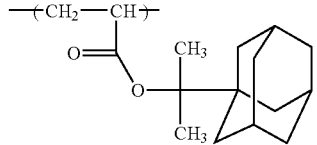

(a1-1-8)
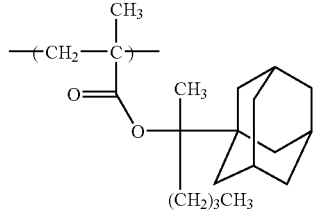

(a1-1-9)
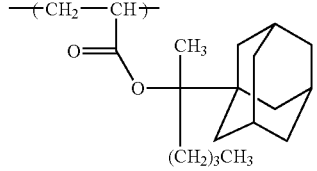

(a1-1-10)
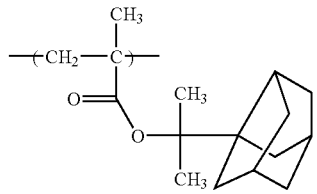

(a1-1-11)
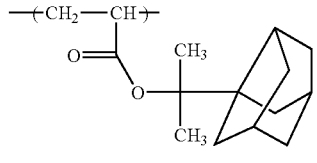

(a1-1-12)
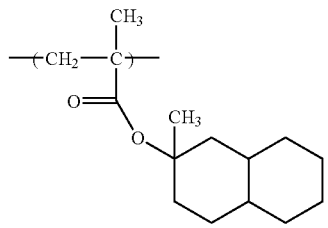

(a1-1-13)
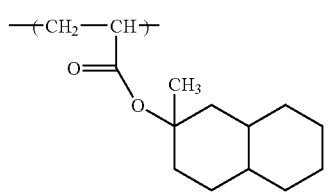

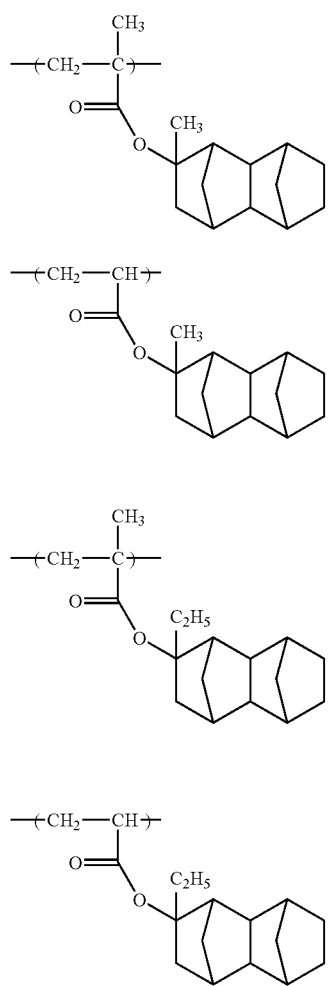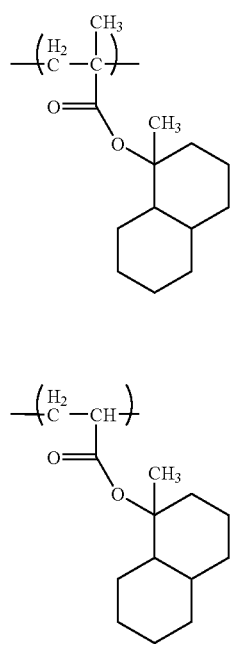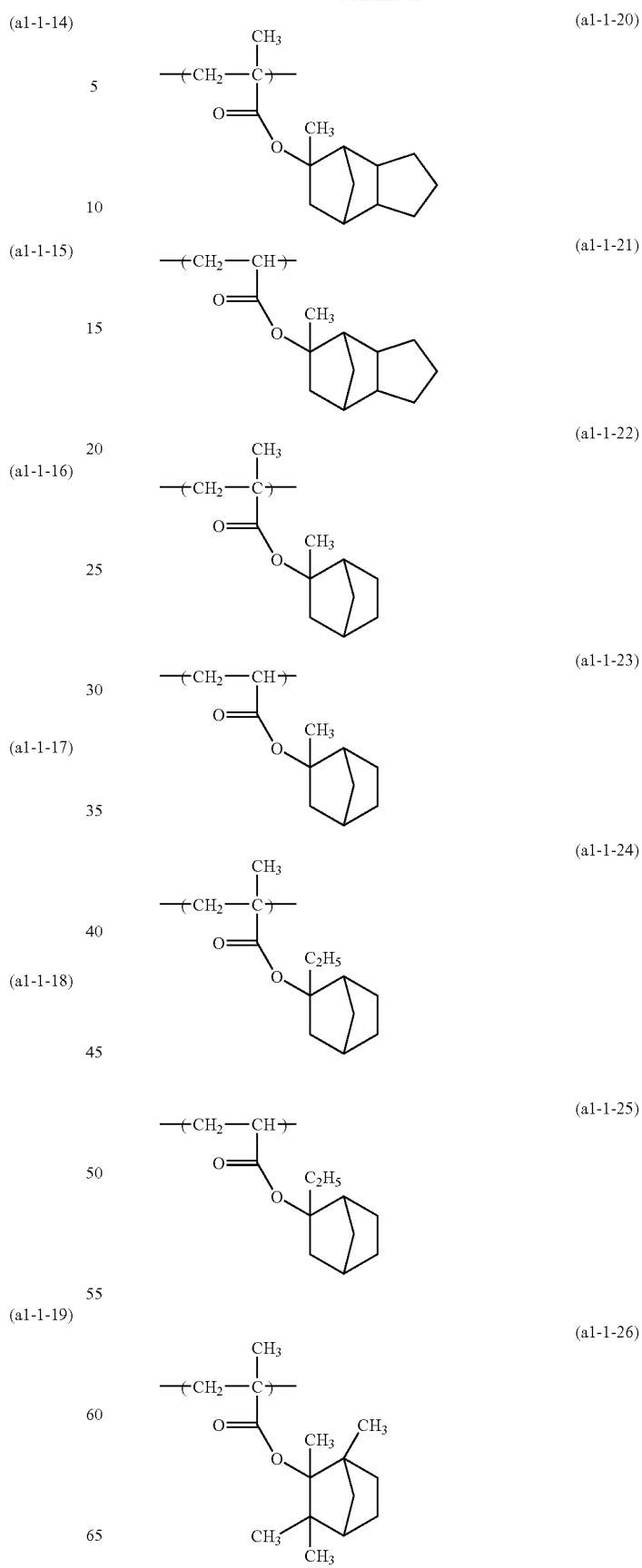

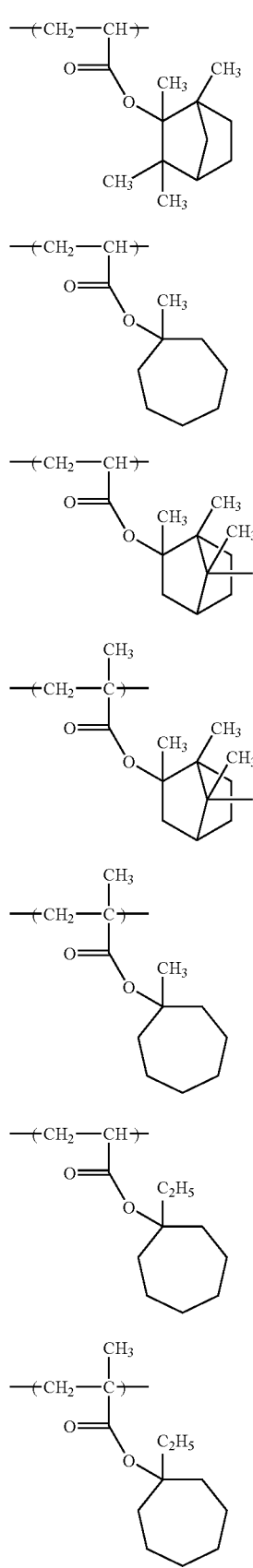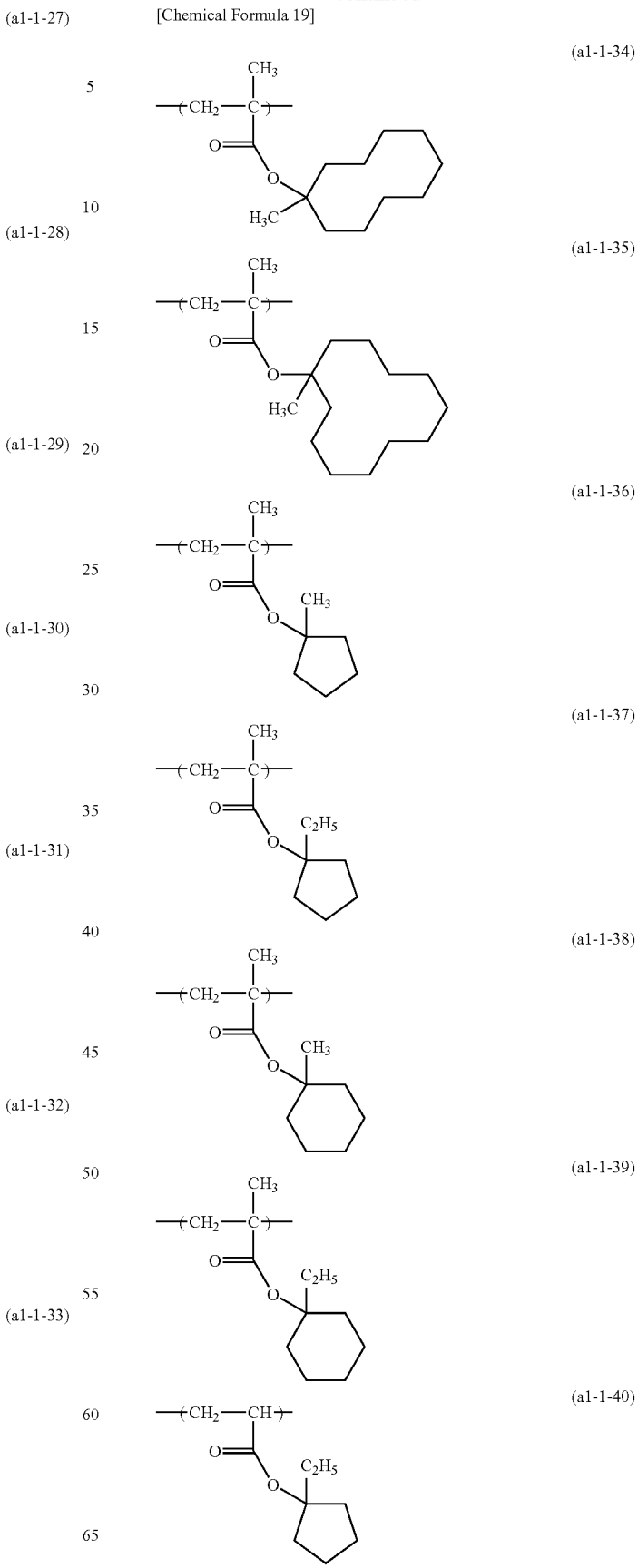

(a1-1-41) 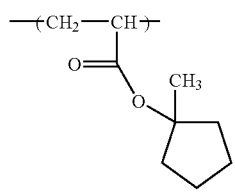
(a1-1-42) 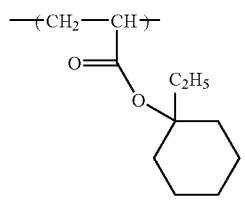
(a1-1-43) 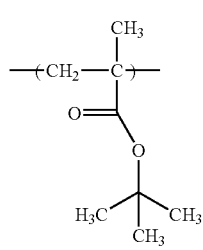
(a1-1-44) 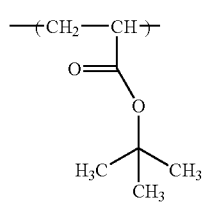
(a1-1-45) 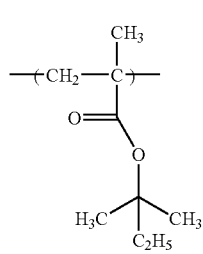
(a1-1-46) 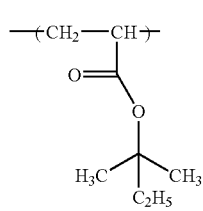
[Chemical Formula 20]
(a1-1-47) 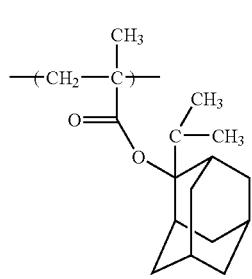
(a1-1-48) 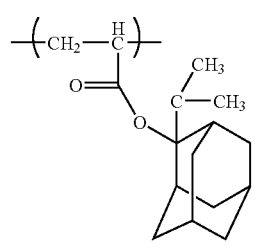
(a1-1-49) 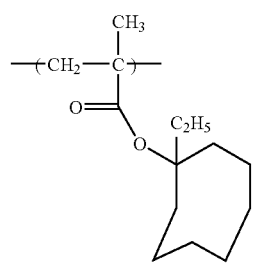
(a1-1-50) 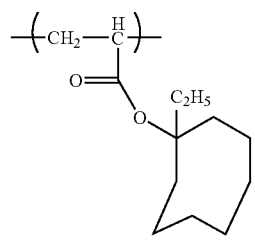
(a1-1-51) 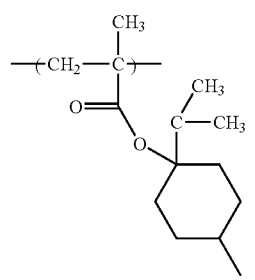
(a1-1-52) 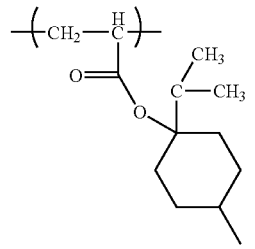
[Chemical Formula 21]
(a1-2-1) 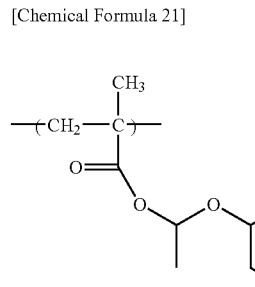

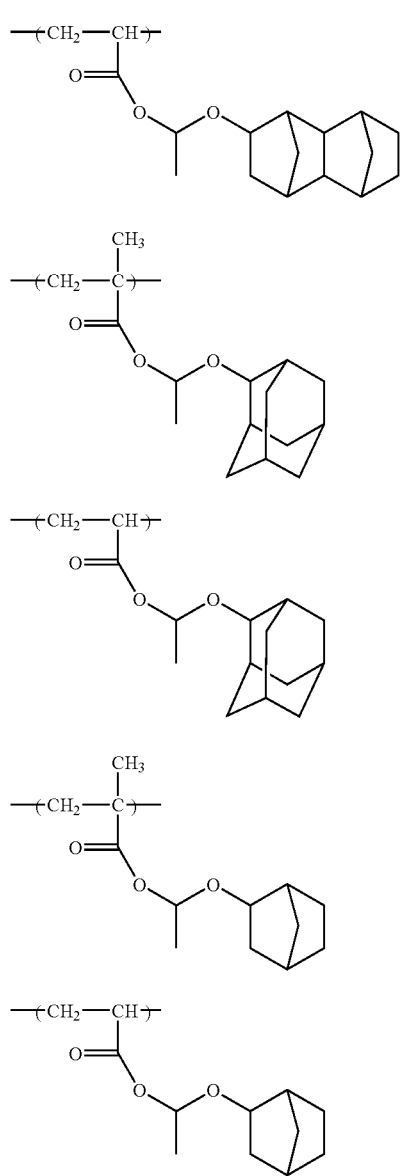
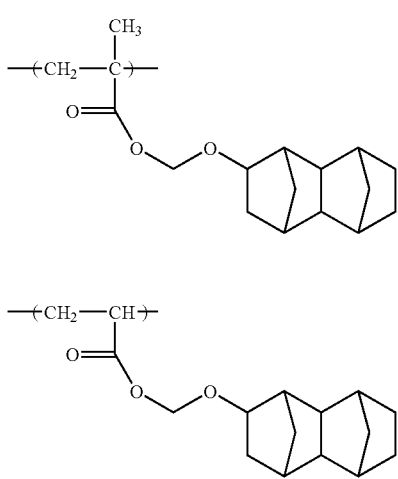
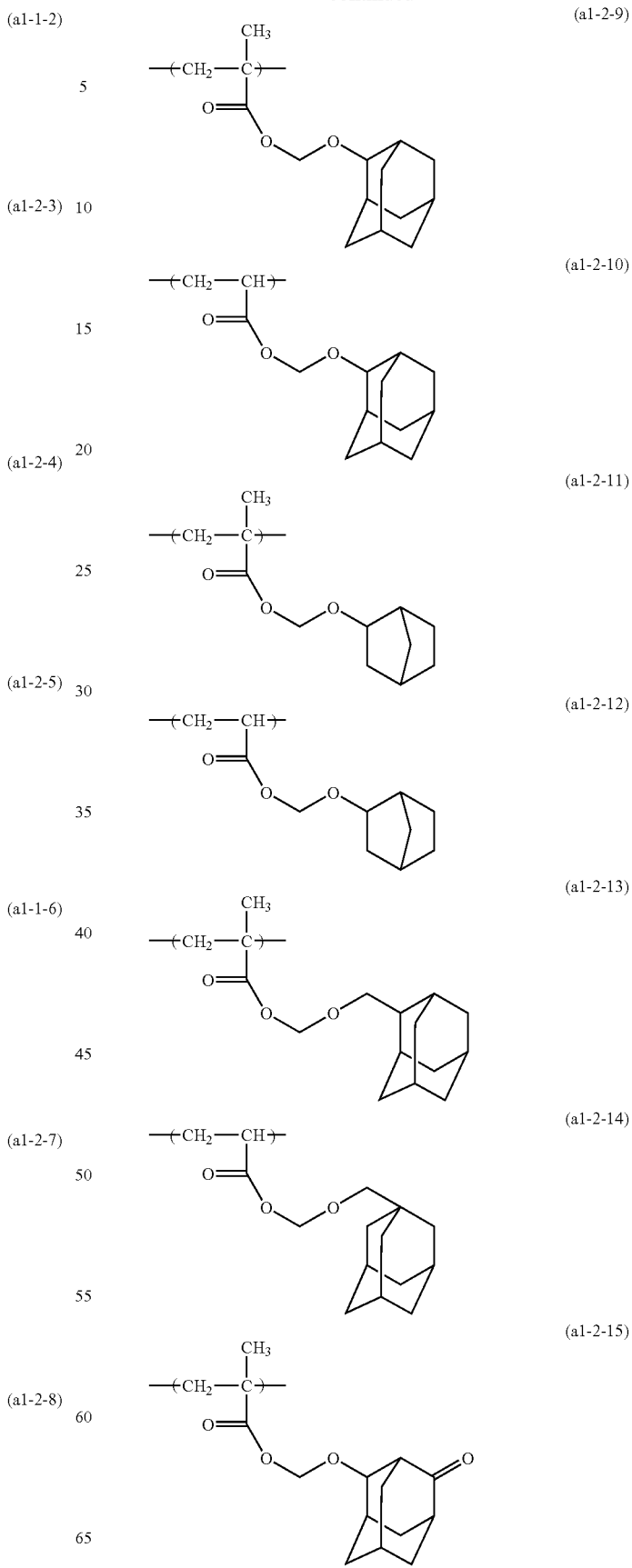

-continued
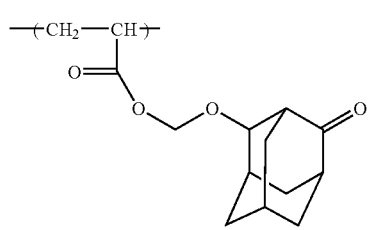 (a1-2-16)
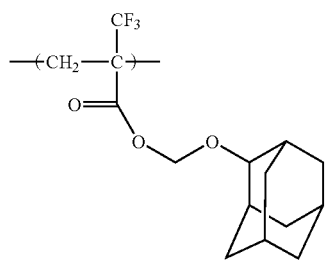 (a1-2-17)
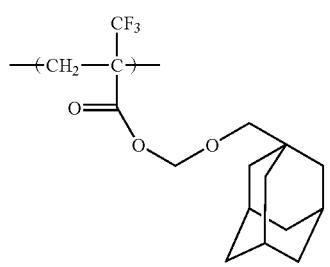 (a1-2-18)
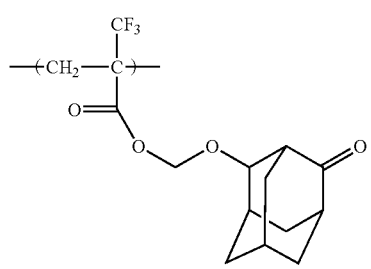 (a1-2-19)
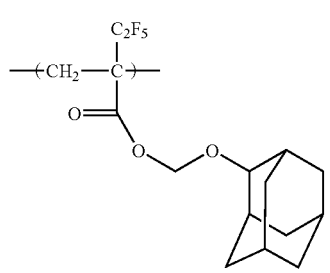 (a1-2-20)
[Chemical Formula 23]
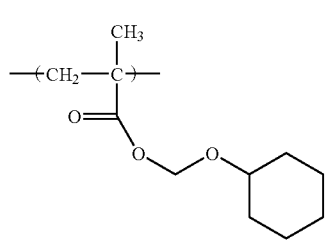 (a1-2-21)
-continued
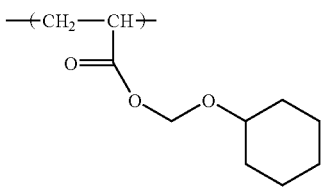 (a1-2-22)
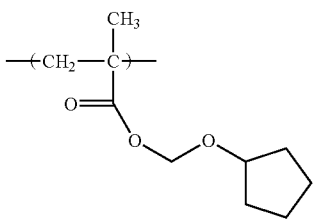 (a1-2-23)
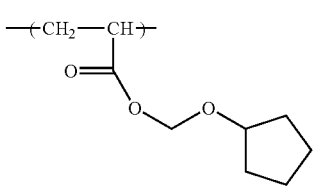 (a1-2-24)
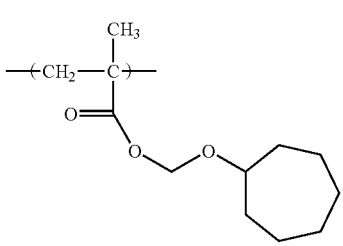 (a1-2-25)
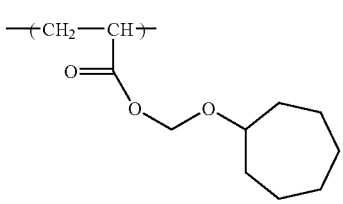 (a1-2-26)
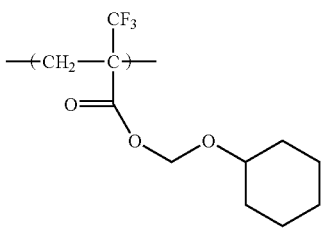 (a1-2-27)
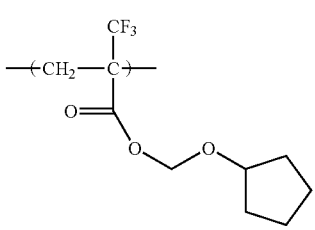 (a1-2-28)

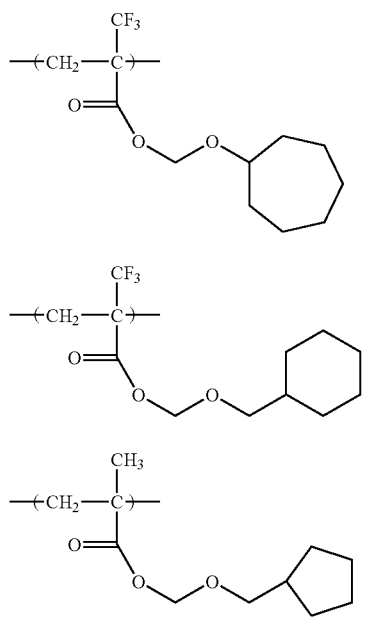

(a1-2-29)
(a1-2-30)
(a1-2-31)

[Chemical Formula 24]

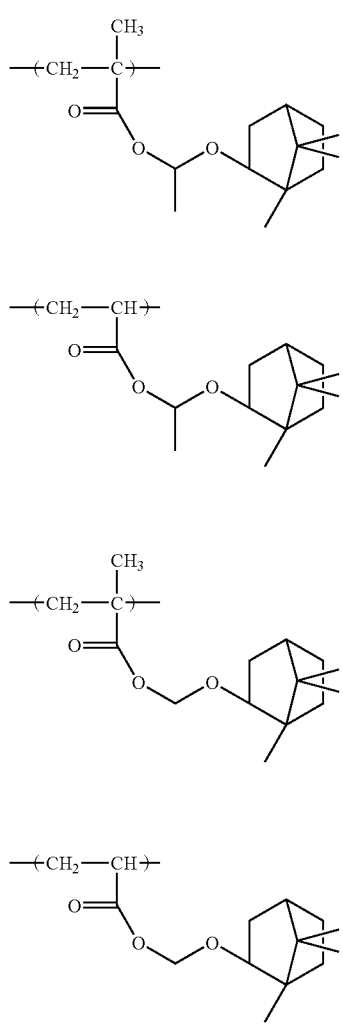

(a1-1-32)
(a1-2-33)
(a1-2-34)
(a1-2-35)

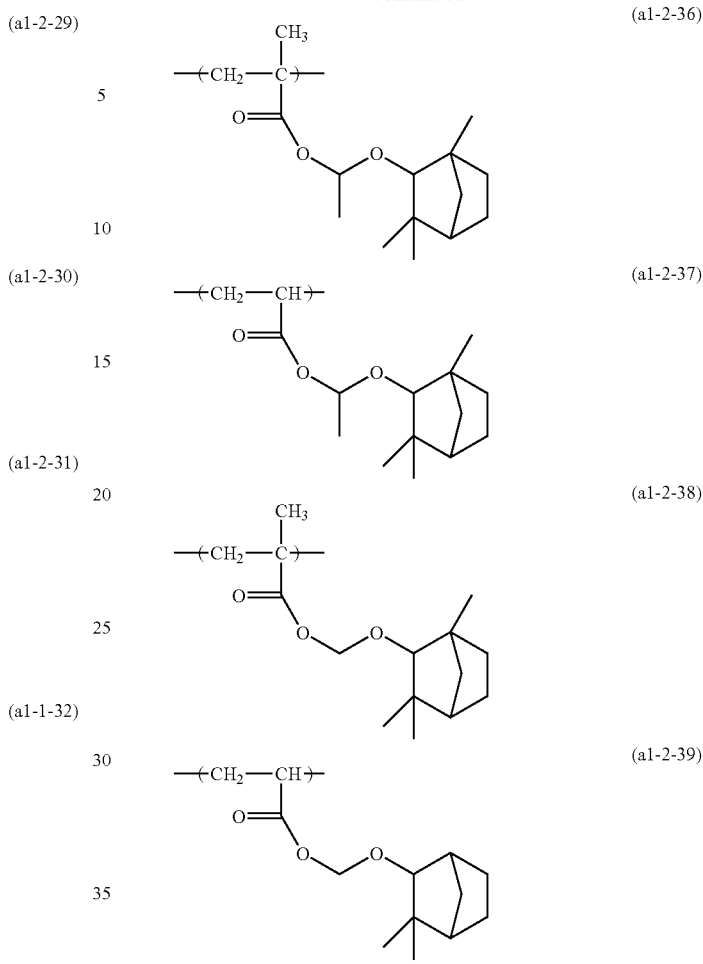

(a1-2-36)
(a1-2-37)
(a1-2-38)
(a1-2-39)

Among the above units, structural units represented by general formula (a1-1) are preferable. More specifically, at least one structural unit selected from the group consisting of structural units represented by formulas (a1-1-1) to (a-1-1-6), (a1-1-35) to (a1-1-41) and (a1-1-47) to (a1-1-52) is particularly desirable as the structural unit represented by formula (a1-1).

Further, as the structural unit (a1-0-1), structural units represented by general formula (a1-1-01) shown below, which includes the structural units represented by formulas (a1-1-1) to (a1-1-4), and structural units represented by general formula (a1-1-02) shown below, which includes the structural units represented by formulas (a1-1-35) to (a1-1-41), are preferable.

[Chemical Formula 25]

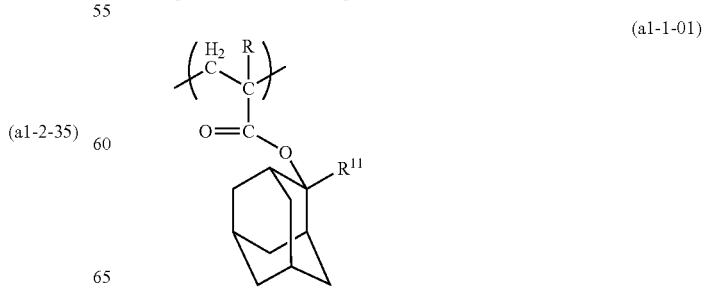

(a1-1-01)

In the formula, R represents a hydrogen atom, a lower alkyl group or a halogenated lower alkyl group, and $R^{11}$ represents a lower alkyl group.

[Chemical Formula 26]

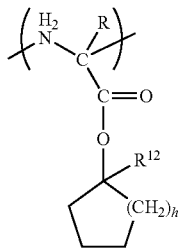

(a1-1-02)

In the formula, R represents a hydrogen atom, a lower alkyl group or a halogenated lower alkyl group, $R^{12}$ represents a lower alkyl group, and h represents an integer of 1 to 3.

In general formula (a1-1-01), R is the same as defined above for R in general formula (a1-0-1).

The lower alkyl group for $R^{11}$ is the same as the lower alkyl group for R above, and is preferably a methyl group or an ethyl group.

In general formula (a1-1-02), R is the same as defined above for R in general formula (a1-0-1).

The lower alkyl group for $R^{12}$ is the same as the lower alkyl group for R above, is preferably a methyl group or an ethyl group, and is most preferably an ethyl group.

h is preferably 1 or 2, and most preferably 2.

As the structural unit (a1-0-1), one type of structural unit may be used alone, or two or more types of structural units may be used in combination.

In the component (A1), the amount of the structural unit (a1-0-1), based on the combined total of all the structural units that constitute the component (A1), is preferably within a range from 10 to 55 mol %, and more preferably from 15 to 52 mol %. By making this amount at least as large as the lower limit of the above range, a pattern can be obtained easily using a resist composition prepared from the component (A1), whereas by making the amount no more than the upper limit of the above range, a good balance can be achieved with the other structural units.

The polymeric compound (A1) is a copolymer that includes one or more other structural units in addition to the structural units (a0-1), (a0-2) and (a1-0-1).

There are no particular restrictions on the structural unit(s) besides the structural units (a0-1), (a0-2) and (a1-0-1) included within the polymeric compound (A1), and any of the structural units that have been used within the base resins for conventional chemically amplified resists may be used. Specific examples of preferred structural units include structural units derived from acrylate esters such as structural units (a2) and (a3) described below.

Of these, the polymeric compound (A1) preferably includes the structural unit (a2) in addition to the structural units (a0-1), (a0-2) and (a1-0-1).

Further, the polymeric compound (A1) preferably also includes the structural unit (a3), either in addition to the structural units (a0-1), (a0-2) and (a1-0-1), or in addition to the structural units (a0-1), (a0-2), (a1-0-1) and (a2).

Furthermore, the polymeric compound (A1) preferably also includes, in addition to the structural units (a0-1), (a0-2), (a1-0-1) and (a3), a structural unit (a1') derived from an acrylate ester containing an acid-dissociable, dissolution-inhibiting group which does not fall under the category of the aforementioned structural units.

(Structural Unit (a1'))

The structural unit (a1') is a structural unit derived from an acrylate ester containing an acid-dissociable, dissolution-inhibiting group which does not fall under the categories of the aforementioned structural unit (a0-1), structural unit (a0-2) or structural unit (a1-0-1).

As the structural unit (a1'), a structural unit represented by general formula (a1-0-2) shown below is preferred.

[Chemical Formula 27]

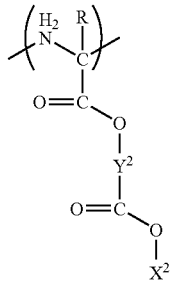

(a1-0-2)

In the formula, R represents a hydrogen atom, an alkyl group of 1 to 5 carbon atoms or a halogenated alkyl group of 1 to 5 carbon atoms, $X^2$ represents an acid-dissociable, dissolution-inhibiting group, and $Y^2$ represents a divalent linking group.

In general formula (a1-0-2), R is the same as defined above for R in general formula (a1-0-1).

$X^2$ is the same as $X^1$ within general formula (a1-0-1).

Examples of the divalent linking group for $Y^2$ include alkylene groups, divalent aliphatic cyclic groups, and divalent linking groups that contain a hetero atom.

Examples of the aliphatic cyclic group include the same groups as those exemplified above within the description of the "aliphatic cyclic group" with the exception that two or more hydrogen atoms have been removed therefrom.

When $Y^2$ represents an alkylene group, the group preferably contains 1 to 10 carbon atoms, more preferably 1 to 6 carbon atoms, still more preferably 1 to 4 carbon atoms, and most preferably 1 to 3 carbon atoms.

When $Y^2$ represents a divalent aliphatic cyclic group, it is particularly desirable that the divalent aliphatic cyclic group is a group in which two or more hydrogen atoms have been removed from cyclopentane, cyclohexane, norbornane, isobornane, adamantane, tricyclodecane or tetracyclododecane.

When $Y^2$ represents a divalent linking group that contains a hetero atom, examples of the divalent linking group containing a hetero atom include —O—, —C(=O)—O—, —C(=O)—, —O—C(=O)—O—, —C(=O)—NH—, —NH— (wherein H may be replaced with a substituent such as an alkyl group or acyl group or the like), —S—, —S(=O)$_2$—, —S(=O)$_2$—O—, a group represented by the formula -A'''-O (oxygen atom)-B'''— (wherein each of A''' and B''' independently represents a divalent hydrocarbon group which may have a substituent), and combinations of an alkylene group and a divalent linking group that contains a hetero atom.

The number of carbon atoms within the substituent (such as an alkyl group or acyl group) in those cases where $Y^2$ is —NH— is preferably from 1 to 10 carbon atoms, more preferably from 1 to 8 carbon atoms, and most preferably from 1 to 5 carbon atoms.

When $Y^2$ represents -A'''-O—B'''—, each of A''' and B''' independently represents a divalent hydrocarbon group that may have a substituent.

The description that the hydrocarbon group "may have a substituent" means that some or all of the hydrogen atoms within the hydrocarbon group may be substituted with an atom other than a hydrogen atom or with a group.

The hydrocarbon group for A''' may be an aliphatic hydrocarbon group or an aromatic hydrocarbon group. An "aliphatic hydrocarbon group" describes a hydrocarbon group that contains no aromaticity.

The aliphatic hydrocarbon group for A''' may be saturated or unsaturated, but is preferably saturated.

More specific examples of the aliphatic hydrocarbon group for A''' include linear or branched aliphatic hydrocarbon groups, and aliphatic hydrocarbon groups that include a ring within the structure.

The linear or branched aliphatic hydrocarbon group preferably contains 1 to 10 carbon atoms, more preferably 1 to 8, still more preferably 2 to 5, and most preferably 2 carbon atoms.

As the linear aliphatic hydrocarbon group, linear alkylene groups are preferred, and specific examples include a methylene group, ethylene group [—$(CH_2)_2$—], trimethylene group [—$(CH_2)_3$—], tetramethylene group [—$(CH_2)_4$—], or pentamethylene group [—$(CH_2)_5$—].

As the branched aliphatic hydrocarbon group, branched alkylene groups are preferred, and specific examples include alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$— and —$CH(CH_2CH_3)CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. The alkyl group within the alkylalkylene group is preferably a linear alkyl group of 1 to 5 carbon atoms.

These linear or branched aliphatic hydrocarbon groups may or may not have a substituent. Examples of possible substituents include a fluorine atom, fluorinated alkyl groups of 1 to 5 carbon atoms, and an oxygen atom (=O).

Examples of the aliphatic hydrocarbon group that includes a ring within the structure include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an above-mentioned linear or branched aliphatic hydrocarbon group, or disposed partway along a linear or branched aliphatic hydrocarbon group.

The cyclic aliphatic hydrocarbon group preferably contains from 3 to 20 carbon atoms, and more preferably 3 to 12 carbon atoms.

The cyclic aliphatic hydrocarbon group may be either a polycyclic group or a monocyclic group. The monocyclic group is preferably a group in which two hydrogen atoms have been removed from a monocycloalkane of 3 to 6 carbon atoms, and specific examples of the monocycloalkane include cyclopentane and cyclohexane.

The polycyclic group is preferably a group in which two hydrogen atoms have been removed from a polycycloalkane of 7 to 12 carbon atoms, and specific examples of the polycycloalkane include adamantane, norbornane, isobornane, tricyclodecane, and tetracyclododecane.

The cyclic aliphatic hydrocarbon group may or may not have a substituent. Examples of the substituent include lower alkyl groups of 1 to 5 carbon atoms, a fluorine atom, fluorinated lower alkyl groups of 1 to 5 carbon atoms, and an oxygen atom (=O).

As the group A''', a linear aliphatic hydrocarbon group is preferred, a linear alkylene group is more preferred, a linear alkylene group of 2 to 5 carbon atoms is still more preferred, and an ethylene group is the most desirable.

Examples of the hydrocarbon group for B''' include the same divalent hydrocarbon groups as those exemplified above for A'''.

B''' is preferably a linear or branched aliphatic hydrocarbon group, and is most preferably a methylene group or alkylmethylene group.

The alkyl group within the alkylmethylene group is preferably a linear alkyl group of 1 to 5 carbon atoms, more preferably a linear alkyl group of 1 to 3 carbon atoms, and is most preferably a methyl group.

Specific examples of the structural unit (a1') include structural units represented by general formulas (a1-3) and (a1-4) shown below.

[Chemical Formula 28]

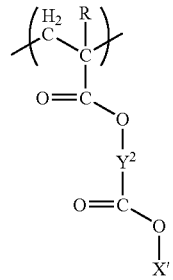

(a1-3)

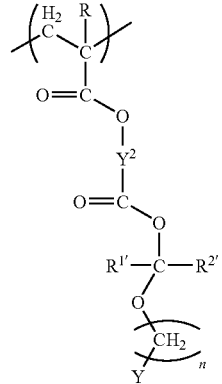

(a1-4)

In the formulas, X' represents a tertiary alkyl ester-type acid-dissociable, dissolution-inhibiting group, Y represents a lower alkyl group of 1 to 5 carbon atoms or an aliphatic cyclic group, n represents an integer of 0 to 3, $Y^2$ represents a divalent linking group, R represents a hydrogen atom, an alkyl group of 1 to 5 carbon atoms or a halogenated alkyl group of 1 to 5 carbon atoms, and each of $R^{1'}$ and $R^{2'}$ independently represents a hydrogen atom or a lower alkyl group of 1 to 5 carbon atoms.

In the formulas, R is the same as defined above for R in general formula (a1-0-1).

Examples of X' include the same groups as those exemplified above for $X^1$ in general formula (a1-0-1).

Examples of $R^{1'}$, $R^{2'}$, n and Y include the same groups as those exemplified above for $R^{1'}$, $R^{2'}$, n and Y in general formula (p1) described above in connection with the "acetal-type acid-dissociable, dissolution-inhibiting groups".

Examples of $Y^2$ include the same groups as those exemplified above for $Y^2$ in general formula (a1-0-2).

Specific examples of structural units represented by general formulas (a1-3) and (a1-4) are shown below.

In each of the formulas shown below, $R^\alpha$ represents a hydrogen atom, a methyl group or a trifluoromethyl group.

[Chemical Formula 29]

(a1-3-1)

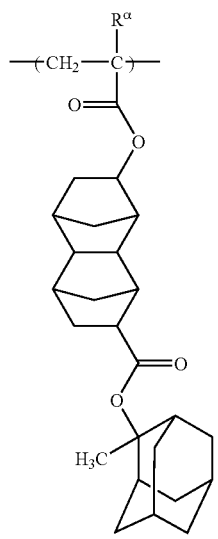

(a1-3-2)

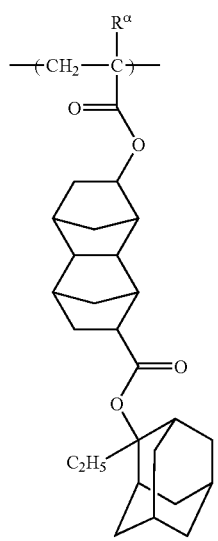

(a1-3-3)

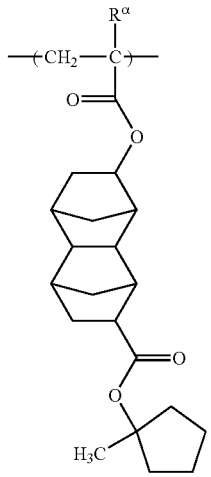

(a1-3-4)

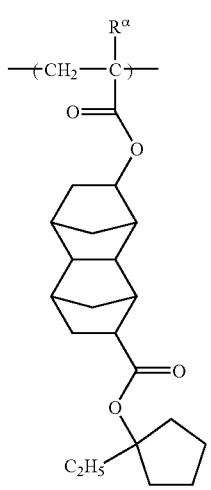

(a1-3-5)

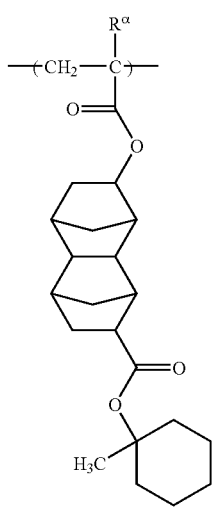

(a1-3-6)
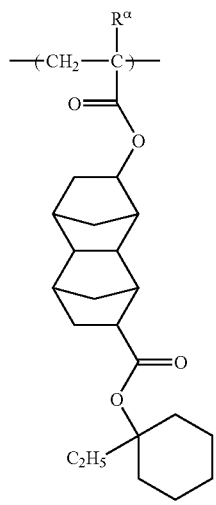
(a1-3-7)
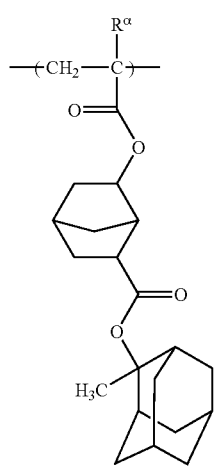
(a1-3-8)
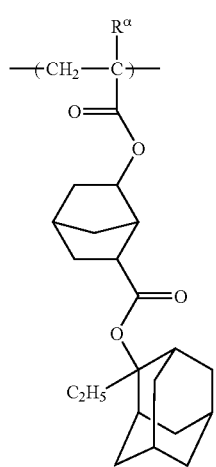
(a1-3-9)
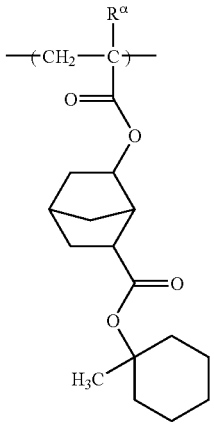
(a1-3-10)
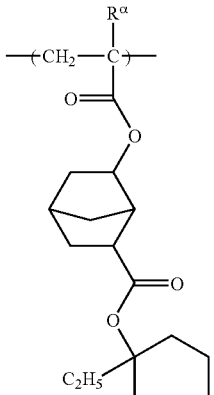
(a1-3-11)
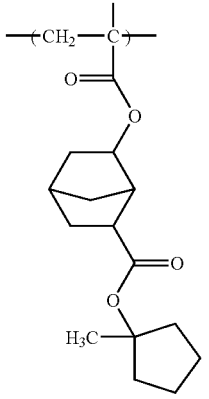
(a1-3-12)

(a1-3-13)
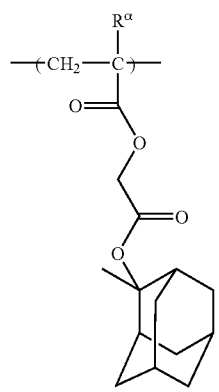
(a1-3-14)
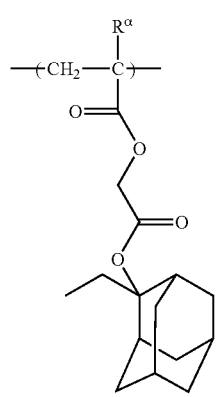
(a1-3-15)
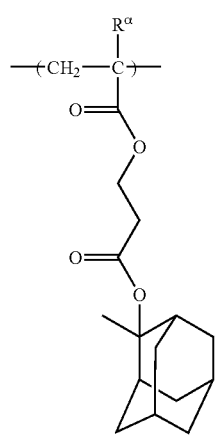
(a1-3-16)
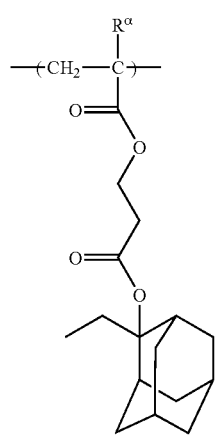
(a1-3-17)
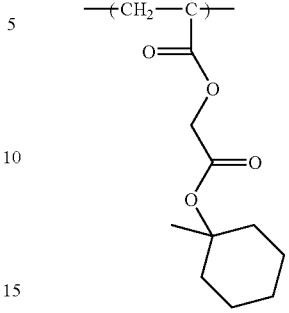
(a1-3-18)
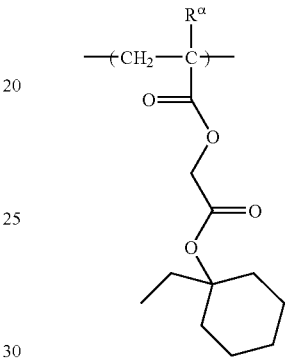
[Chemical Formula 30]
(a1-3-19)
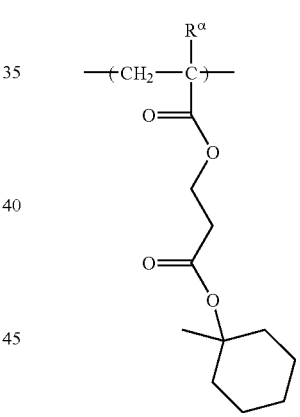
(a1-3-20)
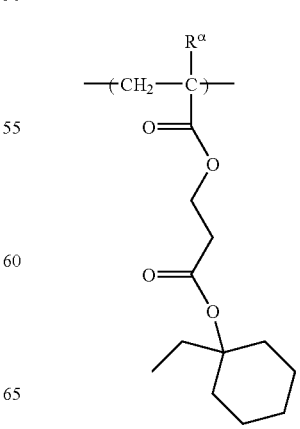

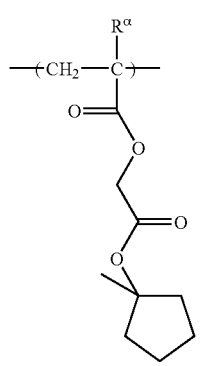 (a1-3-21)
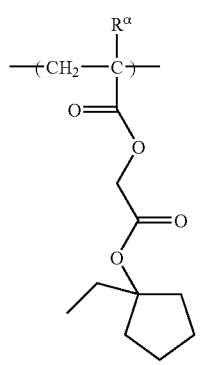 (a1-3-22)
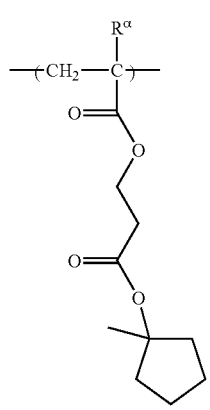 (a1-3-23)
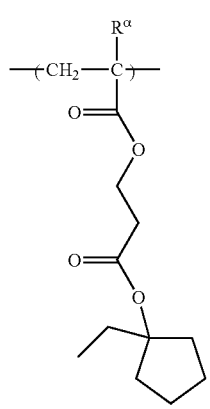 (a1-3-24)
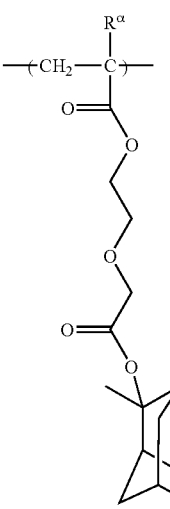 (a1-3-25)
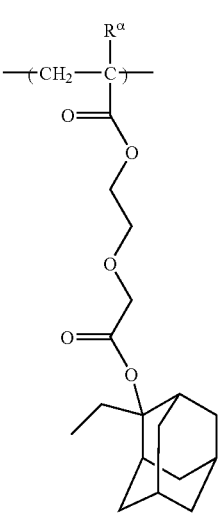 (a1-3-26)
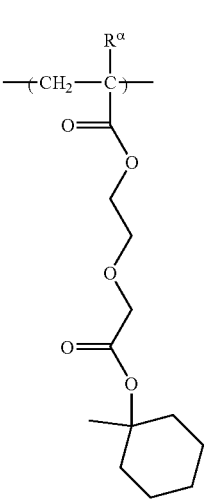 (a1-3-27)

(a1-3-28)
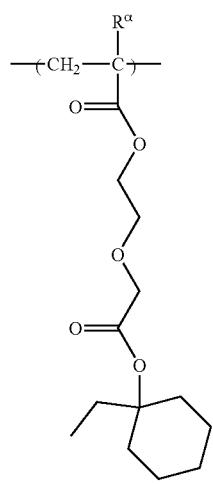
[Chemical Formula 31]
(a1-4-1)
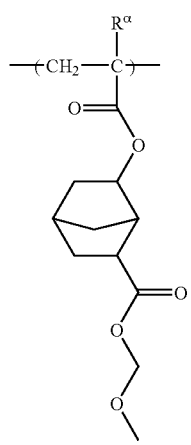
(a1-4-2)
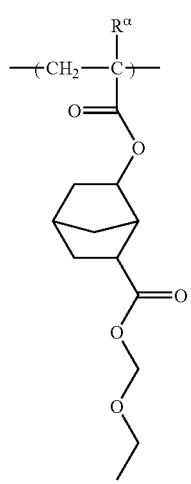
(a1-4-3)
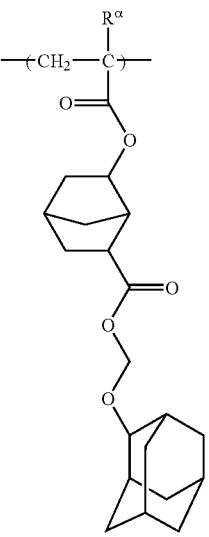
(a1-4-4)
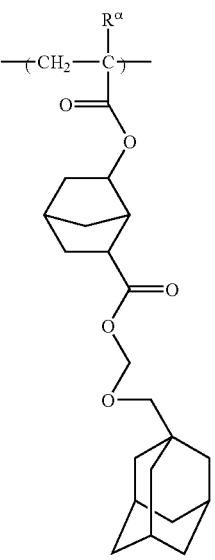
(a1-4-5)
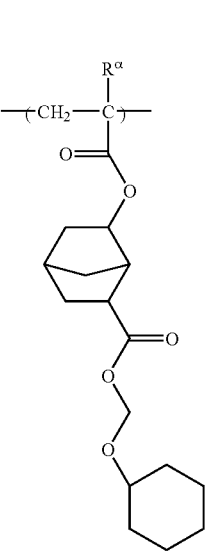

(a1-4-6)
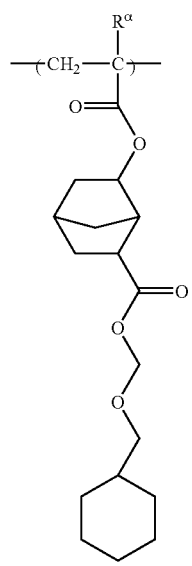
(a1-4-7)
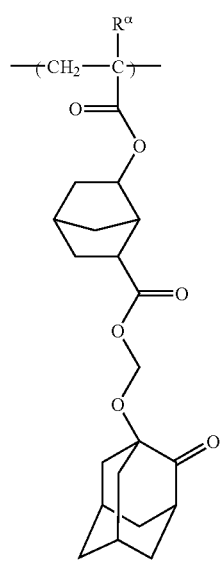
(a1-4-8)
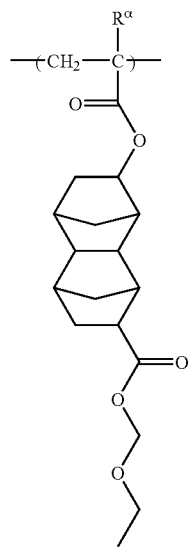
(a1-4-9)
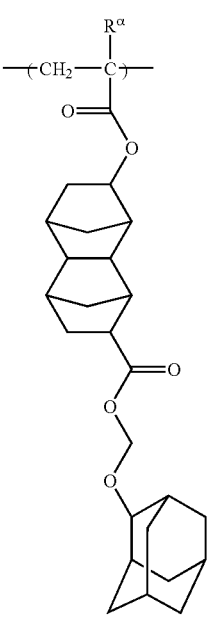
(a1-4-10)
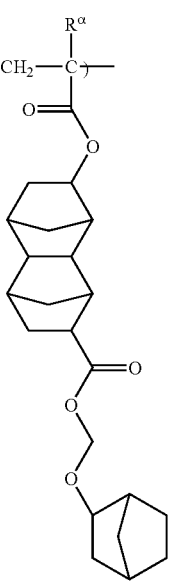

(a1-4-11)
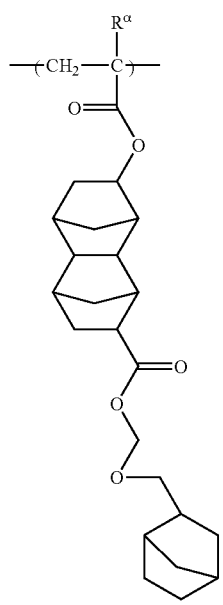
(a1-4-13)
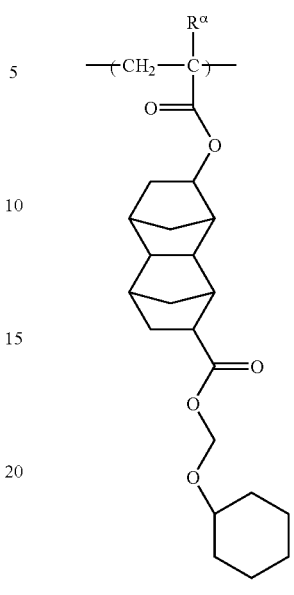
(a1-4-12)
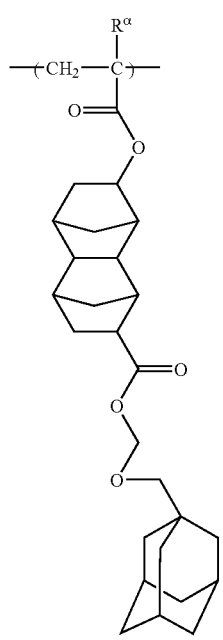
(a1-4-14)
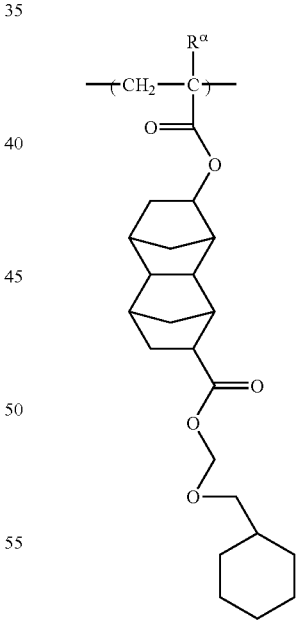

(a1-4-15)

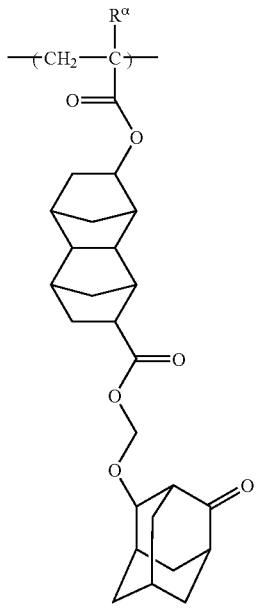

As the structural unit (a1'), one type of structural unit may be used alone, or two or more types of structural units may be used in combination.

Among these, structural units represented by general formula (a1-3) are preferable, and more specifically, the use of at least one structural unit selected from the group consisting of structural units represented by formulas (a1-3-13) to (a1-3-14) and (a1-3-25) to (a1-3-28) is more preferable.

Moreover, as the structural unit (a1'), structural units represented by general formula (a1-3-01) shown below, which includes the structural units represented by formulas (a1-3-25) and (a1-3-26), and structural units represented by general formula (a1-3-02) shown below, which includes the structural units represented by formulas (a1-3-27) and (a1-3-28) are preferred.

[Chemical Formula 32]

(a1-3-01)

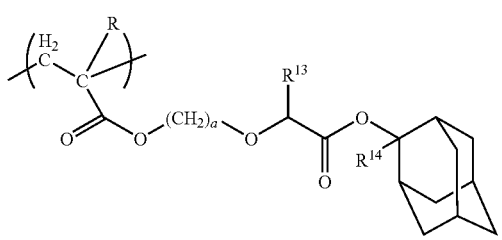

In the formula, R represents a hydrogen atom, a lower alkyl group or a halogenated lower alkyl group, $R^{14}$ represents a lower alkyl group, $R^{13}$ represents a hydrogen atom or a methyl group, and a represents an integer of 1 to 10.

[Chemical Formula 33]

(a1-3-02)

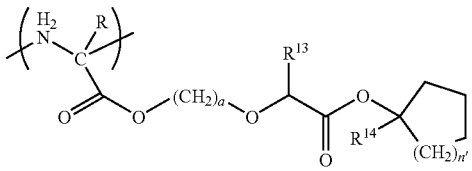

In the formula, R represents a hydrogen atom, a lower alkyl group or a halogenated lower alkyl group, $R^{14}$ represents a lower alkyl group, $R^{13}$ represents a hydrogen atom or a methyl group, a represents an integer of 1 to 10, and n' represents an integer of 1 to 6.

In general formulas (a1-3-01) and (a1-3-02), R is the same as defined above for R in general formula (a1-0-1).

$R^{13}$ is preferably a hydrogen atom.

The lower alkyl group for $R^{14}$ is the same as the lower alkyl group described above for R, and is preferably a methyl group or an ethyl group.

a is preferably an integer of 1 to 8, more preferably an integer of 2 to 5, and is most preferably 2.

In the component (A1), the amount of the structural unit (a1'), based on the combined total of all the structural units that constitute the component (A1), is preferably within a range from 5 to 30 mol %, more preferably from 8 to 25 mol %, and still more preferably from 10 to 25 mol %. By ensuring that the amount of the structural unit (a1') is at least as large as the lower limit of the above range, a pattern can be formed easily using a resist composition prepared from the component (A1), whereas by ensuring that the amount is not more than the upper limit of the above range, a good balance can be achieved with the other structural units.

(Structural Unit (a2))

The structural unit (a2) is a structural unit derived from an acrylate ester containing a lactone-containing cyclic group.

The term "lactone-containing cyclic group" refers to a cyclic group including one ring containing a —O—C(O)— structure (the lactone ring). The lactone ring is counted as the first ring, and a lactone-containing cyclic group in which the only ring structure is the lactone ring is referred to as a monocyclic group, whereas groups containing other ring structures are described as polycyclic groups regardless of the structure of the other rings.

When the copolymer (A1) is used for forming a resist film, the lactone-containing cyclic group of the structural unit (a2) is effective in improving the adhesion between the resist film and the substrate, and increasing the compatibility with developing solutions containing water.

As the structural unit (a2), there is no particular limitation, and an arbitrary structural unit may be used.

Specific examples of lactone-containing monocyclic groups include groups in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 34]

(a2-1)
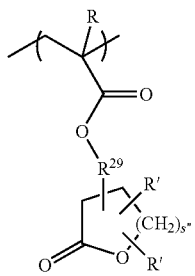

(a2-2)
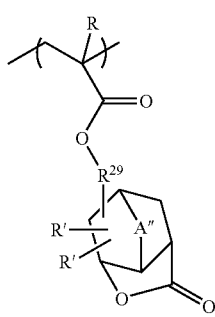

(a2-3)
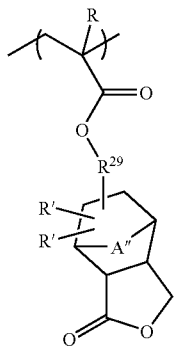

(a2-4)
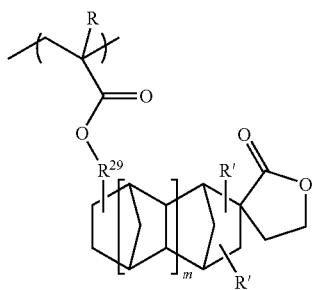

(a2-5)
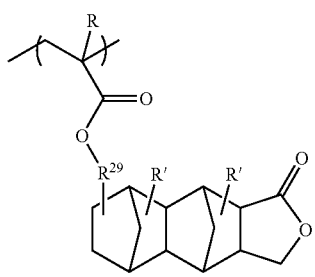

In the formulas, R represents a hydrogen atom, an alkyl group of 1 to 5 carbon atoms or a halogenated alkyl group of 1 to 5 carbon atoms, each R' independently represents a hydrogen atom, an alkyl group of 1 to 5 carbon atoms, an alkoxy group of 1 to 5 carbon atoms or —COOR", wherein R" represents a hydrogen atom or an alkyl group, $R^{29}$ represents a single bond or a divalent linking group, s" represents 0 or an integer of 1 to 2, A" represents an oxygen atom, a sulfur atom or an alkylene group of 1 to 5 carbon atoms which may contain an oxygen atom or a sulfur atom, and m represents an integer of 0 or 1.

In general formulas (a2-1) to (a2-5), R is the same as defined above for R in the structural unit (a1-0-1).

Examples of the alkyl group of 1 to 5 carbon atoms for R' include a methyl group, ethyl group, propyl group, n-butyl group and tert-butyl group.

Examples of the alkoxy group of 1 to 5 carbon atoms for R' include a methoxy group, ethoxy group, n-propoxy group, iso-propoxy group, n-butoxy group and tert-butoxy group.

In terms of industrial availability, R' is preferably a hydrogen atom.

When R" represents a linear or branched alkyl group, it is preferably an alkyl group of 1 to 10 carbon atoms, and more preferably an alkyl group of 1 to 5 carbon atoms.

When R" represents a cyclic alkyl group, it preferably contains 3 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms or —O—, is more preferably an alkylene group of 1 to 5 carbon atoms, and is most preferably a methylene group.

$R^{29}$ represents a single bond or a divalent linking group. Examples of the divalent linking group include the same divalent linking groups as those described above for $R^2$ in general formula (a0-1), and of these groups, an alkylene group, an ester linkage (—C(=O)—O—) or a combination thereof is preferred.

The alkylene group of the divalent linking group for $R^2$ is preferably a linear or branched alkylene group. Specific examples include the same linear alkylene groups and branched alkylene groups as those exemplified above for the aliphatic hydrocarbon group for A'" within the description for $Y^2$.

s" is preferably an integer of 1 or 2.

Specific examples of structural units represented by general formulas (a2-1) to (a2-5) are shown below. In each of the formulas shown below, $R^\alpha$ represents a hydrogen atom, a methyl group or a trifluoromethyl group.

[Chemical Formula 35]
(a2-1-1) 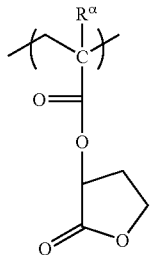
(a2-1-2) 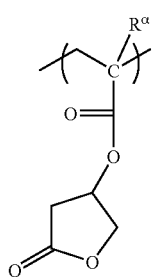
(a2-1-3) 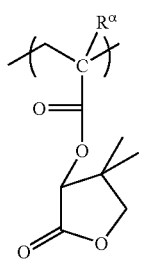
(a2-1-4) 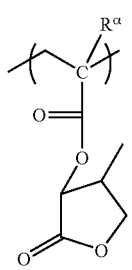
(a2-1-5) 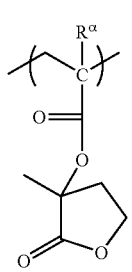
(a2-1-6) 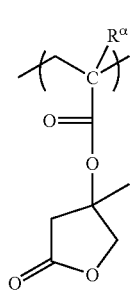
-continued
(a2-1-7) 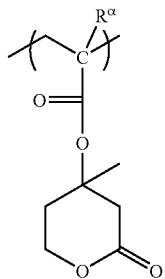
(a2-1-8) 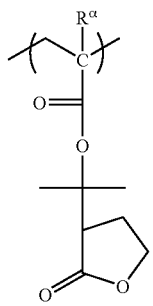
(a2-1-9) 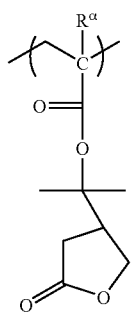
(a2-1-10) 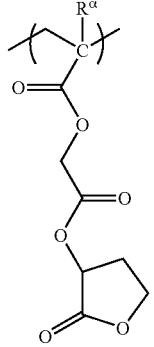
(a2-1-11) 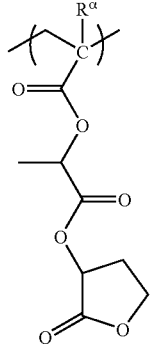

(a2-1-12)
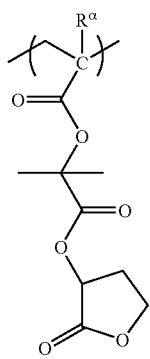
(a2-1-13)
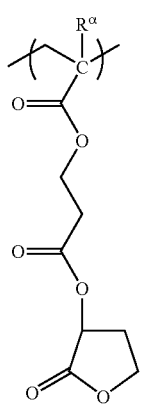
[Chemical Formula 36]
(a2-2-1)
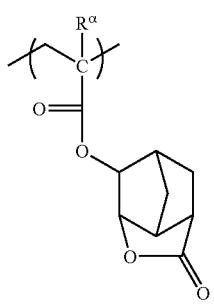
(a2-2-2)
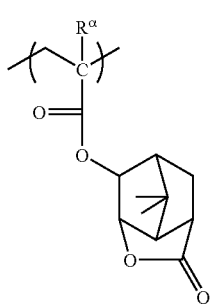
(a2-2-3)
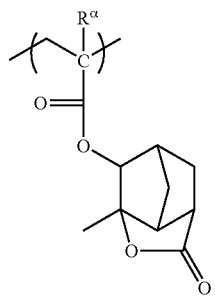
(a2-2-4)
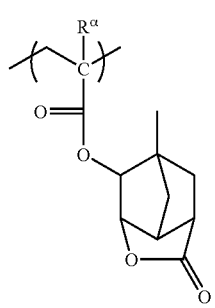
(a2-2-5)
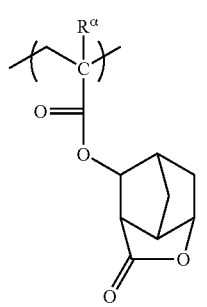
(a2-2-6)
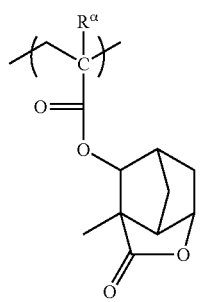
(a2-2-7)
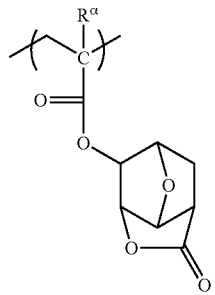

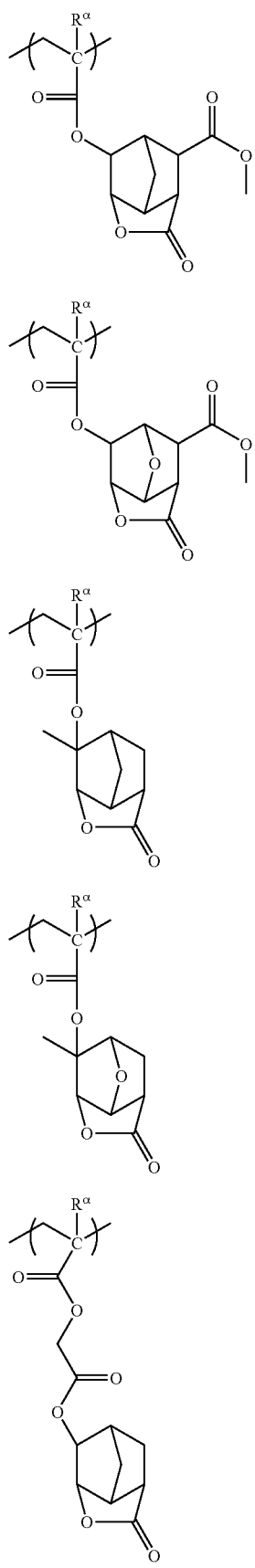
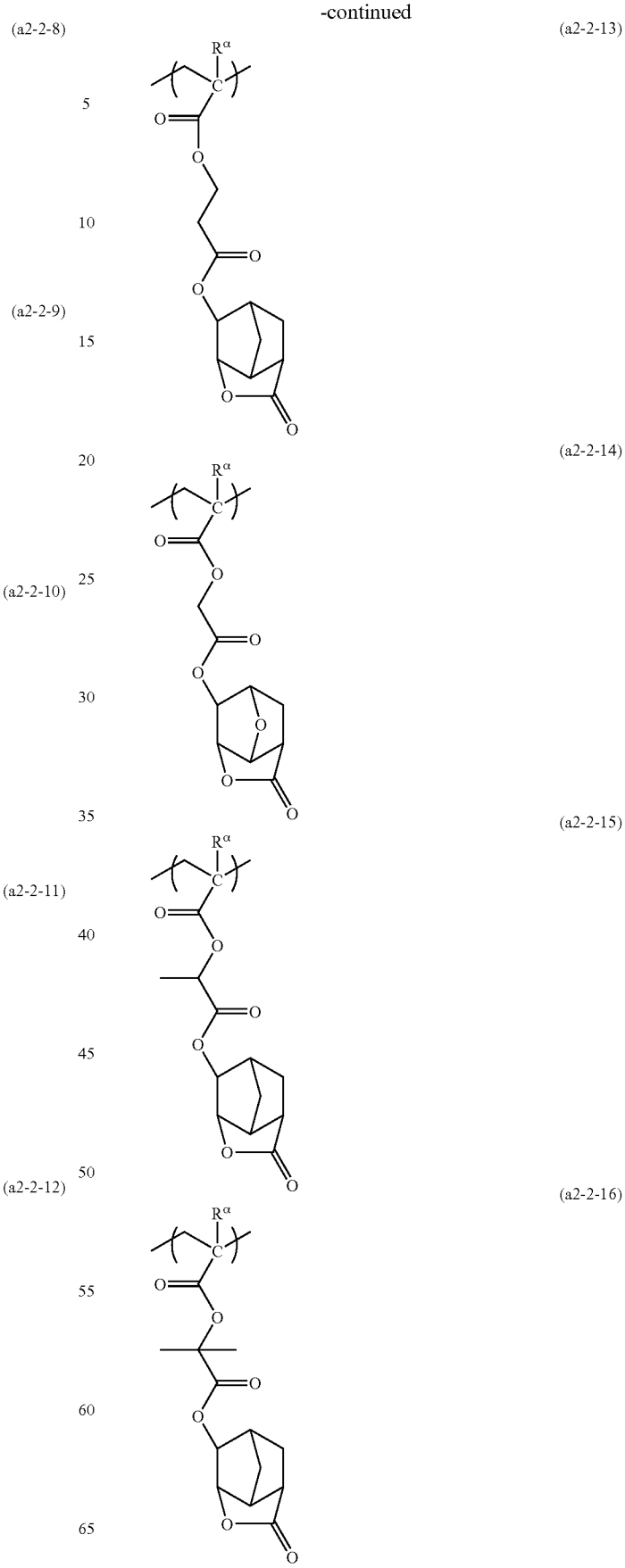

(a2-2-17)
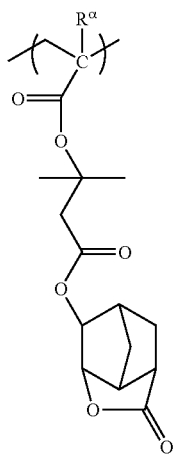
[Chemical Formula 37]
(a2-3-1)
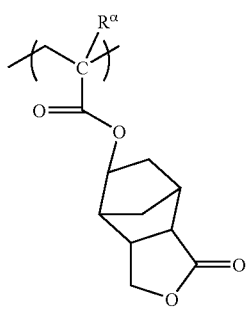
(a2-3-2)
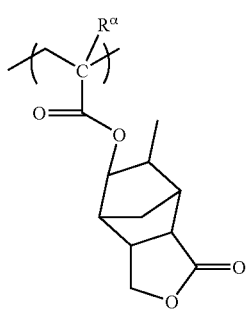
(a2-3-3)
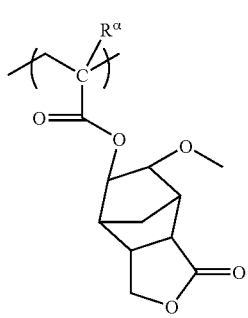
(a2-3-4)
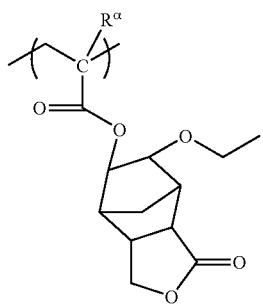
(a2-3-5)
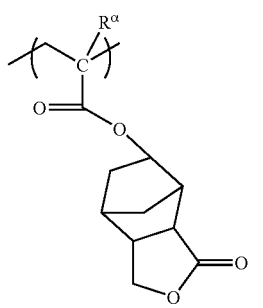
[Chemical Formula 38]
(a2-4-1)
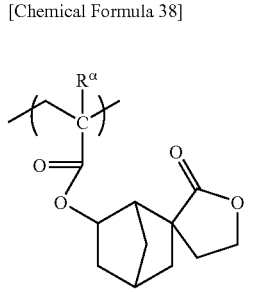
(a2-4-2)
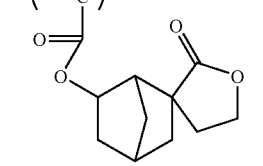
(a2-4-3)
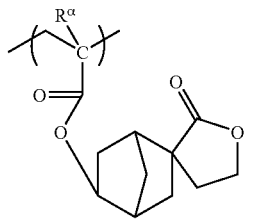
(a2-4-4)
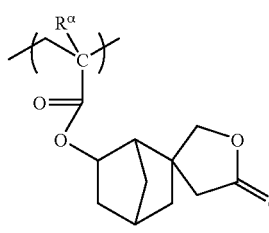

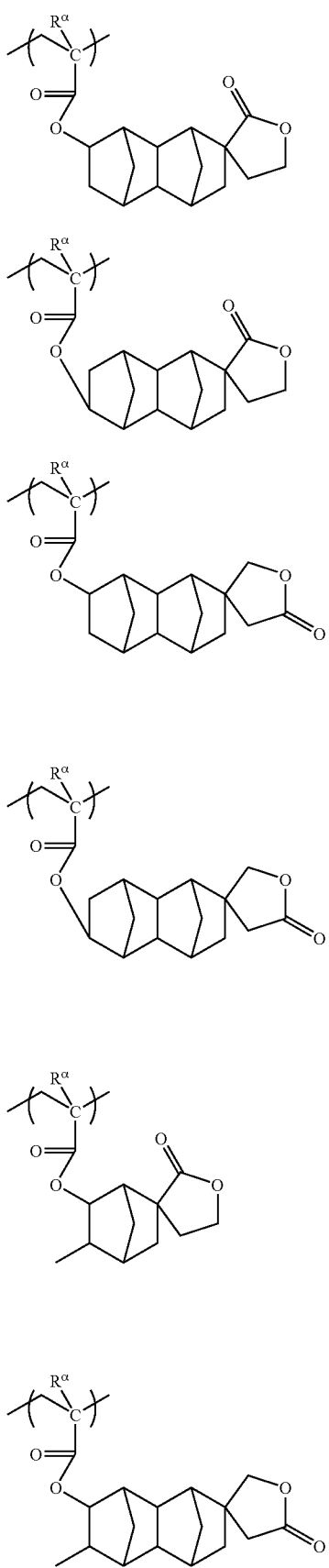
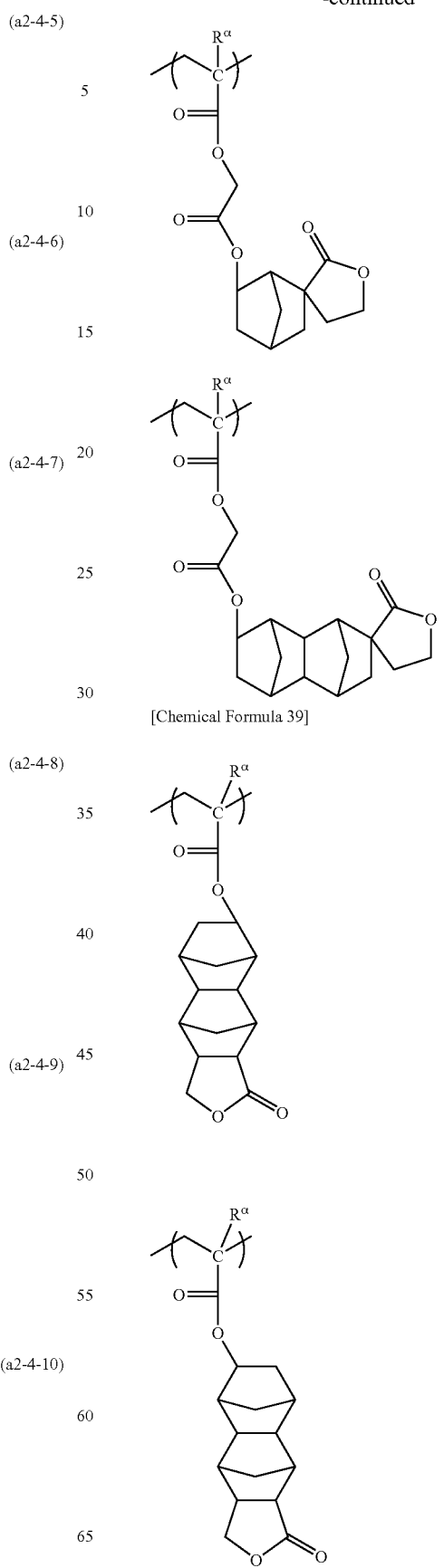

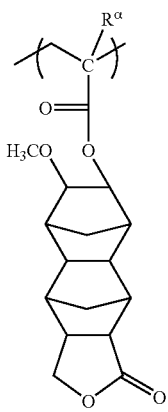

(a2-5-3)

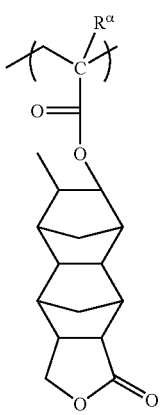

(a2-5-4)

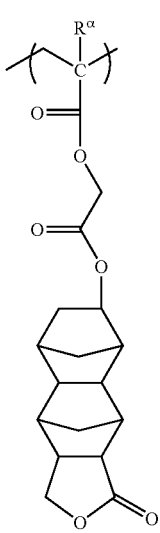

(a2-5-5)

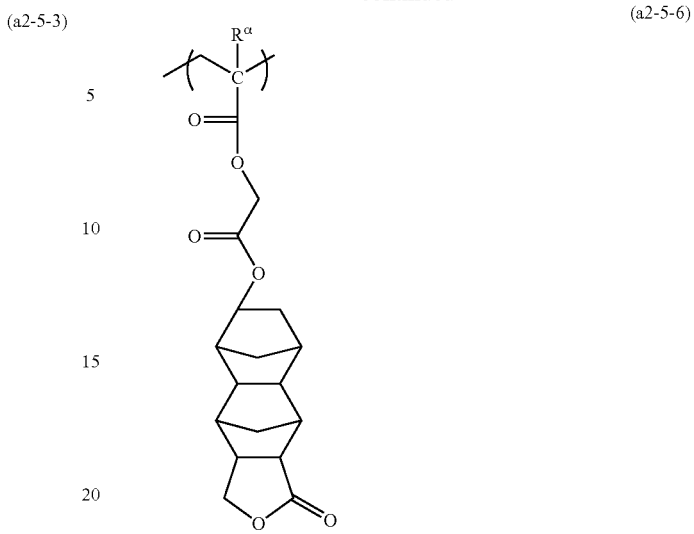

(a2-5-6)

In the component (A1), as the structural unit (a2), one type of structural unit may be used alone, or two or more types of structural units may be used in combination.

As the structural unit (a2), at least one structural unit selected from the group consisting of structural units represented by general formulas (a2-1) to (a2-5) is preferable, and at least one structural unit selected from the group consisting of structural units represented by general formulas (a2-1) to (a2-3) is more preferable. Of these, it is particularly preferable to use at least one structural unit selected from the group consisting of units represented by chemical formulas (a2-1-1), (a2-2-1), (a2-2-7), (a2-2-12), (a2-2-14), (a2-3-1) and (a2-3-5).

In terms of improving the adhesion between a support such as a substrate and a resist film formed using a positive resist composition containing the component (A1) and increasing the compatibility with the developing solution, the amount of the structural unit (a2) within the component (A1), based on the combined total of all the structural units that constitute the component (A1), is preferably within a range from 1 to 50 mol %, more preferably from 5 to 50 mol %, and still more preferably from 10 to 45 mol %.

Further, in terms of achieving a variety of excellent lithography properties, the combined amount of the structural unit (a0-1), the structural unit (a0-2) and the structural unit (a2) (or the combined amount of the structural unit (a0-1) and the structural unit (a0-2) when the component (A1) contains no structural unit (a2)) within the component (A1), based on the combined total of all the structural units that constitute the component (A1), is preferably within a range from 30 to 85 mol %, more preferably from 35 to 80 mol %, and most preferably from 35 to 78 mol %. By ensuring an amount within the above-mentioned range, MEF, CDU and the pattern shape can be further improved.

(Structural Unit (a3))

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably contains 7 to 30 carbon atoms.

Of the various possibilities, structural units derived from an acrylate ester that includes an aliphatic polycyclic group containing a hydroxyl group, cyano group, carboxyl group or a hydroxyalkyl group in which some of the hydrogen atoms of the alkyl group have been substituted with fluorine atoms are particularly desirable. Examples of the polycyclic group include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 40]

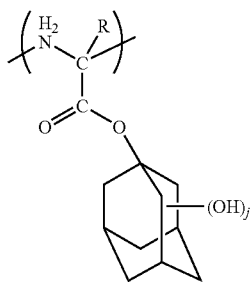
(a3-1)

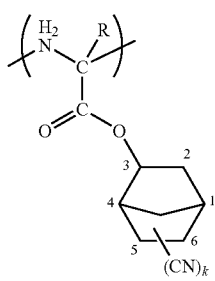
(a3-2)

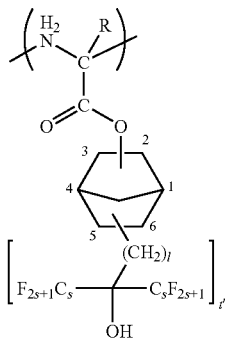
(a3-3)

In the formulas, R represents a hydrogen atom, a lower alkyl group of 1 to 5 carbon atoms or a halogenated lower alkyl group of 1 to 5 carbon atoms, j represents an integer of 1 to 3, k represents an integer of 1 to 3, t' represents an integer of 1 to 3, l represents an integer of 1 to 5, and s represents an integer of 1 to 3.

R in general formulas (a3-1) to (a3-3) is the same as defined above for R within general formula (a1-0-1).

In general formula (a3-1), j is preferably 1 or 2, and more preferably 1. When j is 2, it is preferable that the hydroxyl groups are bonded to the 3rd and 5th positions of the adamantyl group. When j is 1, it is preferable that the hydroxyl group is bonded to the 3rd position of the adamantyl group.

j is preferably 1, and it is particularly desirable that the hydroxyl group is bonded to the 3rd position of the adamantyl group.

In general formula (a3-2), k is preferably 1. The cyano group is preferably bonded to the 5th or 6th position of the norbornyl group.

In general formula (a3-3), t' is preferably 1. l is preferably 1. s is preferably 1. Further, in general formula (a3-3), it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

As the structural unit (a3), one type of structural unit may be used alone, or two or more types of structural units may be used in combination.

The amount of the structural unit (a3), based on the combined total of all the structural units that constitute the component (A1), is preferably within a range from 5 to 50 mol %, more preferably from 5 to 40 mol %, and still more preferably from 5 to 25 mol %.

(Other Structural Units)

The polymeric compound (A1) may also have a structural unit which is other than the above-mentioned structural units (a2) and (a3) (hereafter referred to as "structural unit (a4)"), as long as the effects of the present invention are not impaired.

As the structural unit (a4), any other structural unit which cannot be classified as one of the above structural units (a0-1) to (a3) can be used without any particular limitations, and any of the multitude of conventional structural units used within resist resins for ArF excimer lasers or KrF excimer lasers (and particularly for ArF excimer lasers) can be used.

Preferable examples of the structural unit (a4) include structural units derived from an acrylate ester which contains a non-acid-dissociable aliphatic polycyclic group. Examples of this polycyclic group include the same groups as those exemplified above in connection with the aforementioned structural unit (a1-0-1), and any of the multitude of conventional polycyclic groups used within the resin component of resist compositions for ArF excimer lasers or KrF excimer lasers (and particularly for ArF excimer lasers) can be used.

In consideration of factors such as industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 41]

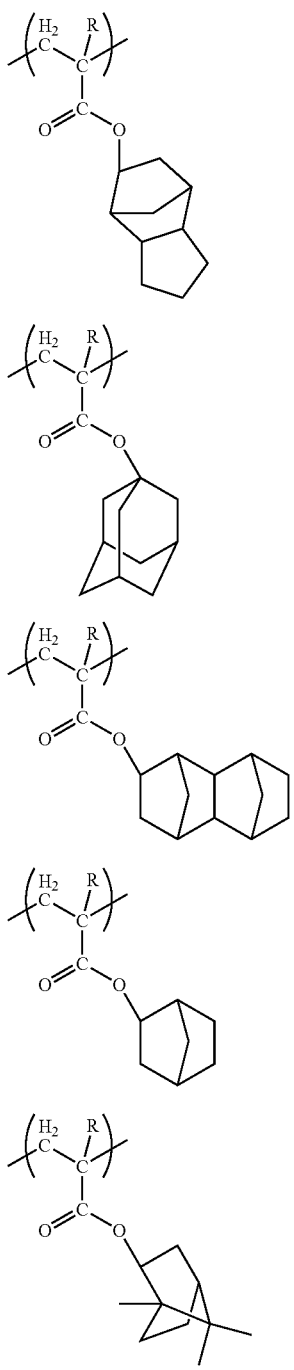

In the formulas, R represents a hydrogen atom, a lower alkyl group of 1 to 5 carbon atoms or a halogenated lower alkyl group of 1 to 5 carbon atoms.

R in general formulas (a4-1) to (a4-5) is the same as defined above for R within general formula (a1-0-1).

When the structural unit (a4) is included in the component (A1), the amount of the structural unit (a4), based on the combined total of all the structural units that constitute the component (A1), is preferably within a range from 1 to 30 mol %, and more preferably from 10 to 20 mol %.

The component (A1) is preferably a copolymer containing the structural units (a0-1), (a0-2) and (a1-0-1). Examples of such copolymers include copolymers consisting of the structural units (a0-1), (a0-2) and (a1-0-1), copolymers consisting of the structural units (a0-1), (a0-2), (a1-0-1) and (a3), copolymers consisting of the structural units (a0-1), (a0-2), (a1-0-1) and (a2), copolymers consisting of the structural units (a0-1), (a0-2), (a1-0-1), (a2) and (a3), and copolymers consisting of the structural units (a0-1), (a0-2), (a1-0-1) (a1') and (a3).

The weight average molecular weight (Mw) (the polystyrene equivalent value determined by gel permeation chromatography) of the component (A1) is not particularly limited, but is preferably within a range from 2,000 to 50,000, more preferably from 3,000 to 30,000, and most preferably from 5,000 to 20,000. By ensuring that the weight average molecular weight is not more than the upper limit of this range, the polymeric compound (A1) exhibits satisfactory solubility in a resist solvent when used as a resist, whereas ensuring that the weight average molecular weight is at least as large as the lower limit of the above range yields more favorable dry etching resistance and a favorable cross-sectional shape for the resist pattern.

Further, the dispersity (Mw/Mn) is preferably from 1.0 to 5.0, more preferably from 1.0 to 3.0, and most preferably from 1.2 to 2.5. Here, Mn represents the number average molecular weight.

In the component (A), as the component (A1), one type of compound may be used alone, or two or more types of compounds may be used in combination.

In the component (A), the amount of the component (A1) based on the total weight of the component (A) is preferably 25% by weight or more, more preferably 50% by weight or more, still more preferably 75% by weight or more, and may even be 100% by weight. When the amount of the component (A1) is 25% by weight or more, various lithography properties are improved.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH during the above polymerization, a —$C(CF_3)_2$—OH group can be introduced at the terminals of the component (A1). Such a copolymer having an introduced hydroxyalkyl group in which some of the hydrogen atoms of the alkyl group have been substituted with fluorine atoms is effective in reducing developing defects and LER (line edge roughness: unevenness of the side walls of a line pattern).

In terms of the monomers used for forming each of the structural units, either commercially available monomers may be used, or the monomers may be synthesized by a conventional method.

For example, examples of the monomer for forming the structural unit (a0-1) include compounds represented by general formula (I) shown below (and hereafter referred to as "compound (I)").

[Chemical Formula 42]

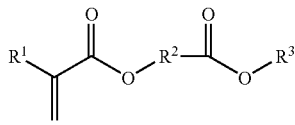

In formula (I), $R^1$ to $R^3$ are the same as defined above for $R^1$ to $R^3$ within general formula (a0-1).

The method for producing the compound (I) is not particularly limited, and the compound (I) can be produced by a conventional method. For example, in the presence of a base, a compound (X-2) represented by general formula (X-2) shown below may be added to a solution obtained by dissolving a compound (X-1) represented by general formula (X-1) shown below in a reaction solvent, and a reaction then performed to obtain a compound (I).

Examples of the base include inorganic bases such as sodium hydride, $K_2CO_3$ and $Cs_2CO_3$, and organic bases such as triethylamine, 4-dimethylaminopyridine (DMAP) and pyridine. Examples of condensing agents include carbodiimide reagents such as ethyldiisopropylaminocarbodiimide hydrochloride (EDCI), dicyclohexylcarboxyimide (DCC), diisopropylcarbodiimide and carbodiimidazole, as well as tetraethyl pyrophosphate and benzotriazole-N-hydroxytris-dimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid, and organic acids such as methanesulfonic acid, trifluoromethanesulfonic acid, benzenesulfonic acid and p-toluenesulfonic acid. These acids may be used individually, or two or more acids may be used in combination.

[Chemical Formula 43]

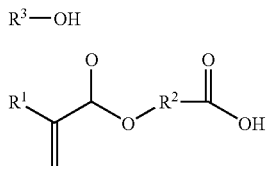

In the formulas, $R^1$ to $R^3$ are the same as defined above for $R^1$ to $R^3$ within general formula (a0-1).

In the resist composition of the present invention, the component (A) may contain "a base component that exhibits increased solubility in an alkali developing solution under action of acid" other than the component (A1) (hereafter, referred to as "component (A2)").

The component (A2) is not particularly limited, and any of the multitude of conventional base components used within chemically amplified resist compositions (such as base resins used within chemically amplified resist compositions for ArF excimer lasers or KrF excimer lasers, and preferably ArF excimer lasers) can be used. For example, as a base resin for an ArF excimer laser, a base resin having the aforementioned structural unit (a1-0-1) as an essential component, and optionally including the aforementioned structural units (a2) to (a4) can be used.

As the component (A2), one type of resin may be used alone, or two or more types of resins may be used in combination.

In the resist composition of the present invention, the amount of the component (A) can be appropriately adjusted depending on factors such as the thickness of the resist film to be formed.

<Component (B)>

There are no particular limitations on the component (B), and any of the known acid generators used in conventional chemically amplified resist compositions can be used. Examples of these acid generators are numerous, and include onium salt acid generators such as iodonium salts and sulfonium salts, oxime sulfonate acid generators, diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

As an onium salt acid generator, a compound represented by general formula (b-1) or (b-2) shown below can be used.

[Chemical Formula 44]

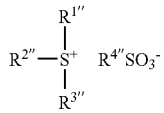

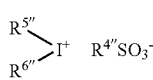

In the formulas above, each of $R^{1''}$ to $R^{3''}$, $R^{5''}$ and $R^{6''}$ independently represents an aryl group or an alkyl group, wherein two of $R^{1''}$ to $R^{3''}$ in formula (b-1) may be bonded to each other to form a ring with the sulfur atom, and $R^{4''}$ represents an alkyl group, a halogenated alkyl group, an aryl group or an alkenyl group which may have a substituent, with the provisions that at least one of $R^{1''}$ to $R^{3''}$ represents an aryl group, and at least one of $R^{5''}$ and $R^{6''}$ represents an aryl group.

In general formula (b-1), each of $R^{1''}$ to $R^{3''}$ independently represents an aryl group or an alkyl group. In general formula (b-1), two of $R^{1''}$ to $R^{3''}$ may be bonded to each other to form a ring with the sulfur atom.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used in which some or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group with which hydrogen atoms of the aryl group may be substituted is preferably an alkyl group having 1 to 5 carbon atoms, and is most preferably a methyl group, ethyl group, propyl group, n-butyl group, or tert-butyl group.

The alkoxy group with which hydrogen atoms of the aryl group may be substituted is preferably an alkoxy group having 1 to 5 carbon atoms, is more preferably a methoxy group, ethoxy group, n-propoxy group, iso-propoxy group, n-butoxy group or tert-butoxy group, and is most preferably a methoxy group or an ethoxy group.

The halogen atom with which hydrogen atoms of the aryl group may be substituted is preferably a fluorine atom.

The alkyl group for $R^{1''}$ to $R^{3''}$ is not particularly limited, and examples include linear, branched or cyclic alkyl groups having 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group and decanyl group, and a methyl group is most preferable because it is excellent in resolution and can be synthesized at a low cost.

When two of $R^{1''}$ to $R^{3''}$ in formula (b-1) are bonded to each other to form a ring with the sulfur atom, it is preferable that the two of $R^{1''}$ to $R^{3''}$ form a 3- to 10-membered ring including the sulfur atom, and it is particularly desirable that the two of $R^{1''}$ to $R^{3''}$ form a 5- to 7-membered ring including the sulfur atom.

When two of $R^{1''}$ to $R^{3''}$ in formula (b-1) are bonded to each other to form a ring with the sulfur atom, the remaining one of $R^{1''}$ to $R^{3''}$ is preferably an aryl group. Examples of the aryl group include the same groups as those exemplified above for the aryl groups for $R^{1''}$ to $R^{3''}$.

Preferred examples of the cation moiety for the compound represented by general formula (b-1) include those represented by general formulas (I-1-1) to (I-1-10) shown below. Among these, a cation moiety having a triphenylmethane skeleton, such as a cation moiety represented by any one of formulas (I-1-1) to (I-1-8) is particularly desirable.

In general formulas (I-1-9) and (I-1-10), each of $R^9$ and $R^{10}$ independently represents a phenyl group or naphthyl group which may have a substituent, an alkyl group of 1 to 5 carbon atoms, an alkoxy group or a hydroxyl group.

u is an integer of 1 to 3, and is most preferably 1 or 2.

[Chemical Formula 45]

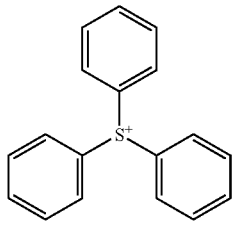

(I-1-1)

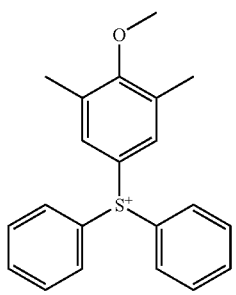

(I-1-2)

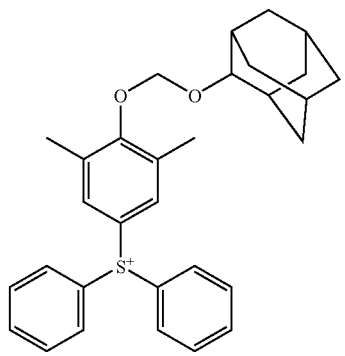

(I-1-3)

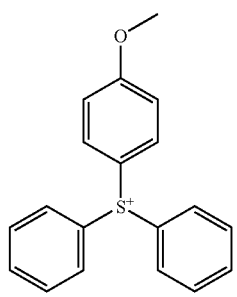

(I-1-4)

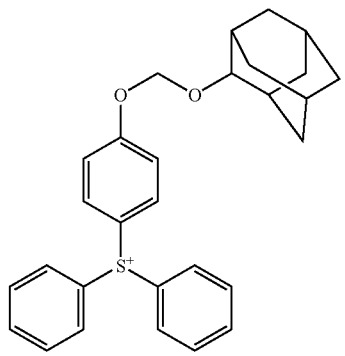

(I-1-5)

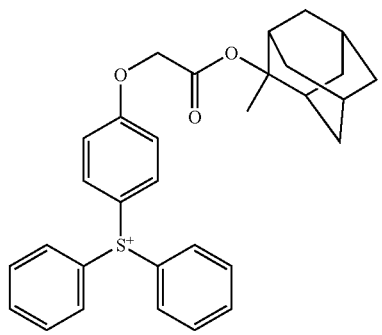

(I-1-6)

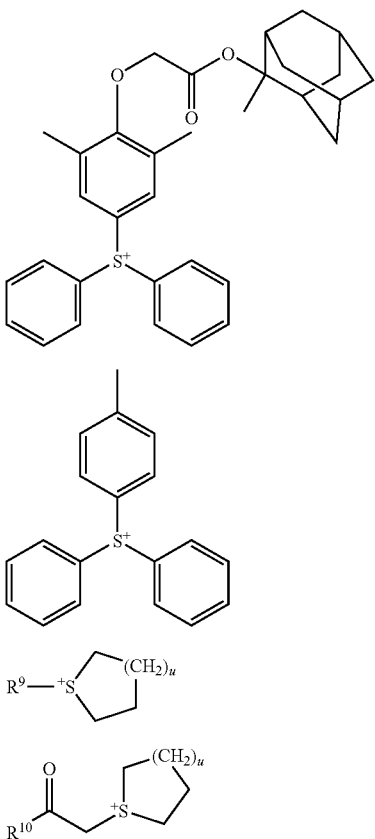

R$^{4'''}$ represents an alkyl group, a halogenated alkyl group, an aryl group or an alkenyl group which may have a substituent.

The alkyl group for R$^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

Examples of the halogenated alkyl group for R$^{4'''}$ include groups in which some or all of the hydrogen atoms of an aforementioned linear, branched or cyclic alkyl group have been substituted with halogen atoms. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms contained within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for R$^{4'''}$ is preferably an aryl group of 6 to 20 carbon atoms.

The alkenyl group for R$^{4'''}$ is preferably an alkenyl group of 2 to 10 carbon atoms.

With respect to R$^{4'''}$, the expression "may have a substituent" means that some or all of the hydrogen atoms within the aforementioned linear, branched or cyclic alkyl group, halogenated alkyl group, aryl group or alkenyl group may be substituted with substituents (atoms other than hydrogen atoms, or groups).

R$^{4'''}$ may have one substituent, or two or more substituents.

Examples of the substituent include a halogen atom, a hetero atom, an alkyl group, and a group represented by the formula X-Q$^1$- (wherein Q$^1$ represents a divalent linking group containing an oxygen atom, and X represents a hydrocarbon group of 3 to 30 carbon atoms which may have a substituent).

Examples of the halogen atoms and alkyl groups as substituents include the same halogen atoms and alkyl groups as those described above with respect to the halogenated alkyl group for R$^{4'''}$.

Examples of hetero atoms include an oxygen atom, a nitrogen atom, and a sulfur atom.

In the group represented by formula X-Q$^1$-, Q$^1$ represents a divalent linking group containing an oxygen atom.

Q$^1$ may contain an atom other than an oxygen atom. Examples of this atom other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond, —O—), an ester bond (—C(=O)—O—), an amido bond (—C(=O)—NH—), a carbonyl group (—C(=O)—) and a carbonate bond (—O—C(=O)—O—), and combinations of these non-hydrocarbon, oxygen atom-containing linking groups with an alkylene group.

Specific examples of these combinations of a non-hydrocarbon, oxygen atom-containing linking group and an alkylene group include —R$^{91}$—O—, —R$^{92}$—O—C(=O)—, —C(=O)—O—R$^{93}$—O—C(=O)— (wherein each of R$^{91}$ to R$^{93}$ independently represents an alkylene group).

The alkylene group for R$^{91}$ to R$^{93}$ is preferably a linear or branched alkylene group, and preferably has 1 to 12 carbon atoms, more preferably 1 to 5 carbon atoms, and most preferably 1 to 3 carbon atoms.

Specific examples of alkylene groups include a methylene group [—CH$_2$—], alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)CH$_2$CH$_2$CH$_3$)— and —C(CH$_2$CH$_3$)$_2$—, an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, a trimethylene group (n-propylene group) [—CH$_2$CH$_2$CH$_2$—], alkyltrimethylene groups such as —CH(CH$_3$)CH$_2$CH$_2$— and —CH$_2$CH(CH$_3$)CH$_2$—, a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—, and a pentamethylene group [—CH$_2$CH$_2$CH$_2$CH$_2$CH$_2$—].

Q$^1$ is preferably a divalent linking group containing an ester linkage or ether linkage, and is more preferably a group represented by —R$^{91}$—O—, —R$^{92}$—O—C(=O)— or —C(=O)—O—R$^{93}$—O—C(=O)—.

In the group represented by the formula X-Q$^1$-, the hydrocarbon group for X may be either an aromatic hydrocarbon group or an aliphatic hydrocarbon group.

The aromatic hydrocarbon group is a hydrocarbon group having an aromatic ring. This aromatic hydrocarbon ring preferably has 3 to 30 carbon atoms, more preferably 5 to 30, still more preferably 5 to 20, still more preferably 6 to 15, and most preferably 6 to 12 carbon atoms. Here, the number of carbon atoms within a substituent(s) is not included in the number of carbon atoms of the aromatic hydrocarbon group.

Specific examples of aromatic hydrocarbon groups include aryl groups, which are aromatic hydrocarbon rings having one hydrogen atom removed therefrom, such as a phenyl group, biphenyl group, fluorenyl group, naphthyl group, anthryl group or phenanthryl group, and arylalkyl groups such as a benzyl group, phenethyl group, 1-naphthylmethyl group, 2-naphthylmethyl group, 1-naphthylethyl group or 2-naphthylethyl group. The alkyl chain within the arylalkyl group preferably has 1 to 4 carbon atoms, more preferably 1 or 2 carbon atoms, and most preferably 1 carbon atom.

This aromatic hydrocarbon group may have a substituent. For example, some of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

Examples of the former include heteroaryl groups in which some of the carbon atoms constituting the ring within an aforementioned aryl group have been substituted with a hetero atom such as an oxygen atom, a sulfur atom or a nitrogen atom, and heteroarylalkyl groups in which some of the carbon atoms constituting the aromatic hydrocarbon ring within an aforementioned arylalkyl group have been substituted with an aforementioned hetero atom.

In the latter example, examples of the substituent for the aromatic hydrocarbon group include an alkyl group, an alkoxy group, a halogen atom, a halogenated alkyl group, a hydroxyl group or an oxygen atom (=O) or the like.

The alkyl group as the substituent for the aromatic hydrocarbon group is preferably an alkyl group of 1 to 5 carbon atoms, and a methyl group, ethyl group, propyl group, n-butyl group or tert-butyl group is particularly desirable.

The alkoxy group as the substituent for the aromatic hydrocarbon group is preferably an alkoxy group having 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group as the substituent for the aromatic hydrocarbon group include groups in which some or all of the hydrogen atoms within an aforementioned alkyl group have been substituted with an aforementioned halogen atom.

The aliphatic hydrocarbon group for X may be either a saturated aliphatic hydrocarbon group or an unsaturated aliphatic hydrocarbon group. Further, the aliphatic hydrocarbon group may be linear, branched or cyclic.

In the aliphatic hydrocarbon group for X, some of the carbon atoms that constitute the aliphatic hydrocarbon group may be substituted with a substituent group containing a hetero atom, or some or all of the hydrogen atoms that constitute the aliphatic hydrocarbon group may be substituted with a substituent group containing a hetero atom.

As this "hetero atom" within X, there is no particular limitation as long as it is an atom other than a carbon atom and a hydrogen atom. Examples of hetero atoms include a halogen atom, an oxygen atom, a sulfur atom and a nitrogen atom. Examples of halogen atoms include a fluorine atom, a chlorine atom, an iodine atom and a bromine atom.

The substituent group containing a hetero atom may consist solely of the hetero atom, or may be a group containing a group or atom other than the hetero atom.

Specific examples of the substituent group for substituting some of the carbon atoms include —O—, —C(=O)—O—, —C(=O)—, —O—C(=O)—O—, —C(=O)—NH—, —NH— (wherein H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups within the ring structure.

Examples of the substituent group for substituting some or all of the hydrogen atoms include an alkoxy group, a halogen atom, a halogenated alkyl group, a hydroxyl group, an oxygen atom (=O) and a cyano group.

The alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, a chlorine atom, a bromine atom and an iodine atom, and a fluorine atom is preferable.

Examples of the halogenated alkyl group include groups in which some or all of the hydrogen atoms within an alkyl group of 1 to 5 carbon atoms (such as a methyl group, ethyl group, propyl group, n-butyl group or tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decanyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group or docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group or 4-methylpentyl group.

The unsaturated hydrocarbon group preferably has 2 to 10 carbon atoms, more preferably 2 to 5, still more preferably 2 to 4, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above examples, the unsaturated hydrocarbon group is most preferably a propenyl group.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12 carbon atoms.

Examples of the aliphatic cyclic group include groups in which one or more hydrogen atoms have been removed from a monocycloalkane or a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 46]

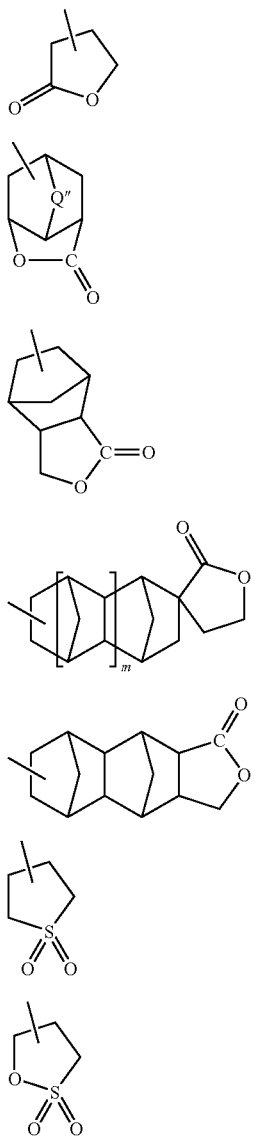

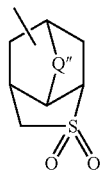

(S3)

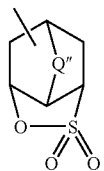

(S4)

In the formulas, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms), and m represents 0 or 1.

As the alkylene groups for Q", R$^{94}$ and R$^{95}$, the same alkylene groups as those described above for R$^{91}$ to R$^{93}$ can be used.

In these aliphatic cyclic groups, some of the hydrogen atoms boned to the carbon atoms that constitute the ring structure may be substituted with a substituent. Examples of this substituent include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups as those exemplified above for the substituent group used for substituting some or all of the hydrogen atoms.

In the present invention, X is preferably a cyclic group which may have a substituent. This cyclic group may be either an aromatic hydrocarbon group which may have a substituent, or an aliphatic cyclic group which may have a substituent, although an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, an aliphatic polycyclic group which may have a substituent is preferable. As this aliphatic polycyclic group, groups in which one or more hydrogen atoms have been removed from an aforementioned polycycloalkane, and groups represented by formulas (L2) to (L5), and (S3) and (S4) above are preferable.

In the present invention, R$^{4'''}$ preferably has X-Q$^1$- as a substituent. In such a case, R$^{4'''}$ is preferably a group represented by the formula X-Q$^1$-Y$^1$— (wherein Q$^1$ and X are the same as defined above for Q$^1$ and X in the formula X-Q$^1$, and Y$^1$ represents an alkylene group of 1 to 4 carbon atoms which may have a substituent, or a fluorinated alkylene group of 1 to 4 carbon atoms which may have a substituent).

In the group represented by the formula X-Q$^1$-Y$^1$—, examples of the alkylene group represented by Y$^1$ include those alkylene groups described above for Q$^1$ in which the number of carbon atoms is from 1 to 4.

Examples of the fluorinated alkylene group include groups in which some or all of the hydrogen atoms of an aforementioned alkylene group have been substituted with fluorine atoms.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —CH($CF_3CH_2$—, —CH($CF_2CF_3$)—, —C($CH_3$)($CF_3$)—, —$CH_2CH_2CH_2CF_2$—, —$CH_2CH_2CF_2CF_2$—, —CH($CF_3$)$CH_2CH_2$—, —$CH_2CH(CF_3)CH_2$—, —CH($CF_3$)CH ($CF_3$)—, —C($CF_3$)$_2CH_2$—; —$CH_2$—, —$CH_2CH_2$—, $CH_2CH_2CH_2$—, —CH($CH_3$)$CH_2$—, —CH($CH_2CH_3$)—, —C($CH_3$)$_2$—, —$CH_2CH_2CH_2CH_2$—, —CH($CH_3$) $CH_2CH_2$—, —$CH_2CH(CH_3)CH_2$—, —CH($CH_3$)CH ($CH_3$)—, —C($CH_3$)$_2CH_2$—, —CH($CH_2CH_3$)$CH_2$—, —CH ($CH_2CH_2CH_3$)— and —C($CH_3$)($CH_2CH_3$)—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, $CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$— and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may be substituted, either with atoms other than hydrogen atoms and fluorine atoms, or with groups.

Examples of the substituents which the alkylene group or fluorinated alkylene group may have include alkyl groups of 1 to 4 carbon atoms, alkoxy groups of 1 to 4 carbon atoms, and a hydroxyl group.

In general formula (b-2), each of $R^{5'''}$ and $R^{6'''}$ independently represents an aryl group or an alkyl group. At least one of $R^{5'''}$ and $R^{6'''}$ represents an aryl group. It is preferable that both of $R^{5'''}$ and $R^{6'''}$ represent aryl groups.

Examples of the aryl group for $R^{5'''}$ and $R^{6'''}$ include the same aryl groups as those exemplified for $R^{1'''}$ to $R^{3'''}$.

Examples of the alkyl group for $R^{5'''}$ and $R^{6'''}$ include the same alkyl groups as those exemplified for $R^{1'''}$ to $R^{3'''}$.

It is particularly desirable that both of $R^{5'''}$ and $R^{6'''}$ represent phenyl groups.

As $R^{4'''}$ in general formula (b-2), the same groups as those mentioned above for $R^{4'''}$ in general formula (b-1) can be used.

Specific examples of suitable onium salt acid generators represented by general formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate, di(1-naphthyl)phenylsulfonium trifluoromethanesulfonate, heptafluoropropanesulfonate or nonafluorobutanesulfonate, 1-phenyltetrahydrothiophenium trifluoromethanesulfonate, heptafluoropropanesulfonate or nonafluorobutanesulfonate, 1-(4-methylphenyl)tetrahydrothiophenium trifluoromethanesulfonate, heptafluoropropanesulfonate or nonafluorobutanesulfonate, 1-(3,5-dimethyl-4-hydroxyphenyl)tetrahydrothiophenium trifluoromethanesulfonate, heptafluoropropanesulfonate or nonafluorobutanesulfonate, 1-(4-methoxynaphthalene-1-yl)tetrahydrothiophenium trifluoromethanesulfonate, heptafluoropropanesulfonate or nonafluorobutanesulfonate, 1-(4-ethoxynaphthalene-1-yl)tetrahydrothiophenium trifluoromethanesulfonate, heptafluoropropanesulfonate or nonafluorobutanesulfonate, 1-(4-n-butoxynaphthalene-1-yl)tetrahydrothiophenium trifluoromethanesulfonate, heptafluoropropanesulfonate or nonafluorobutanesulfonate, 1-phenyltetrahydrothiopyranium trifluoromethanesulfonate, heptafluoropropanesulfonate or nonafluorobutanesulfonate, 1-(4-hydroxyphenyl)tetrahydrothiopyranium trifluoromethanesulfonate, heptafluoropropanesulfonate or nonafluorobutanesulfonate, 1-(3,5-dimethyl-4-hydroxyphenyl)tetrahydrothiopyranium trifluoromethanesulfonate, heptafluoropropanesulfonate or nonafluorobutanesulfonate, and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts have been replaced by an alkylsulfonate such as methanesulfonate, n-propanesulfonate, n-butanesulfonate or n-octanesulfonate.

Furthermore, onium salts in which the anion moiety of these onium salts have been replaced by an anion moiety represented by any one of formulas (b1) to (b8) shown below can also be used.

[Chemical Formula 47]

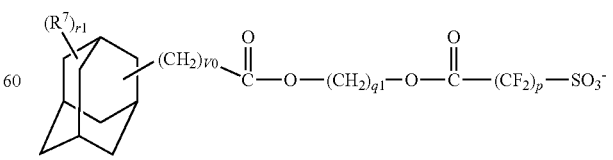

(b1)

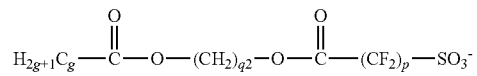

(b2)

(b3)
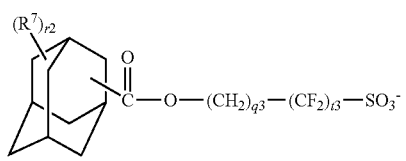

(b4)
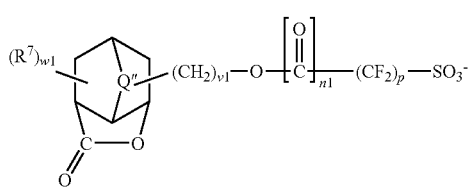

(b5)
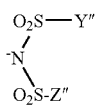

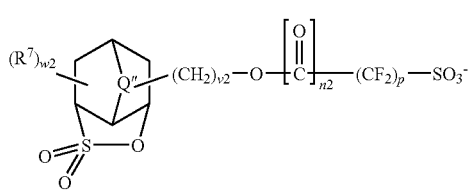

(b6)

(b7)
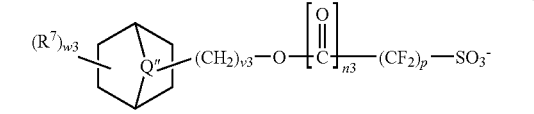

(b8)
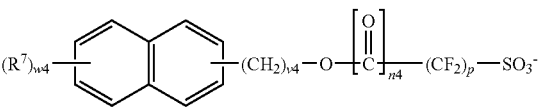

In the formulas, p represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3, g represents an integer of 1 to 20, $R^7$ represents a substituent, each of n1 to n5 independently represents 0 or 1, each of v0 to v5 independently represents an integer of 0 to 3, each of w1 to w5 independently represents an integer of 0 to 3, and Q" is the same as defined above.

Examples of the substituent for $R^7$ include the same groups as those which the aforementioned aliphatic hydrocarbon group or aromatic hydrocarbon group for X may have as a substituent.

If there are two or more $R^7$ groups, as indicated by the values r1 or w1 to w5, then the plurality of $R^7$ groups may be the same or different from each other.

Further, onium salt-based acid generators in which the anion moiety in general formula (b-1) or (b-2) is replaced by an anion moiety represented by general formula (b-3) or (b-4) shown below (but the cation moiety is the same as (b-1) or (b-2)) may also be used as the onium salt-based acid generator.

[Chemical Formula 48]

(b-3)
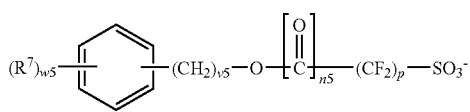

(b-4)

In the formulas, X" represents an alkylene group of 2 to 6 carbon atoms in which at least one hydrogen atom has been substituted with a fluorine atom, and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and this alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms in the alkylene group for X" or the alkyl group for Y" and Z" within the above-mentioned range of the number of carbon atoms, the more the solubility in a resist solvent is improved, and therefore a smaller number is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or electron beam is improved. The fluorination ratio, namely the ratio of fluorine atoms within the alkylene group or alkyl group, is preferably within a range from 70 to 100%, more preferably from 90 to 100%, and it is particularly desirable that the alkylene group or alkyl group is a perfluoroalkylene group or perfluoroalkyl group in which all of the hydrogen atoms have been substituted with fluorine atoms.

Furthermore, a sulfonium salt having a cation moiety represented by general formula (b-5) or (b-6) shown below may also be used as an onium salt-based acid generator.

[Chemical Formula 49]

(b-5)
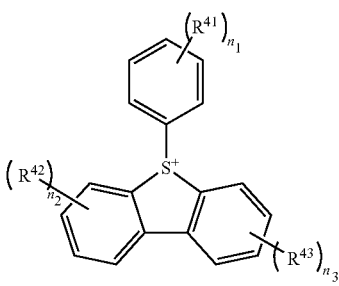

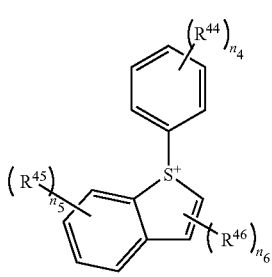
(b-6)

In the formulas, each of $R^{41}$ to $R^{46}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably an aforementioned alkyl group in which one or more hydrogen atoms have been substituted with hydroxyl groups, and examples thereof include a hydroxymethyl group, a hydroxyethyl group and a hydroxypropyl group.

If there are two or more of an individual $R^{41}$ to $R^{46}$ group, as indicated by the corresponding value of $n_1$ to $n_6$, then the plurality of the individual $R^{41}$ to $R^{46}$ group may be the same or different from each other.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties as those used within the various onium salt-based acid generators that have been proposed may be used. Examples of such anion moieties include fluorinated alkylsulfonate ions such as the anion moieties ($R^{4''}SO_3^-$) for the onium salt-based acid generators represented by general formula (b-1) or (b-2) shown above, and anion moieties represented by general formula (b-3) or (b-4) shown above.

In the present description, an oxime sulfonate-based acid generator is a compound having at least one group represented by general formula (B-1) shown below, and has a feature of generating acid by irradiation. Such oxime sulfonate acid generators are widely used for chemically amplified resist compositions, and can be selected as appropriate.

[Chemical Formula 50]

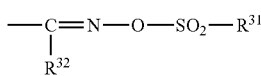
(B-1)

In the formula, each of $R^{31}$ and $R^{32}$ independently represents an organic group.

The organic groups for $R^{31}$ and $R^{32}$ refer to groups containing a carbon atom, which may also include atoms other than carbon atoms (such as a hydrogen atom, oxygen atom, nitrogen atom, sulfur atom or halogen atom (such as a fluorine atom or chlorine atom) or the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression that the alkyl group or the aryl group "may have a substituent" means that some or all of the hydrogen atoms of the alkyl group or the aryl group may be substituted with a substituent.

The alkyl group preferably has 1 to 20 carbon atoms, more preferably 1 to 10, still more preferably 1 to 8, still more preferably 1 to 6, and most preferably 1 to 4 carbon atoms. As the alkyl group, a partially or completely halogenated alkyl group (hereinafter, sometimes referred to as a "halogenated alkyl group") is particularly desirable. A "partially halogenated alkyl group" refers to an alkyl group in which some of the hydrogen atoms have been substituted with halogen atoms and a "completely halogenated alkyl group" refers to an alkyl group in which all of the hydrogen atoms have been substituted with halogen atoms. Examples of the halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. A "partially halogenated aryl group" refers to an aryl group in which some of the hydrogen atoms have been substituted with halogen atoms, and a "completely halogenated aryl group" refers to an aryl group in which all of the hydrogen atoms have been substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group or a cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 51]

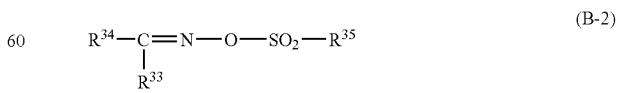
(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 52]

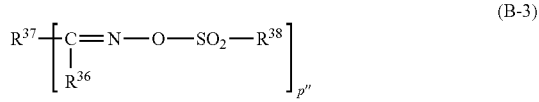

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenyl group, fluorenyl group, naphthyl group, anthryl group or phenanthryl group, and heteroaryl groups in which some of the carbon atoms constituting the ring(s) of these groups have been substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group or an alkoxy group. The alkyl group or halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more fluorinated, still more preferably 90% or more fluorinated. A completely fluorinated alkyl group in which 100% of the hydrogen atoms have been substituted with fluorine atoms is particularly desirable.

In general formula (B-3), examples of the alkyl group having no substituent and the halogenated alkyl group for $R^{36}$ include the same groups as those exemplified above for the alkyl group having no substituent and the halogenated alkyl group for $R^{33}$.

Examples of the divalent or trivalent aromatic hydrocarbon group for $R^{37}$ include groups in which one or two hydrogen atoms have been removed from the aforementioned aryl group for $R^{34}$.

Examples of the alkyl group having no substituent or the halogenated alkyl group for $R^{38}$ include the same groups as those exemplified above for the alkyl group having no substituent or the halogenated alkyl group for $R^{35}$.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, (isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, (isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may also be used favorably.

Furthermore, the following compounds may also be used as preferred examples.

[Chemical Formula 53]

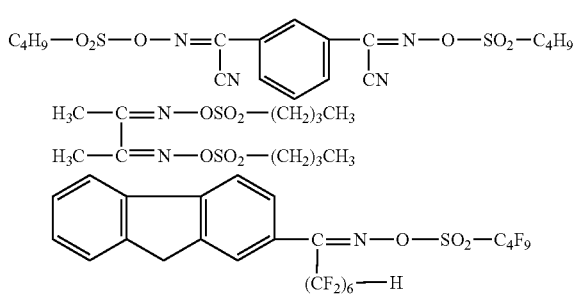

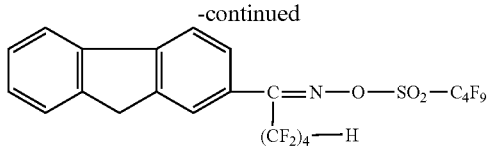

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane and 1,10-bis(cyclohexylsulfonyldiazomethylsulfonyl)decane.

As the component (B), one type of acid generator may be used alone, or two or more types of acid generators may be used in combination.

In the present invention, as the component (B), it is preferable to use an onium salt having a fluorinated alkylsulfonate ion as the anion moiety.

In the positive resist composition of the present invention, the amount of the component (B), relative to 100 parts by weight of the component (A), is preferably within a range from 0.5 to 50 parts by weight, and more preferably from 1 to 40 parts by weight. By ensuring that the amount of the component (B) is within the above-mentioned range, formation of a resist pattern can be performed satisfactorily. Further, by virtue of the above-mentioned range, a uniform solution can be obtained and the storage stability tends to improve.

<Optional Components>

The positive resist composition of the present invention may further contain a nitrogen-containing organic compound (D) (hereafter referred to as "component (D)") as an optional component.

There are no particular limitations on the component (D) as long as it functions as an acid diffusion control agent, namely, a quencher which traps the acid generated from the component (B) upon exposure. A multitude of these components (D) have already been proposed, and any of these known compounds may be used. Examples of these compounds include amines such as aliphatic amines and aromatic amines, and of these, aliphatic amines, and particularly secondary aliphatic amines and tertiary aliphatic amines, are preferred. Here, an "aliphatic amine" describes an amine having one or more aliphatic groups, wherein the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of at least 1 carbon atom but not more than 20 carbon atoms (namely, alkylamines and alkyl alcohol amines), and cyclic amines.

Specific examples of alkylamines and alkyl alcohol amines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine and tri-n-dodecylamine, and alkyl alcohol amines such as diethanolamine, triethanolamine, diisopropanolamine, triisopropanolamine, di-n-octanolamine, tri-n-octanolamine, stearyldiethanolamine and lauryldiethanolamine. Among these, trialkylamines and/or alkyl alcohol amines are preferable.

Examples of the cyclic amines include heterocyclic compounds containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine and 1,4-diazabicyclo[2.2.2]octane.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

These compounds can be used either alone, or in combinations of two or more different compounds.

The component (D) is typically used in an amount within a range from 0.01 to 5.0 parts by weight, relative to 100 parts by weight of the component (A). By ensuring that the amount of the component (D) is within the above-mentioned range, the shape of the resist pattern and the post exposure stability of the latent image formed by the pattern-wise exposure of the resist layer are improved.

Furthermore, in the positive resist composition of the present invention, in order to prevent any deterioration in sensitivity, and improve the resist pattern shape and the post exposure stability of the latent image formed by the pattern-wise exposure of the resist layer, at least one compound (E) (hereafter referred to as "component (E)") selected from the group consisting of organic carboxylic acids, phosphorus oxo acids and derivatives thereof may be added.

Examples of the organic carboxylic acids include acetic acid, malonic acid, citric acid, malic acid, succinic acid, benzoic acid and salicylic acid.

Examples of the phosphorus oxo acids and derivatives thereof include phosphoric acid, phosphonic acid and phosphinic acid. Among these, phosphonic acid is particularly desirable.

Examples of oxo acid derivatives include esters in which a hydrogen atom within an above-mentioned oxo acid is substituted with a hydrocarbon group. Examples of the hydrocarbon group include alkyl groups of 1 to 5 carbon atoms and aryl groups of 6 to 15 carbon atoms.

Examples of phosphoric acid derivatives include phosphoric esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type of compound may be used alone, or two or more types of compounds may be used in combination.

The component (E) is preferably used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents and dyes.

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more types of organic solvent can be appropriately selected from those that have been conventionally known as solvents for chemically amplified resists.

Examples thereof include lactones such as γ-butyrolactone, ketones such as acetone, methyl ethyl ketone, cycloheptanone, cyclohexanone, methyl-n-pentyl ketone, methyl isopentyl ketone and 2-heptanone, polyhydric alcohols such as ethylene glycol, diethylene glycol, propylene glycol and dipropylene glycol, derivatives of polyhydric alcohols, including compounds having an ester bond, such as ethylene glycol monoacetate, diethylene glycol monoacetate, propylene glycol monoacetate and dipropylene glycol monoacetate, and compounds having an ether bond, such as monoalkyl ethers (such as the monomethyl ether, monoethyl ether, monopropyl ether or monobutyl ether) or monophenyl ethers of any of the aforementioned polyhydric alcohols or compounds having an ester bond (among these, propylene glycol monomethyl ether acetate (PGMEA) and propylene glycol monomethyl ether (PGME) are preferable), cyclic ethers such as dioxane, esters such as methyl lactate, ethyl lactate (EL), methyl acetate, ethyl acetate, butyl acetate, methyl pyruvate, ethyl pyruvate, methyl methoxypropionate, and ethyl ethoxypropionate, and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These solvents can be used individually, or two or more solvents may be used as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be determined with due consideration of the compatibility of the PGMEA with the polar solvent, but is preferably within a range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably from 3:7 to 7:3.

Further, as the component (S), a mixed solvent of at least one of PGMEA and EL with γ-butyrolactone is also preferable. The mixing ratio (former:latter) of such a mixed solvent is preferably within a range from 70:30 to 95:5.

The amount of the component (S) is not particularly limited, and is appropriately adjusted to a concentration which enables coating of a coating solution to a substrate, in accordance with the thickness of the coating film. In general, the organic solvent is used in an amount such that the solid fraction concentration of the resist composition is within a range from 1 to 20% by weight, and preferably from 2 to 15% by weight.

The positive resist composition of the present invention described above and the component (A1) blended in the positive resist composition are novel, and are essentially unknown in the art.

By employing the positive resist composition of the present invention, a resist film can be formed on a support such as a substrate with excellent adhesion. Further, the positive resist composition of the present invention exhibits excellent lithography properties with respect to sensitivity, depth of focus (DOF), and exposure margin (EL) and the like. Further, a resist pattern can be formed with excellent mask reproducibility (for example, excellent mask error factor (MEF)), and the shape of the formed resist pattern (for example, the circularity of the holes of a hole pattern), the in-plane uniformity of the pattern dimensions (CDU), and the line width roughness (LWR) and the like are also improved. EL describes the range of the exposure dose across which a resist pattern can be formed with a size within a predetermined range of variation from a target size, when exposure is conducted by changing the exposure dose, namely, the range of the exposure dose for which a resist pattern faithful to the mask pattern can be formed. The larger the exposure margin, the smaller the variation in the pattern size that accompanies a change in the exposure dose, thereby resulting in favorable improvement in the process margin. DOF describes the range of depth of focus for which a resist pattern having a predetermined size within the range corresponding to the target size can be formed when the exposure focus is moved upward or downward with the same exposure dose, namely, the range for which a resist pattern faithful to the mask pattern can be obtained. A larger DOF value is preferable. LWR refers to the phenomenon in which the line width of a line pattern formed using a resist composition lacks uniformity, and improvement in this characteristic becomes more important as the pattern becomes finer.

In the present invention, the reasons why the above-mentioned lithography effects can be achieved have not yet been fully elucidated, although it is thought that one reason is that including the structural unit (a0-1) having a cyclic group containing the polar group —$SO_2$— at the terminal of a relatively long side chain enables the component (B) to be distributed more uniformly, thereby resulting in the observed improvement in lithography properties.

Further, by employing the positive resist composition of the present invention, a resist pattern having reduced line edge roughness (LER) can be formed on a support with excellent resolution.

Here, LER describes roughness within the side wall surfaces of the resist pattern. LER is a cause of deterioration in the resist pattern shape, causing distortions around the holes in a hole pattern, and fluctuations in the line width in a line and space pattern, and consequently has the potential to adversely affect the formation of very fine semiconductor elements. Improving LER is therefore very desirable.

Further, by using the positive resist composition of the present invention during formation of a hole pattern, the hole circularity, diameter (CD) and diameter uniformity (CDU) can be improved, enabling the formation of a resist pattern with a favorable hole shape and a narrow pitch.

The reasons why the above-mentioned lithography effects can be achieved are not entirely clear, although it is thought that one reason is that by including the component (A1) containing both the structural unit (a0-2) and the structural unit (a1-0-1), the difference in the solubility within an alkali developing solution (namely, the solubility contrast) between the unexposed portions and the exposed portions can be increased dramatically compared with conventional positive resist compositions. It is surmised that because the length of the side chain portion in the structural unit (a0-2) is very long, and because an oxygen atom (—O—) or a carbonyl group that acts as an electron withdrawing group is also introduced into this side chain portion, the terminal acid-dissociable, dissolution-inhibiting group dissociates very readily, thereby improving the dissociation efficiency and improving the solubility contrast within fine patterns.

Furthermore, because the structural unit (a0-2) has a comparatively long ester chain, if the amount of the structural unit (a0-2) exceeds a predetermined proportion, then the heat resistance of the entire component (A1) tends to deteriorate. In the positive resist composition of the present invention, because the amounts of the structural unit (a0-1), the structural unit (a0-2) and the structural unit (a1-0-1) within the component (A1) all fall within predetermined ranges, the above-mentioned lithography properties are excellent, and the heat resistance is also excellent. Because the heat resistance is excellent, heat sag of the resist film is unlikely to occur during the post baking performed during resist pattern formation, meaning problems such as changes in the resist pattern dimensions can be prevented.

<<Method of Forming a Resist Pattern>>

The method of forming a resist pattern according to the present invention includes: applying a positive resist composition of the present invention onto a substrate to form a resist film on the substrate, conducting exposure of the resist film, and developing the resist film to form a resist pattern.

More specifically, the method for forming a resist pattern according to the present invention can be performed, for example, in the manner described below.

Firstly, a positive resist composition according to the present invention is applied onto a substrate using a spinner or the like, and a prebake (post applied bake (PAB)) is conducted at a temperature of 80 to 150° C. for 40 to 120 seconds, and preferably 60 to 90 seconds, to form a resist film. Following selective exposure of the thus formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, PEB (post exposure baking) is conducted under temperature conditions of 80 to 150° C. for 40 to 120 seconds, and preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water and drying. If desired, a bake treatment (post bake) can be conducted following the developing. In this manner, a resist pattern that is faithful to the mask pattern can be obtained.

The substrate is not specifically limited, and conventionally known substrates can be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiation such as an ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective for use with a KrF excimer laser, ArF excimer laser, EB and EUV, and is particularly effective to an ArF excimer laser.

The exposure of the resist film can be either a general exposure (dry exposure) conducted in air or an inert gas such as nitrogen, or an immersion exposure (liquid immersion lithography).

In liquid immersion lithography, the region between the resist film and the lens at the lowermost point of the exposure apparatus is pre-filled with a solvent (an immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, wherein the boiling point of the fluorine-based inert liquid is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group have been substituted with fluorine atoms is particularly desirable. Examples of these perfluoroalkyl compounds include perfluoroalkyl ether compounds and perfluoroalkyl amine compounds. Specifically, one example of a suitable perfluoroalkyl ether compound is perfluoro(2-butyl-tetrahydrofuran) (boiling point 102° C.), and an example of a suitable perfluoroalkyl amine compound is perfluorotributylamine (boiling point 174° C.).

As the immersion medium, water is preferable in terms of cost, safety, environmental factors and versatility.

<<Polymeric Compound>>

The polymeric compound of the present invention is a polymeric compound (A1) that includes a structural unit (a0-1) represented by general formula (a0-1) shown below, a structural unit (a0-2) represented by general formula (a0-2) shown below, and a structural unit (a1-0-1) represented by general formula (a1-0-1) shown below, wherein based on the combined total of all the structural units that constitute the polymeric compound (A1), the proportion of the structural unit (a0-1) is within a range from 10 to 40 mol %, the proportion of the structural unit (a0-2) is within a range from 5 to 20 mol %, and the proportion of the structural unit (a1-0-1) is within a range from 10 to 55 mol %.

The explanation of the polymeric compound of the present invention is the same as the above explanation of the component (A1) of the positive resist composition of the present invention.

[Chemical Formula 54]

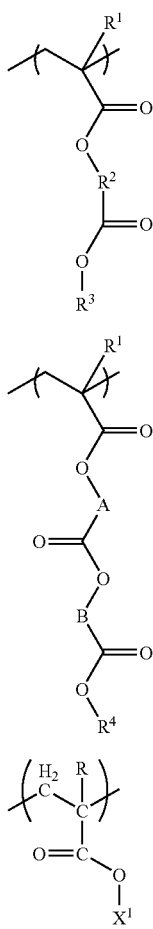

In the formulas, each of $R^1$ and R independently represents a hydrogen atom, an alkyl group of 1 to 5 carbon atoms, or a halogenated alkyl group of 1 to 5 carbon atoms, each of $R^2$, A and B represents a divalent linking group, $R^3$ represents a cyclic group containing —$SO_2$— within the ring skeleton thereof, and $R^4$ and $X^1$ each represents an acid-dissociable, dissolution-inhibiting group.

EXAMPLES

A more detailed description of the present invention is presented below based on a series of examples, although the scope of the present invention is in no way limited by these examples.

In the following examples, a unit represented by a chemical formula (1) is designated as "compound (1)", and the same labeling system applies for compounds represented by other formulas.

Monomer Synthesis Example 1

Synthesis of Compound (1)

The compound (1) used in the polymer synthesis examples described below was synthesized using the procedure described below.

A 500 ml three-necked flask was charged, under a nitrogen atmosphere, with 300 ml of a tetrahydrofuran (THF) solution containing 20 g (105.14 mmol) of an alcohol (1), 30.23 g (157.71 mmol) of ethyldiisopropylaminocarbodiimide (EDCI) hydrochloride and 0.6 g (5 mmol) of dimethylaminopyridine, 16.67 g (115.66 mmol) of a precursor (1) was added to the flask under ice cooling (0° C.), and the resulting mixture was stirred at room temperature for 12 hours.

After conducting thin-layer chromatography (TLC) to confirm that the raw materials had been consumed, 50 ml of water was added to stop the reaction. Subsequently, the reaction solvent was concentrated under reduced pressure, and extraction was conducted with ethyl acetate three times. The thus obtained organic phase was washed sequentially with water, saturated sodium hydrogen carbonate and 1N—HClaq. Thereafter, the solvent was distilled off under reduced pressure, and the resulting product was dried, yielding the compound (1).

The results of instrumental analysis of the obtained compound (1) were as follows.

$^1$H-NMR (CDCl$_3$, 400 MHz): δ(ppm)=6.22 (s, 1H, H$^a$), 5.70 (s, 1H, H$^b$), 4.71-4.85 (m, 2H, H$^{c,d}$), 4.67 (s, 2H, H$^k$), 3.40-3.60 (m, 2H, H$^{e,f}$), 2.58-2.70 (m, 1H, H$^g$), 2.11-2.21 (m, 2H, H$^h$), 2.00 (s, 3H, H$^i$), 1.76-2.09 (m, 2H, H$^j$).

[Chemical Formula 55]

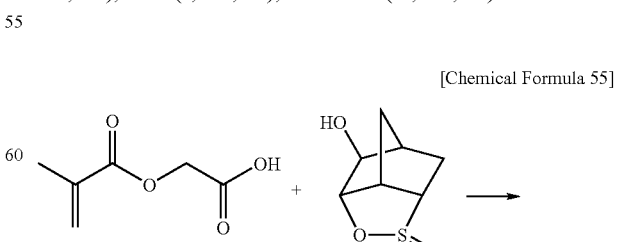

Precursor (1)  Alcohol (1)

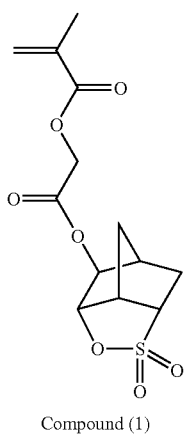

Compound (1)

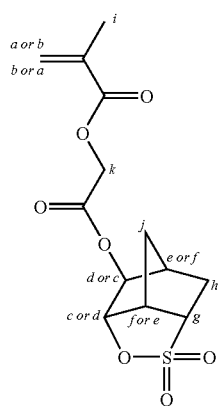

Monomer Synthesis Example 2

Synthesis of Compound (2)

The compound (2) used in the polymer synthesis examples described below was synthesized using the procedure described below.

A 2 L three-necked flask fitted with a thermometer, a cooling tube and a stirrer was charged with 37.6 g (494 mmol) of glycolic acid, 700 ml of dimethylformamide (DMF), 86.5 g (626 mmol) of potassium carbonate, and 28.3 g (170 mmol) of potassium iodide, and the resulting mixture was stirred at room temperature for 30 minutes. Subsequently, 300 ml of a dimethylformamide solution containing 100 g (412 mmol) of 2-methyl-2-adamantyl chloroacetate was added gradually to the flask. The resulting mixture was then heated to 40° C., and stirred for 4 hours. Following completion of the reaction, 2,000 ml of diethyl ether was added to the reaction mixture, the mixture was filtered, and the resulting solution was washed three times with 500 ml samples of distilled water. Crystallization was then conducted using a mixed solvent containing 300 ml of toluene and 200 ml of heptane, yielding 78 g of the target compound (2-(2-(2-methyl-2-adamantyloxy)-2-oxoethoxy)-2-oxoethanol) in the form of a colorless solid (yield: 67%, GC purity: 99%).

The results of instrumental analysis of the obtained compound were as follows.

$^1$H-NMR: 1.59 (d, 2H, J=12.5 Hz), 1.64 (s, 3H), 1.71-1.99 (m, 10H), 2.29 (m, 2H), 2.63 (t, 1H, J=5.2 Hz), 4.29 (d, 2H, J=5.2 Hz), 4.67 (s, 2H).

$^{13}$C-NMR: 22.35, 26.56, 27.26, 32.97, 34.54, 36.29, 38.05, 60.54, 61.50, 89.87, 165.97, 172.81.

GC-MS: 282 (M+, 0.02%), 165 (0.09%), 149 (40%), 148 (100%), 133 (22%), 117 (2.57%), 89 (0.40%).

From the results above, it was confirmed that the obtained compound was 2-(2-(2-methyl-2-adamantyloxy)-2-oxoethoxy)-2-oxoethanol.

Next, 165 g (584 mmol) of 2-(2-(2-methyl-2-adamantyloxy)-2-oxoethoxy)-2-oxoethanol, 2,000 ml of THF, 105 ml (754 mmol) of triethylamine and 0.165 g (1,000 ppm) of p-methoxyphenol were added to and dissolved in a 2 L three-necked flask fitted with a thermometer, a cooling tube and a stirrer.

Following dissolution, 62.7 ml (648 mmol) of methacryloyl chloride was added gradually to the flask while cooling in an ice bath. The temperature of the resulting mixture was then elevated to room temperature, and the resultant was stirred for 3 hours. Subsequently, 1,000 ml of diethyl ether was added to the flask, and the flask contents were washed 5 times with 200 ml samples of distilled water. The extracted liquid was then concentrated, yielding 198 g of the target compound (compound (2)) in the form of a colorless liquid (yield: 97%, GC purity: 99%).

The results of instrumental analysis of the obtained compound (2) were as follows.

$^1$H-NMR: 1.58 (d, J=12.5 Hz, 2H), 1.63 (s, 3H), 1.71-1.89 (m, 8H), 1.98 (s, 3H), 2.00 (m, 2H), 2.30 (m, 2H), 4.62 (s, 2H), 4.80 (s, 2H), 5.66 (m, 1H), 6.23 (m, 1H).

$^{13}$C-NMR: 18.04, 22.15, 26.42, 27.14, 32.82, 34.38, 36.11, 37.92, 60.44, 61.28, 89.42, 126.79, 135.18, 165.61, 166.30, 167.20.

GC-MS: 350 (M+, 1.4%), 206 (0.13%), 149 (47%), 148 (100%), 133 (20%), 69 (37%).

Polymer Synthesis Example 1

In a three-necked flask fitted with a thermometer and a reflux tube, 32.32 g (102.29 mmol) of a compound (1), 11.93 g (34.10 mmol) of a compound (2) and 8.05 g (34.10 mmol) of a compound (4) were dissolved in 106.77 g of methyl ethyl ketone (MEK) to obtain a solution. Subsequently, 17.3 mmol of dimethyl azobisisobutyrate (V-601) was added and dissolved in the solution as a polymerization initiator. The resulting solution was added dropwise, over a period of three hours and under a nitrogen atmosphere, to 67.00 g of MEK (67.00 g (255.73 mmol) of a compound (3) dissolved therein) heated to 80° C. Following completion of the dropwise addition, the reaction solution was heated for 2 hours under stirring, and was then cooled to room temperature. The thus obtained reaction polymer solution was added dropwise to an excess amount of n-heptane to precipitate the polymer, and the precipitated white powder was separated by filtration, washed sequentially with a mixed solvent of n-heptane and 2-propanol and then with methanol, and subsequently dried, yielding 65 g of a polymeric compound 1 as the target compound.

For this polymeric compound 1, the weight average molecular weight (Mw) determined by GPC measurement and referenced against standard polystyrenes was 8,300, and the dispersity (Mw/Mn) was 1.54. Further, analysis of the polymeric compound 1 by carbon-13 nuclear magnetic resonance spectroscopy (600 MHz, $^{13}$C-NMR) revealed that the compositional ratio of the copolymer (namely, the ratio (molar ratio) of each of the respective structural units within the structural formula) was a5/a11/a14/a3=34.8/42.7/10.9/11.6.

[Chemical Formula 56]

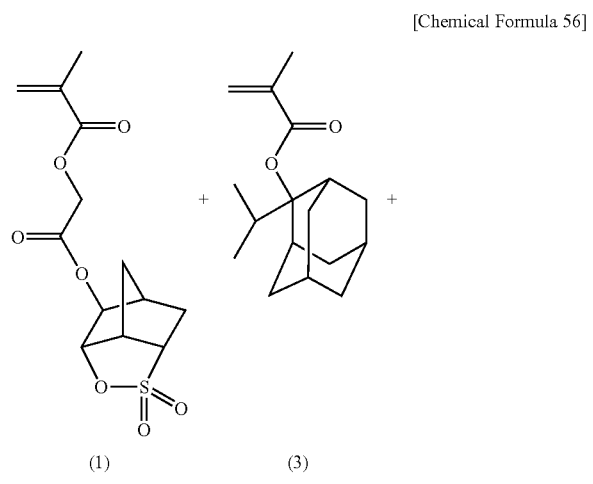

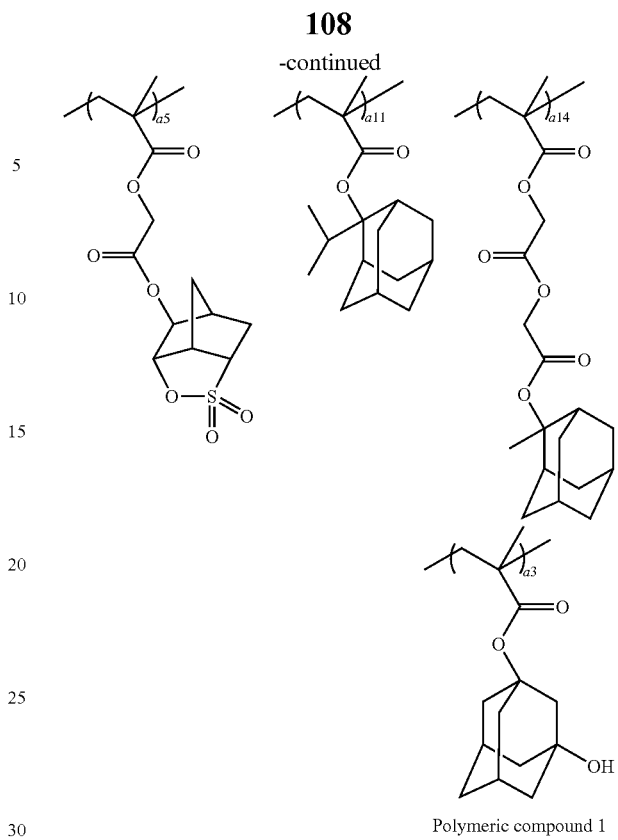

Polymeric compound 1

Polymeric compounds 2 to 52 were synthesized in the same manner as that described above for [Polymer Synthesis Example 1], with the exception that the monomers that give rise to each of the structural units that constitute the polymeric compound were used at predetermined molar ratios.

For each of the polymeric compounds 2 to 52, the reaction equation, the polystyrene equivalent weight average molecular weight (Mw) and dispersity (Mw/Mn) determined by GPC measurements, and the compositional ratio of the copolymer (namely, the ratio (molar ratio) of each of the respective structural units within the structural formula) determined by carbon-13 nuclear magnetic spectroscopy (600 MHz, $^{13}$C-NMR) are presented below.

Polymer Synthesis Example 2

[Chemical Formula 57]

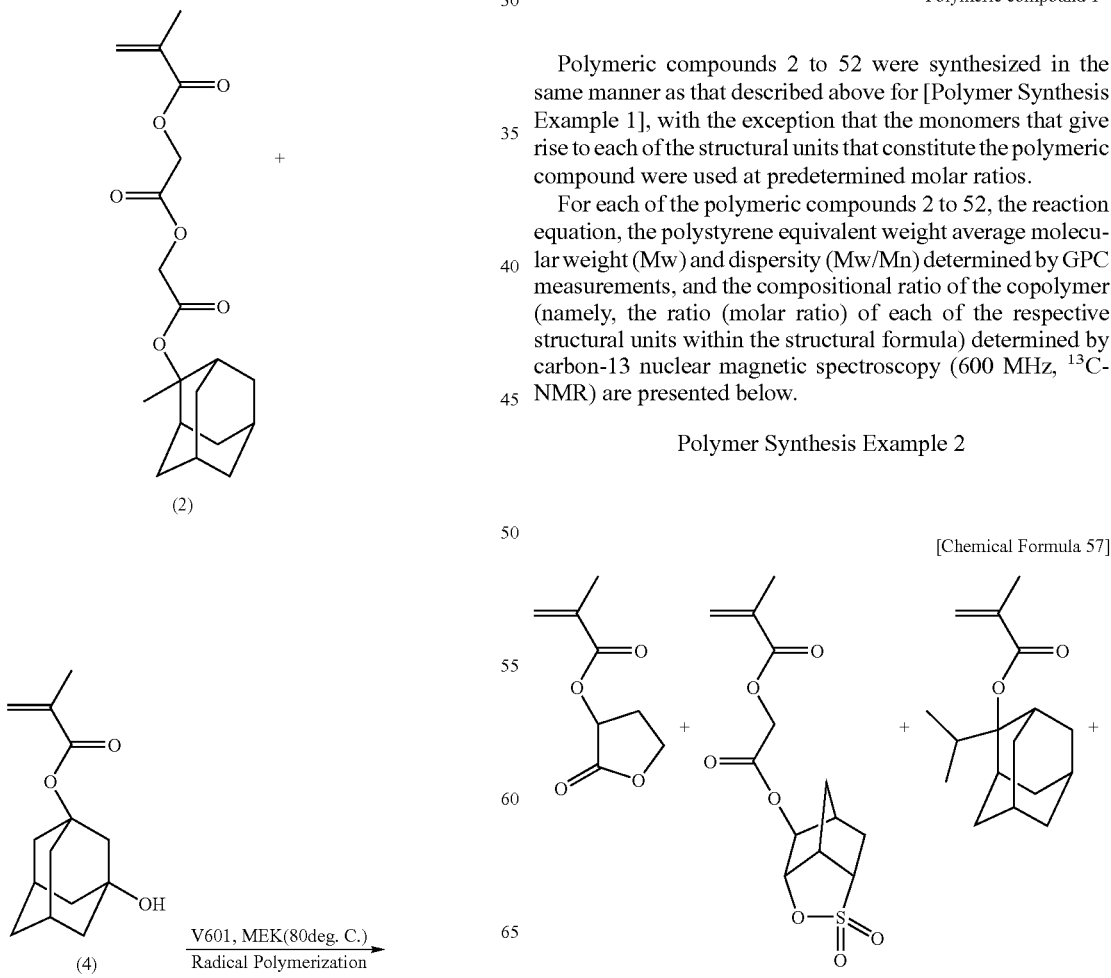

110
Polymer Synthesis Example 3
[Chemical Formula 58]
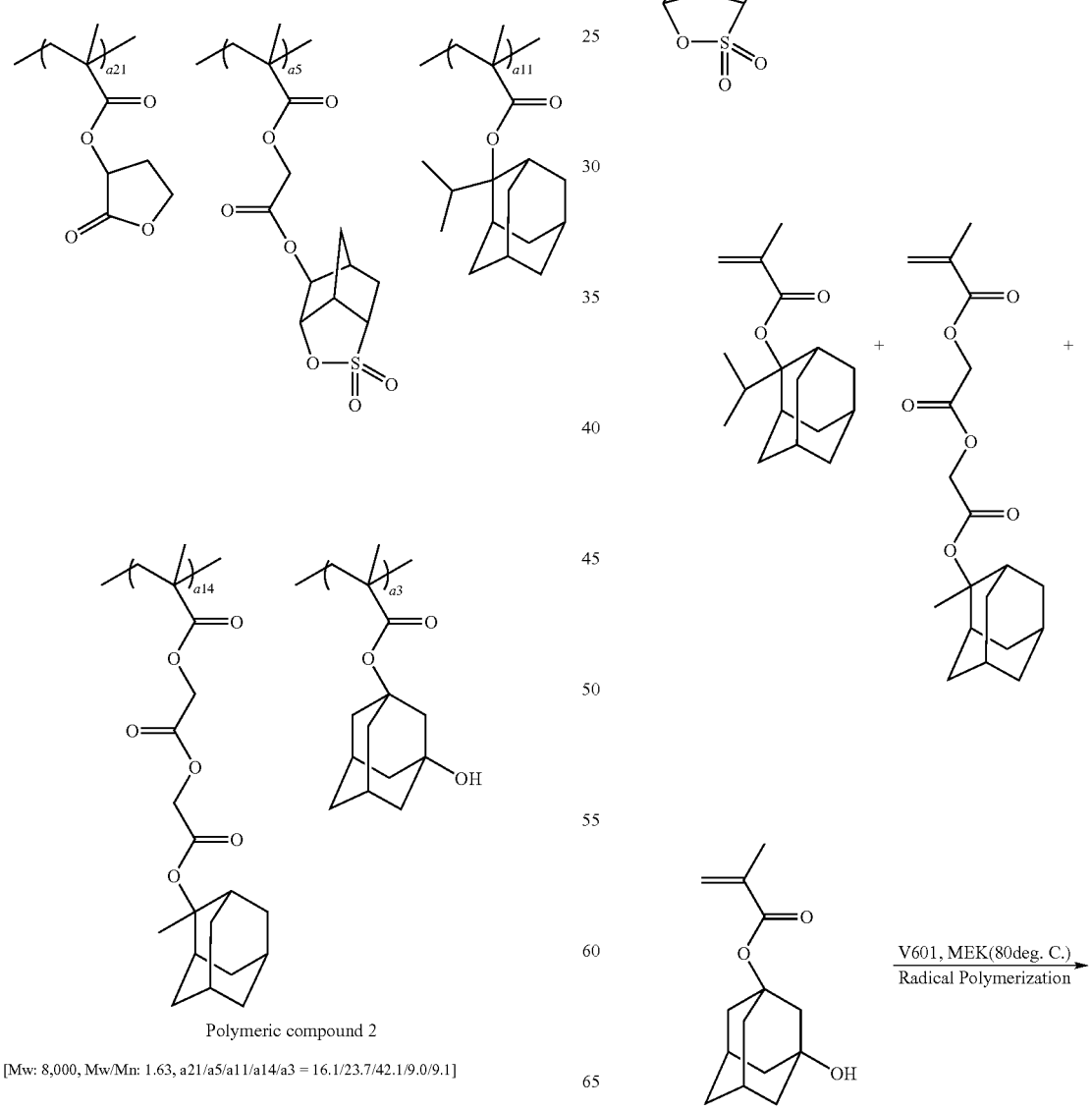
Polymeric compound 2
[Mw: 8,000, Mw/Mn: 1.63, a21/a5/a11/a14/a3 = 16.1/23.7/42.1/9.0/9.1]

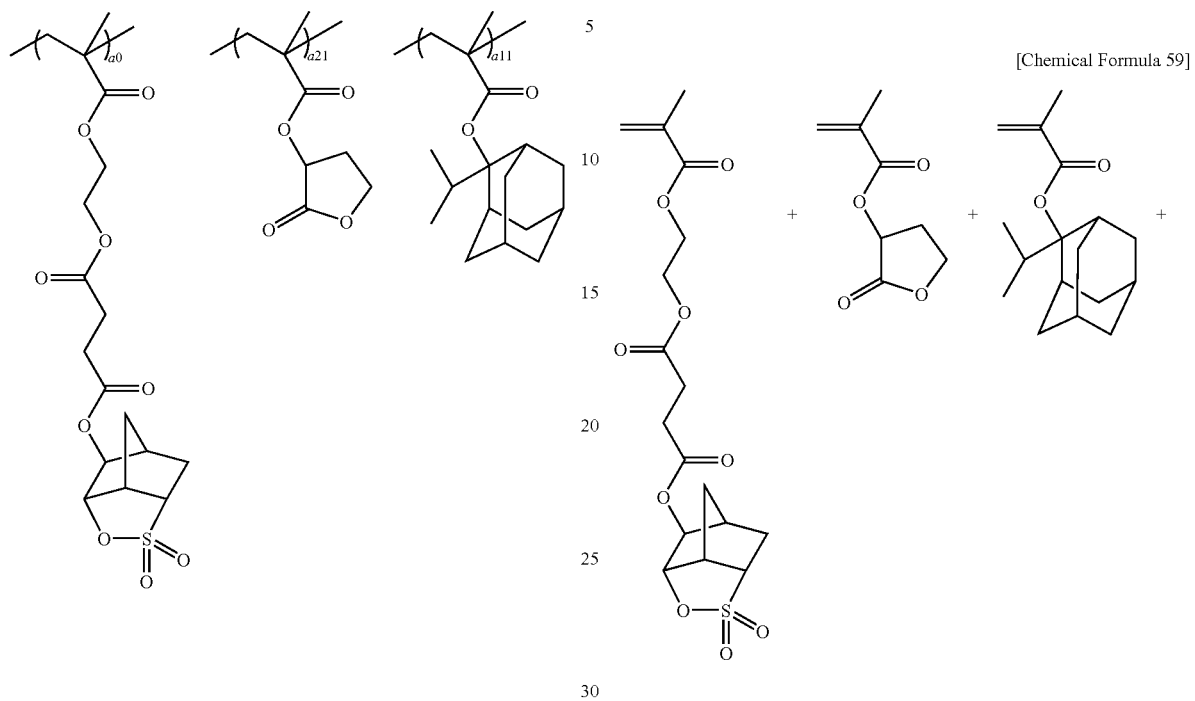
Polymeric compound 3
[Mw: 7,800, Mw/Mn: 1.66, a0/a21/a11/a14/a3 = 21.3/39.2/19.8/12.1/7.6]
Polymer Synthesis Example 4
[Chemical Formula 59]
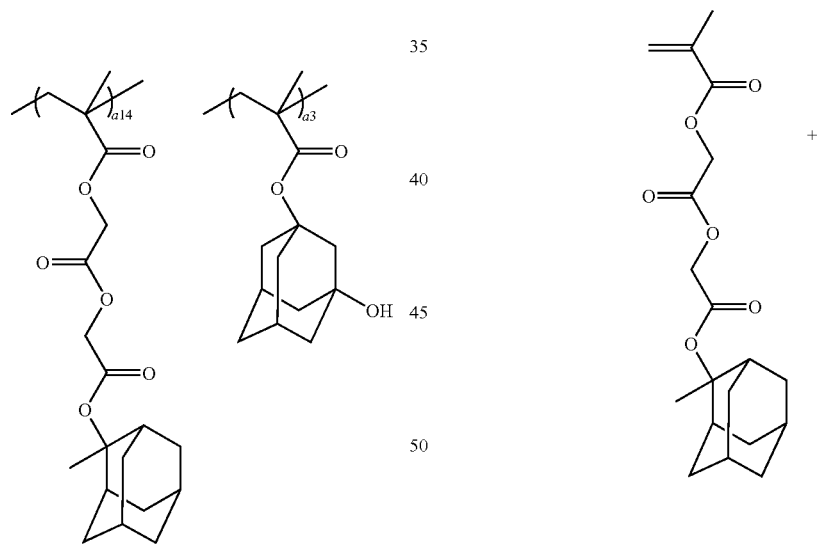
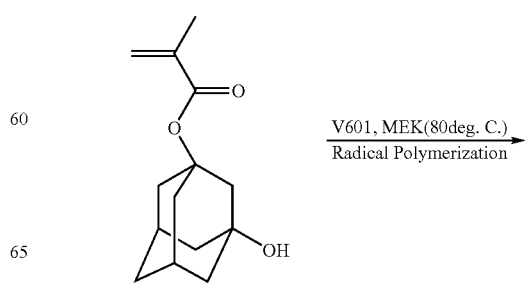
V601, MEK(80deg. C.)
Radical Polymerization 113
-continued
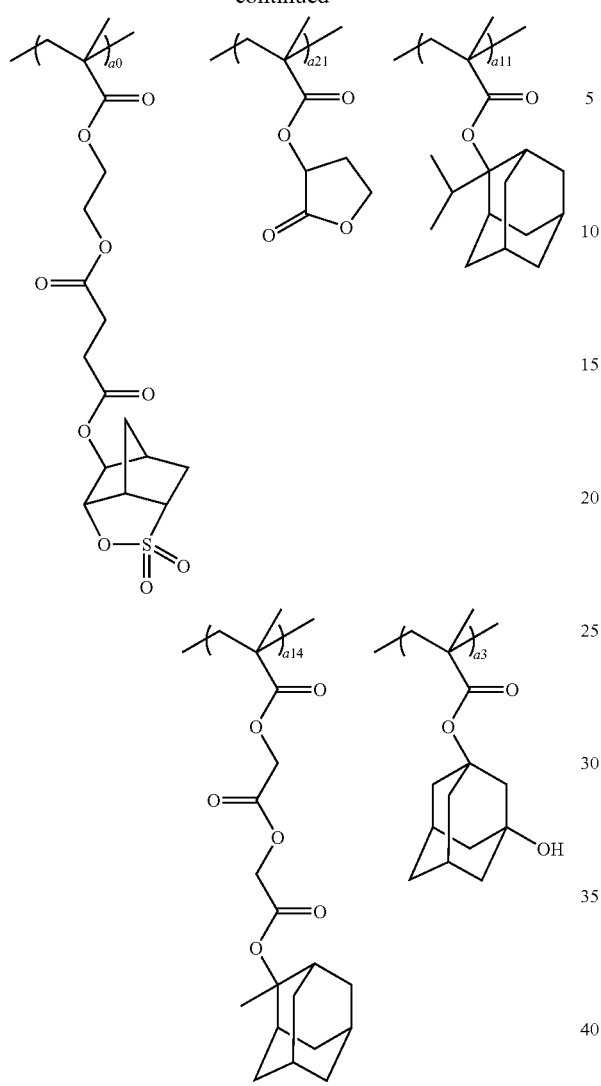
Polymeric compound 4
[Mw: 6,000, Mw/Mn: 1.61, a0/a21/a11/a14/a3 = 20.0/26.8/22.1/11.5/19.6]
Polymer Synthesis Example 5
[Chemical Formula 60]
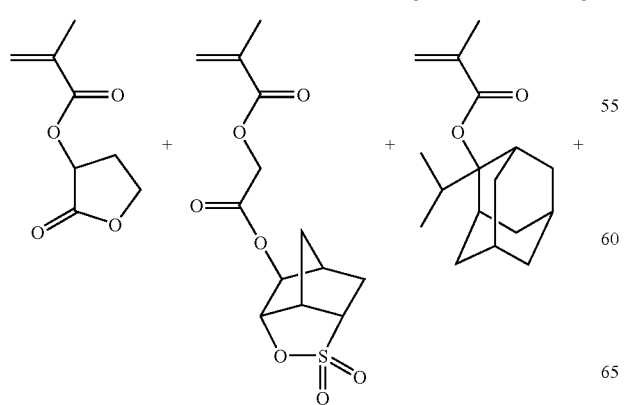
114
-continued
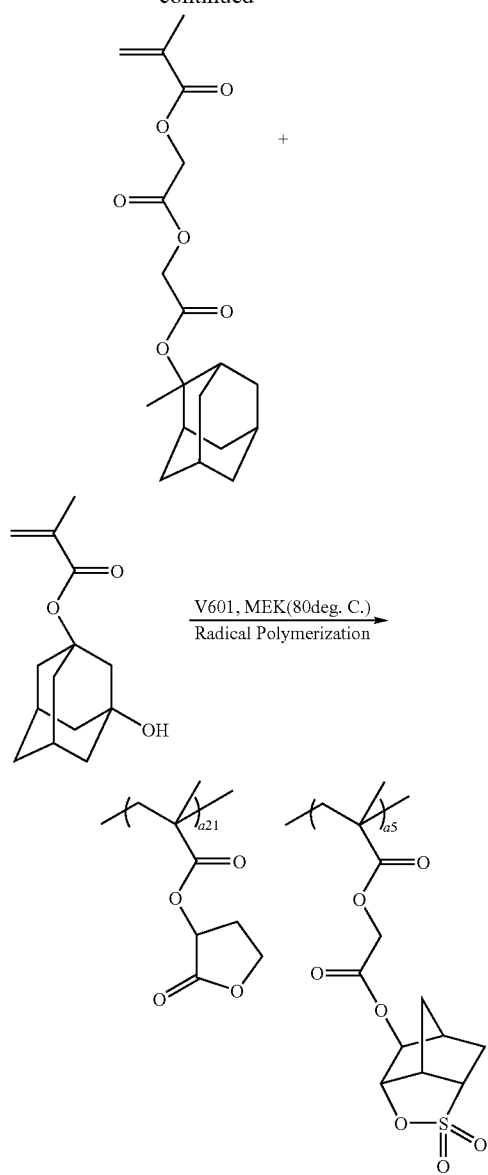
V601, MEK(80deg. C.)
Radical Polymerization
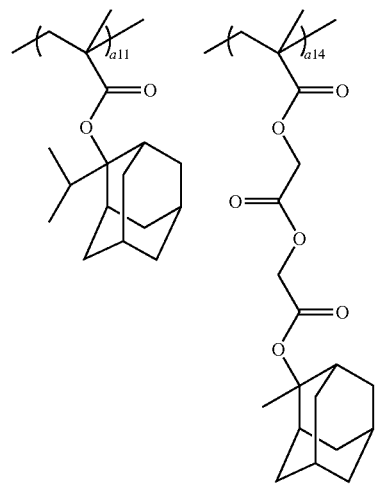

115
-continued
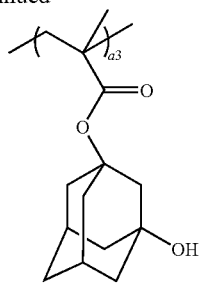
Polymeric compound 5
[Mw: 6,200, Mw/Mn: 1.60, a21/a5/a11/a14/a3 = 26.8/20.0/22.1/11.5/19.6]
Polymer Synthesis Example 6
[Chemical Formula 61]
116
-continued
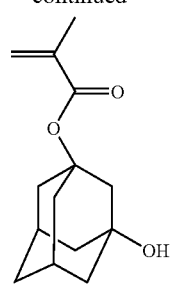 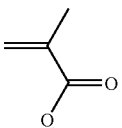 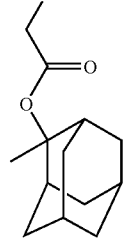 → V601, MEK(80deg. C.) Radical Polymerization
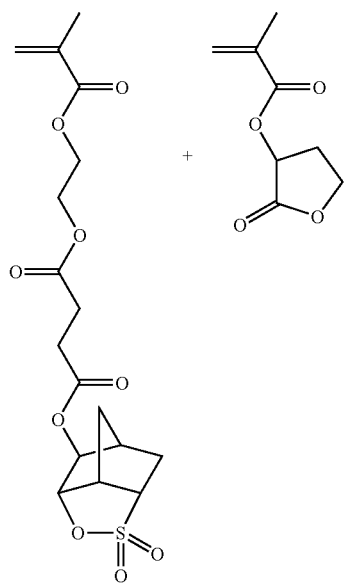  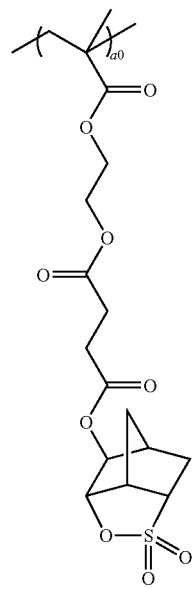 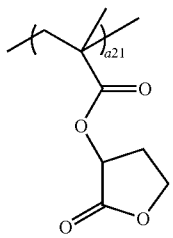
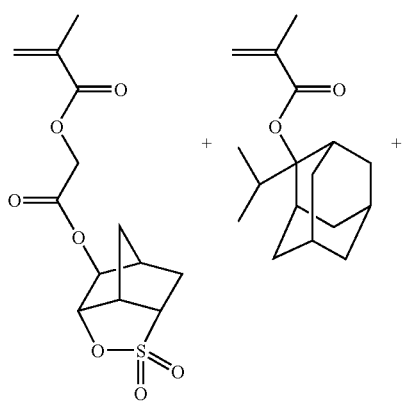  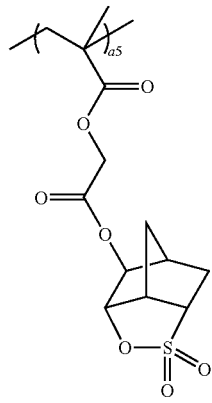 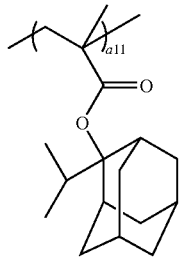

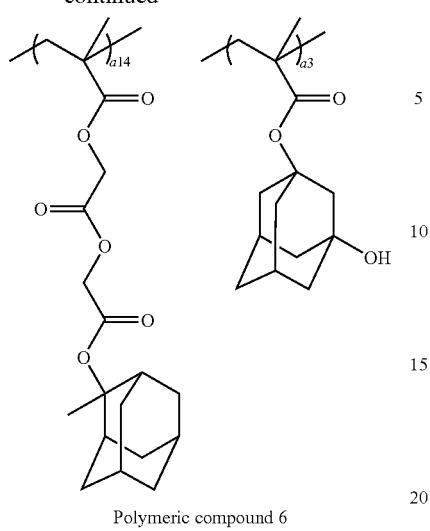
Polymeric compound 6
[Mw: 6,800, Mw/Mn: 1.68, a0/a21/a5/a11/a14/a3 = 19.5/17.4/14.8/23.1/10.7/14.5]
Polymer Synthesis Example 7
[Chemical Formula 62]
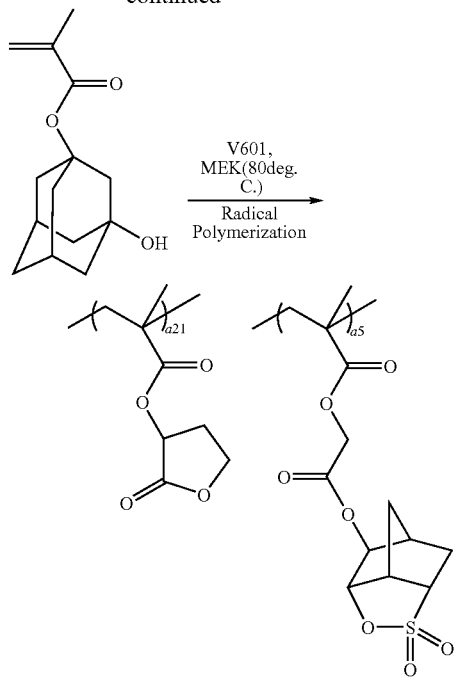
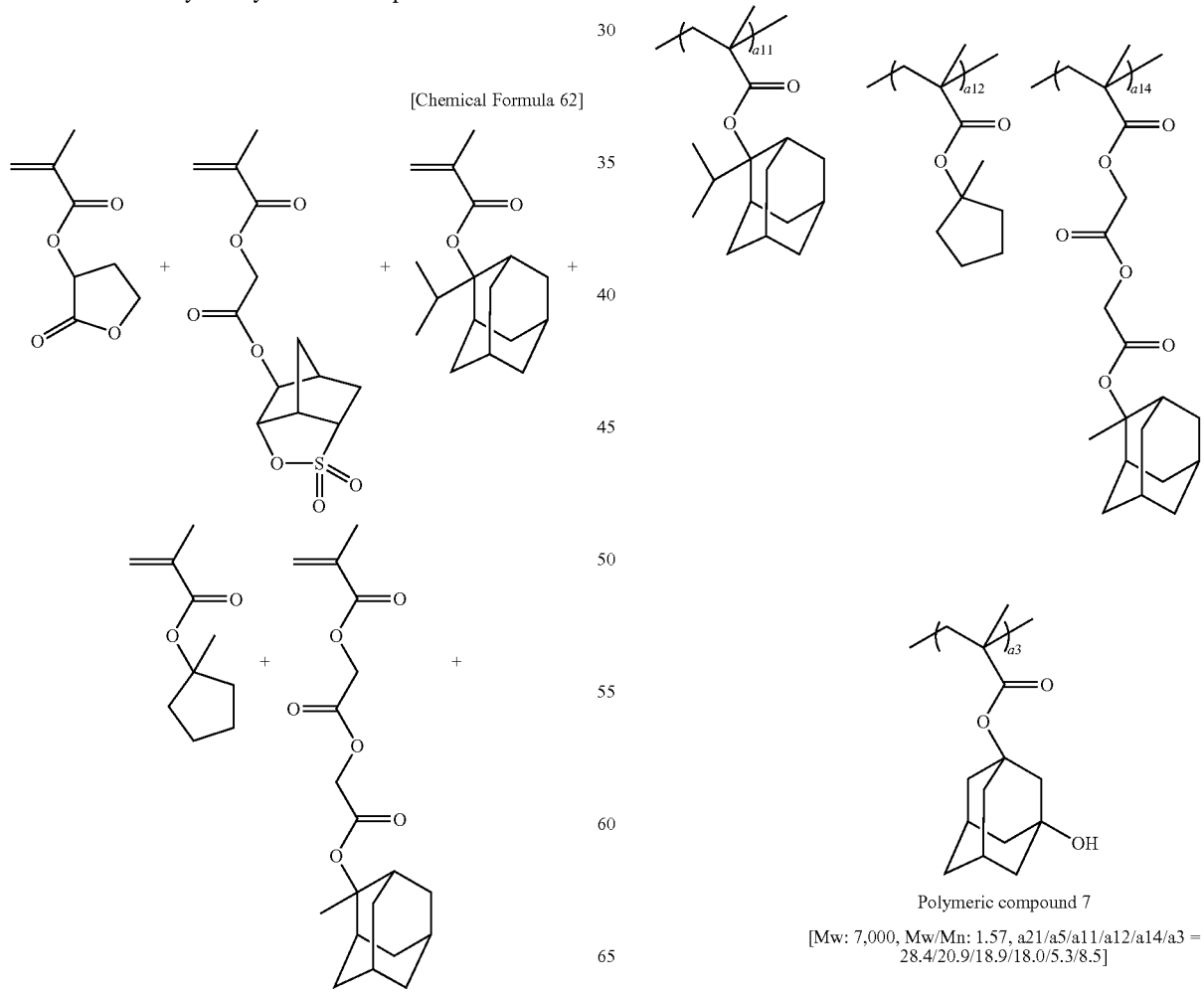
Polymeric compound 7
[Mw: 7,000, Mw/Mn: 1.57, a21/a5/a11/a12/a14/a3 = 28.4/20.9/18.9/18.0/5.3/8.5]

Polymer Synthesis Example 8
[Chemical formula 63]
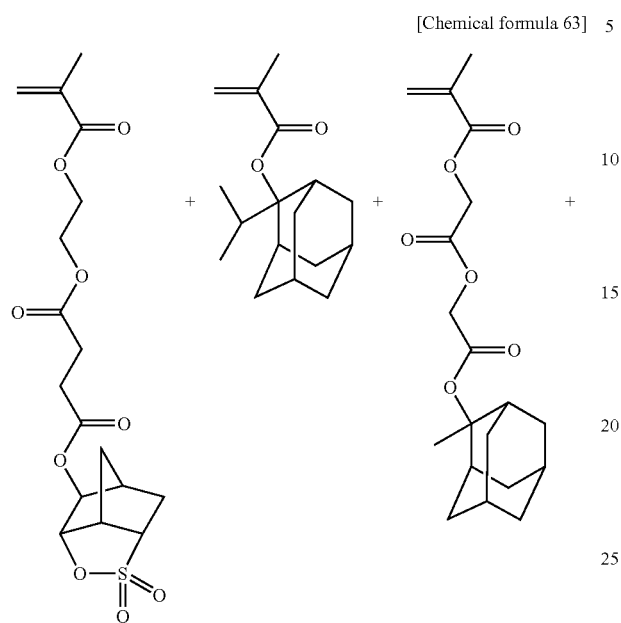
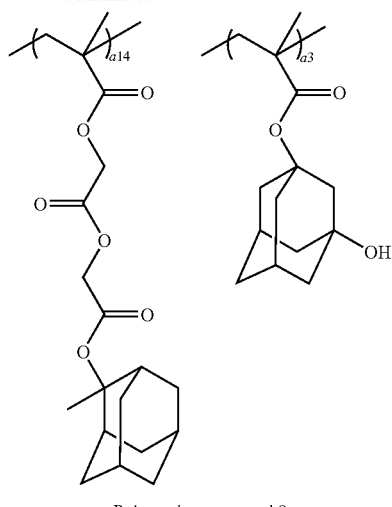
Polymeric compound 8
[Mw: 6,700, Mw/Mn: 1.50, a0/a11/a14/a3 = 30.2/43.7/6.3/19.8]
Polymer Synthesis Example 9
[Chemical Formula 64]
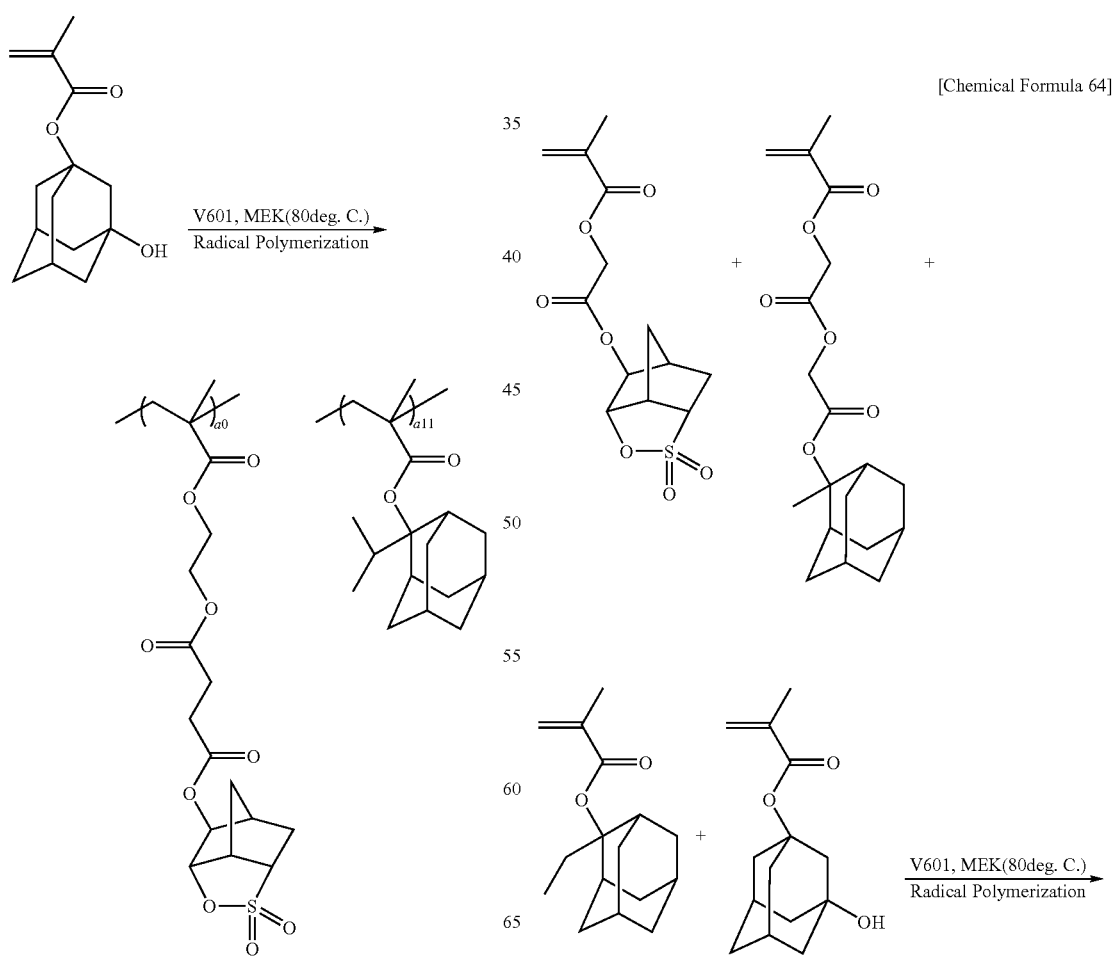

-continued
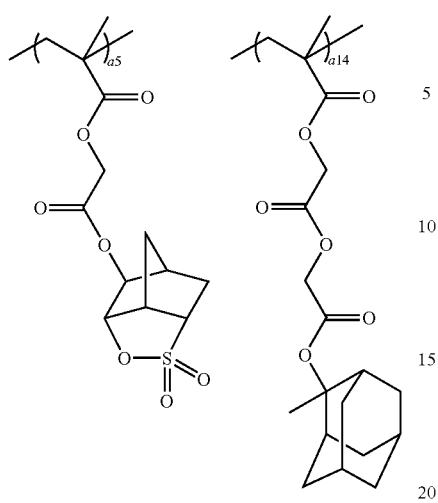
Polymeric compound 9
[Mw: 7,700, Mw/Mn: 1.54, a5/a14/a15/a3 = 34.4/11.3/40.7/13.6]
Polymer Synthesis Example 10
[Chemical Formula 65]
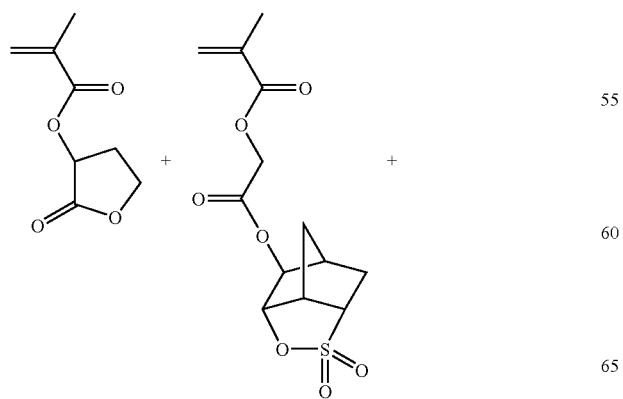
-continued
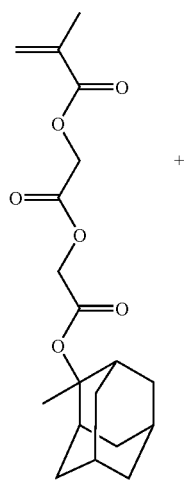
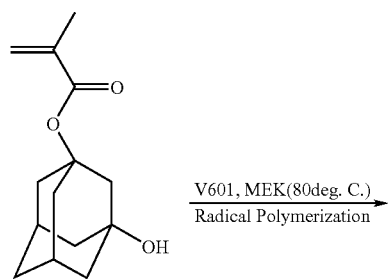
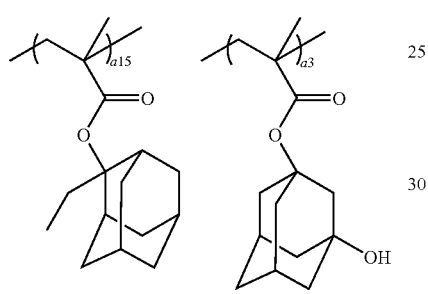

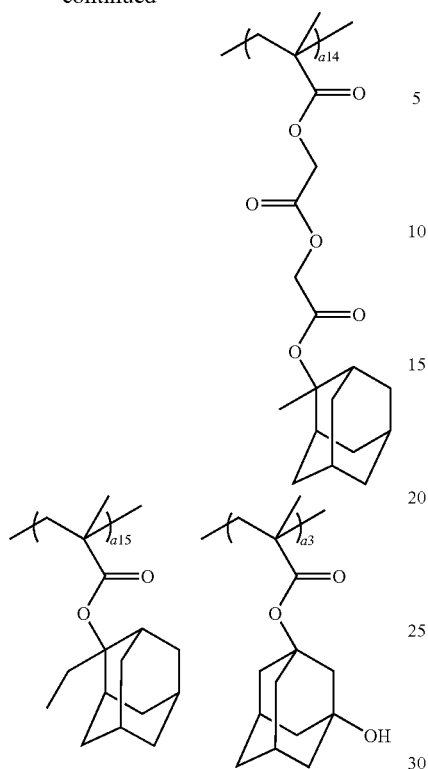
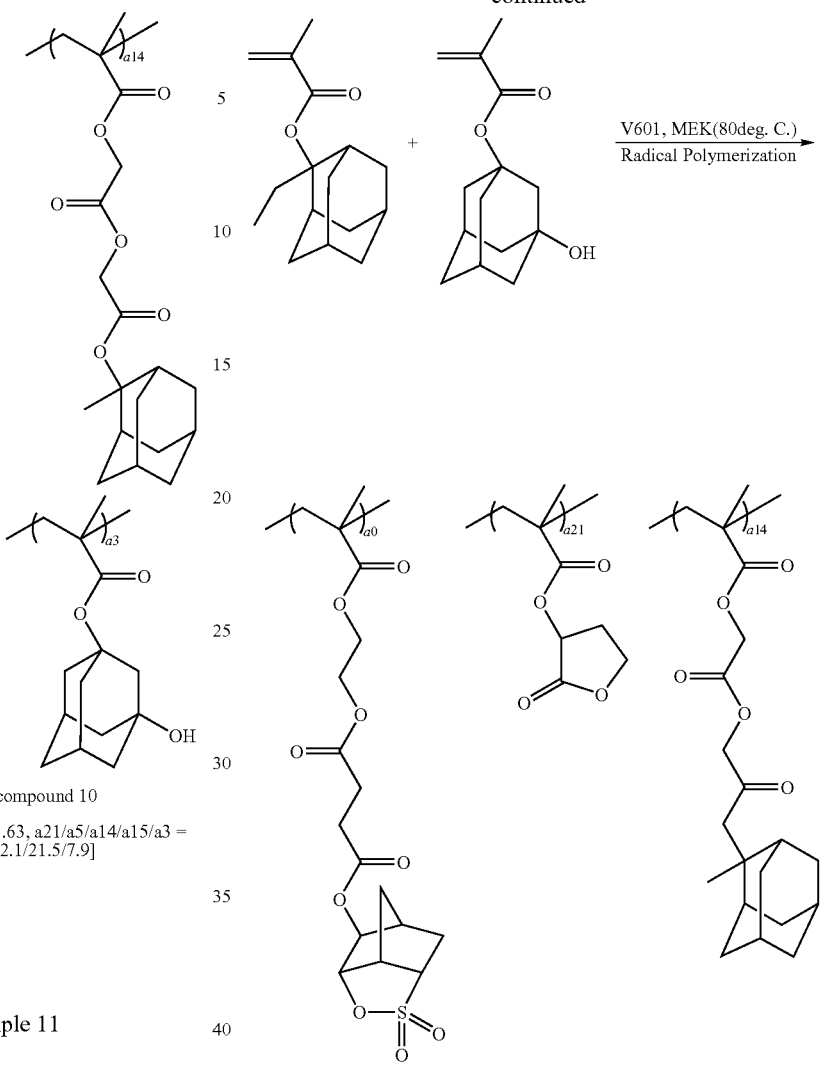
Polymeric compound 10
[Mw: 7,400, Mw/Mn: 1.63, a21/a5/a14/a15/a3 = 35.2/23.3/12.1/21.5/7.9]
Polymer Synthesis Example 11
[Chemical Formula 66]
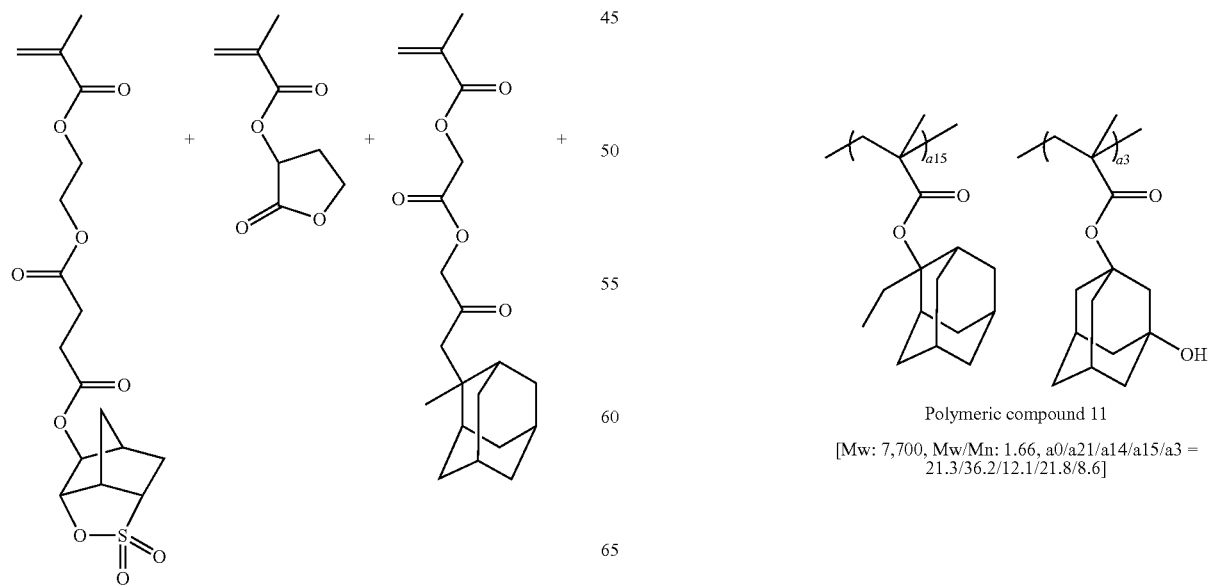
Polymeric compound 11
[Mw: 7,700, Mw/Mn: 1.66, a0/a21/a14/a15/a3 = 21.3/36.2/12.1/21.8/8.6]

Polymer Synthesis Example 12
[Chemical Formula 67]
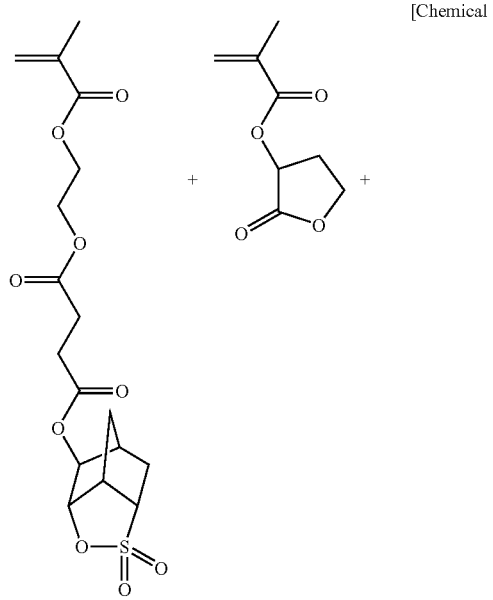
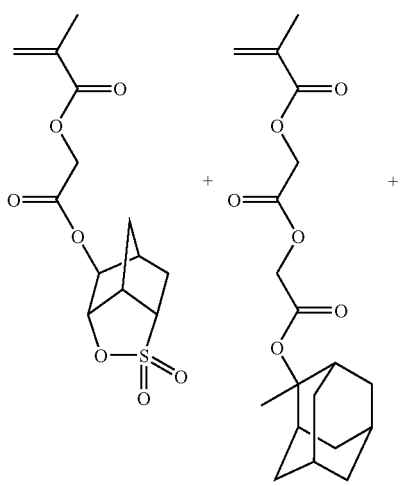
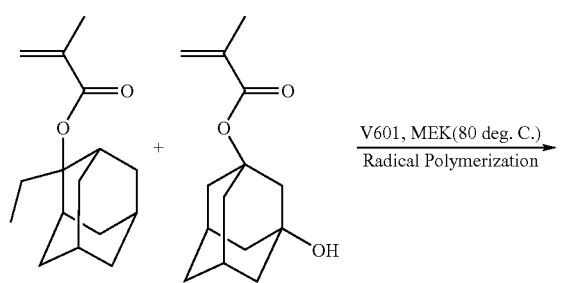
V601, MEK(80 deg. C.)
Radical Polymerization →
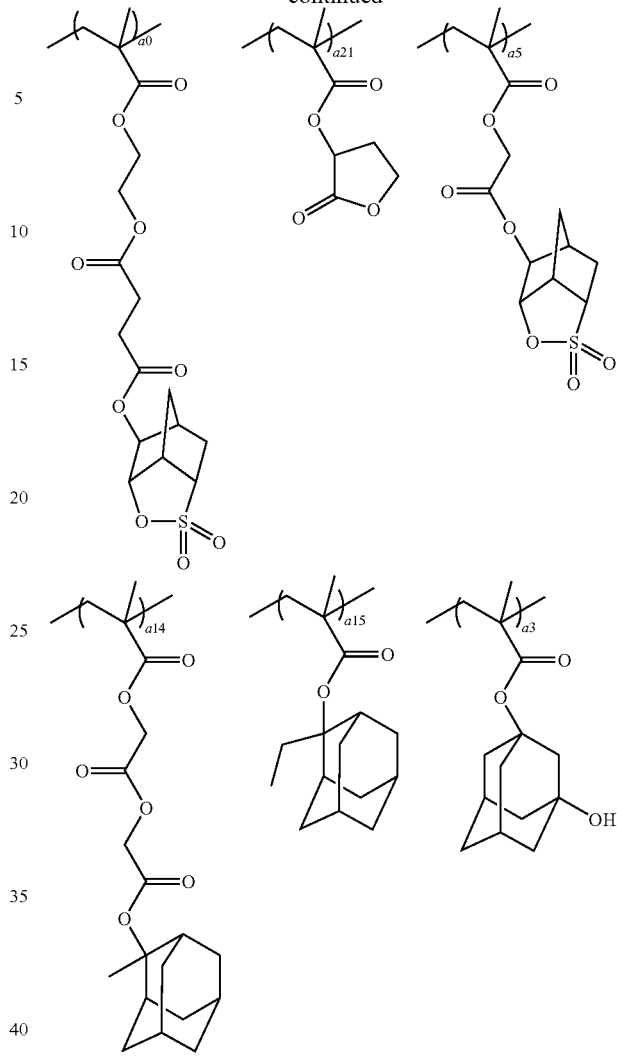
Polymeric compound 12
[Mw: 7,200, Mw/Mn: 1.64, a0/a21/a5/a14/a15/a3 = 18.5/17.4/14.8/10.7/24.1/14.5]
Polymer Synthesis Example 13
[Chemical Formula 68]
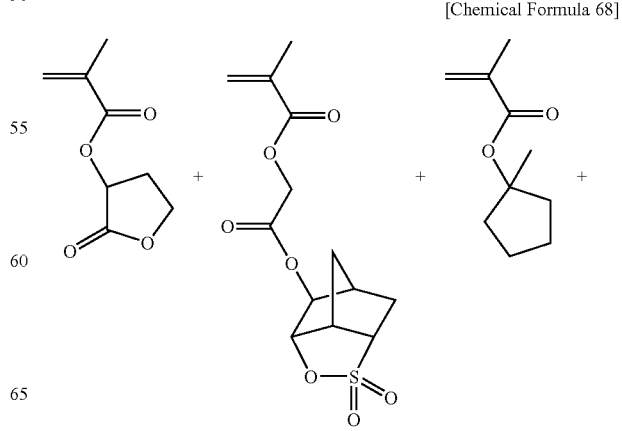

127
-continued
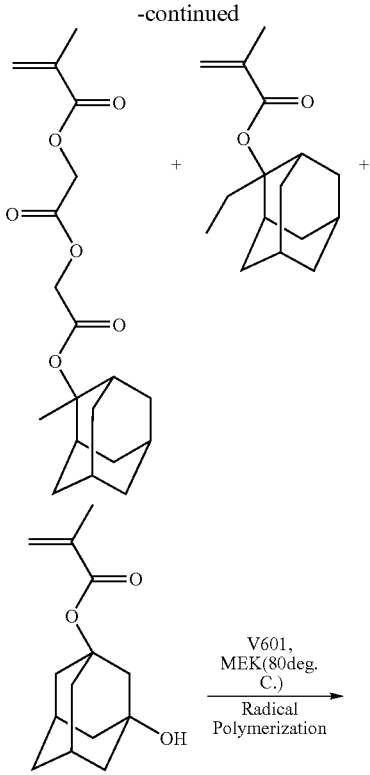
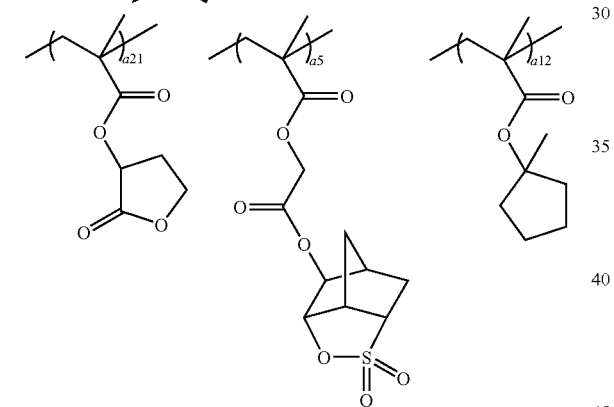
Polymeric compound 13
[Mw: 7,400, Mw/Mn: 1.61, a21/a5/a12/a14/a15/a3 = 28.4/20.9/14.0/7.3/19.9/9.5]
128
Polymer Synthesis Example 14
[Chemical Formula 69]
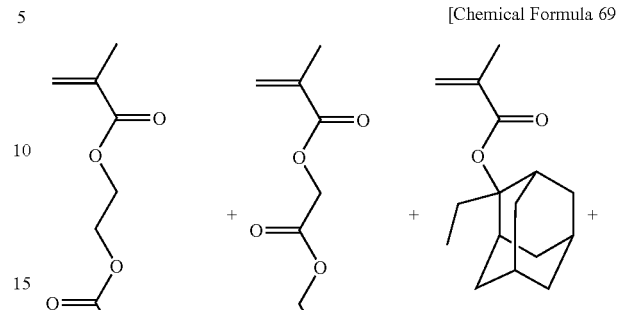
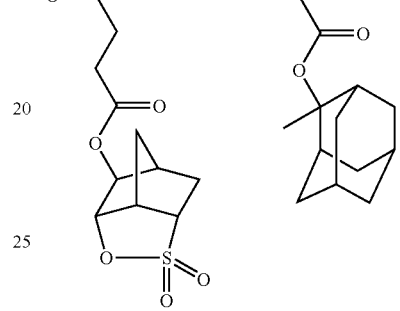
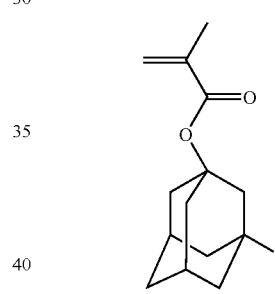
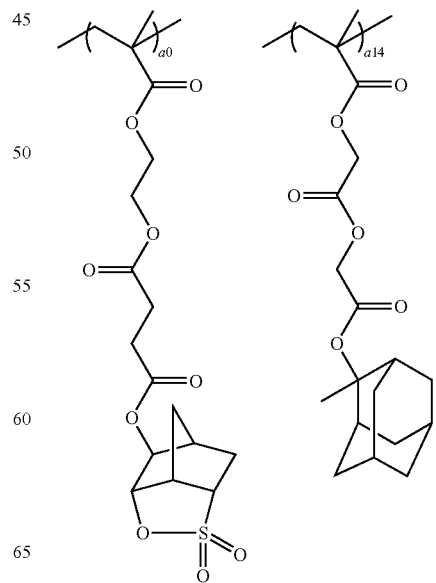

-continued
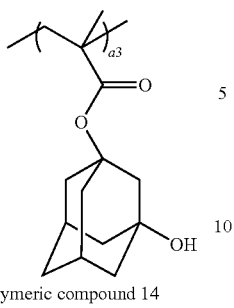
Polymeric compound 14
[Mw: 7,700, Mw/Mn: 1.59, a0/a14/a15/a3 = 25.2/8.3/44.7/21.8]
-continued
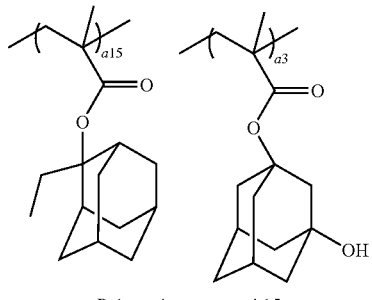
Polymeric compound 15
[Mw: 7,400, Mw/Mn: 1.68, a5/a11/a14/a15/a3 = 35.1/23.1/8.9/23.2/9.7]
Polymer Synthesis Example 15
[Chemical Formula 70]
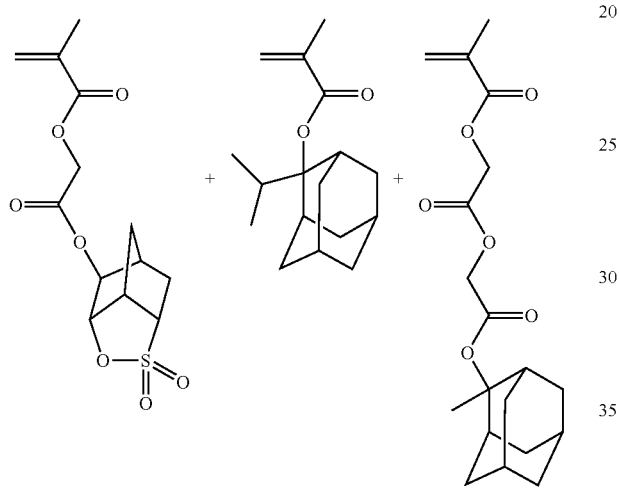
Polymer Synthesis Example 16
[Chemical Formula 71]
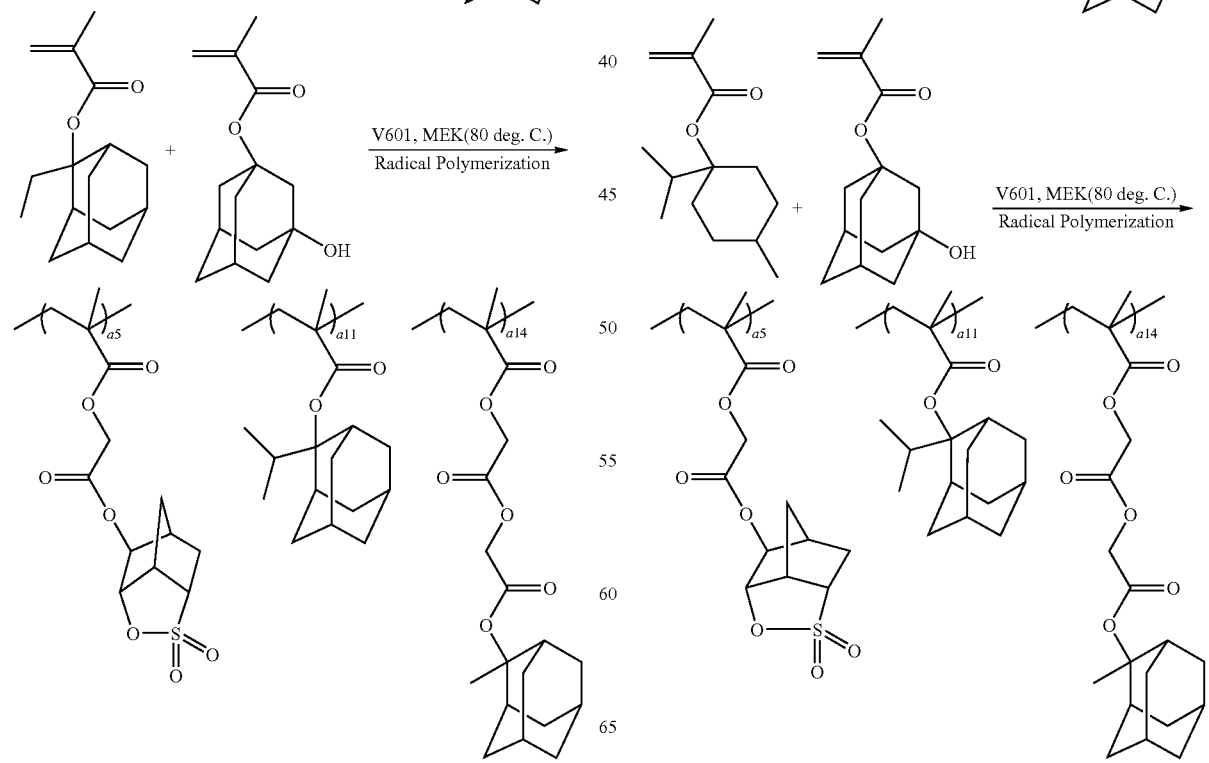

131
-continued
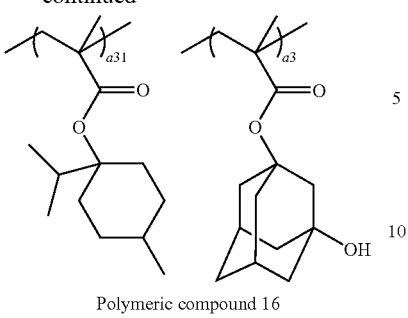
Polymeric compound 16
[Mw: 9,000, Mw/Mn: 1.71, a5/a11/a14/a31/a3 = 34.3/24.1/9.7/19.5/12.4]
132
-continued
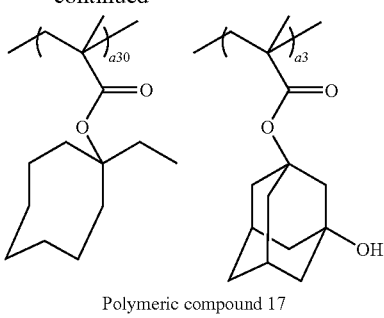
Polymeric compound 17
[Mw: 9,000, Mw/Mn: 1.70, a5/a11/a14/a30/a3 = 36.8/21.3/7.3/25.6/9.0]
Polymer Synthesis Example 17
[Chemical Formula 72]
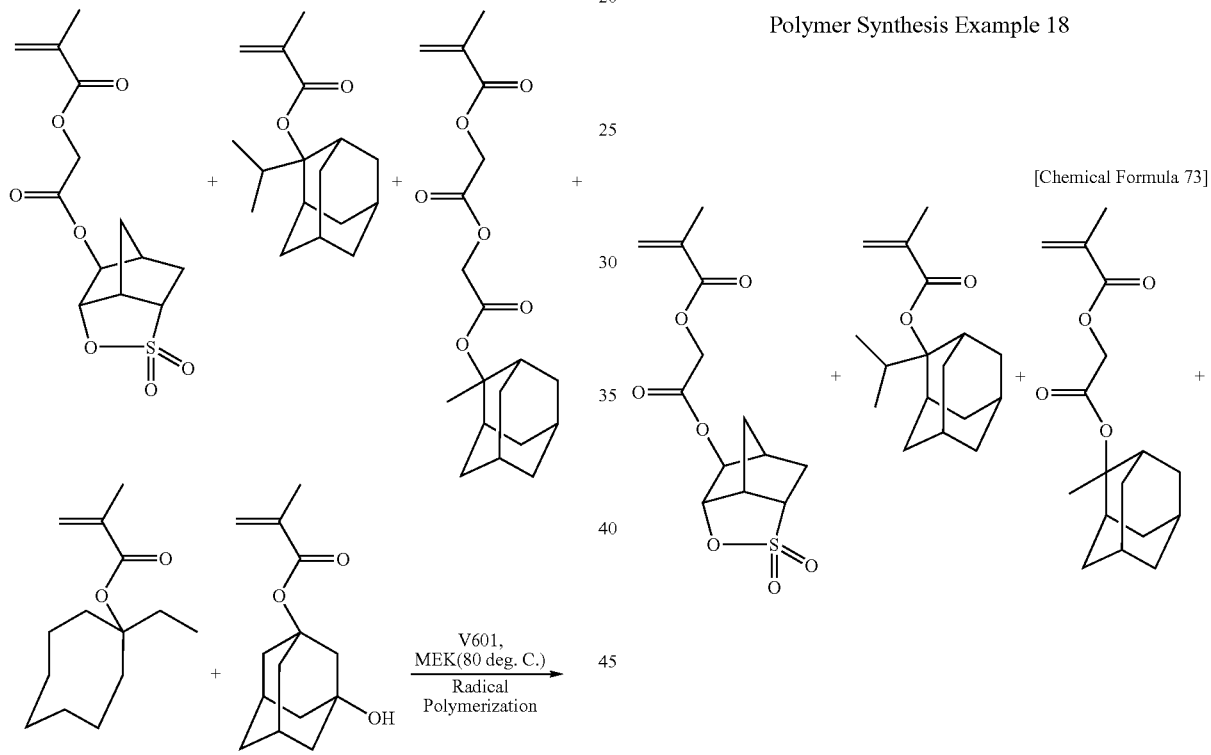
Polymer Synthesis Example 18
[Chemical Formula 73]
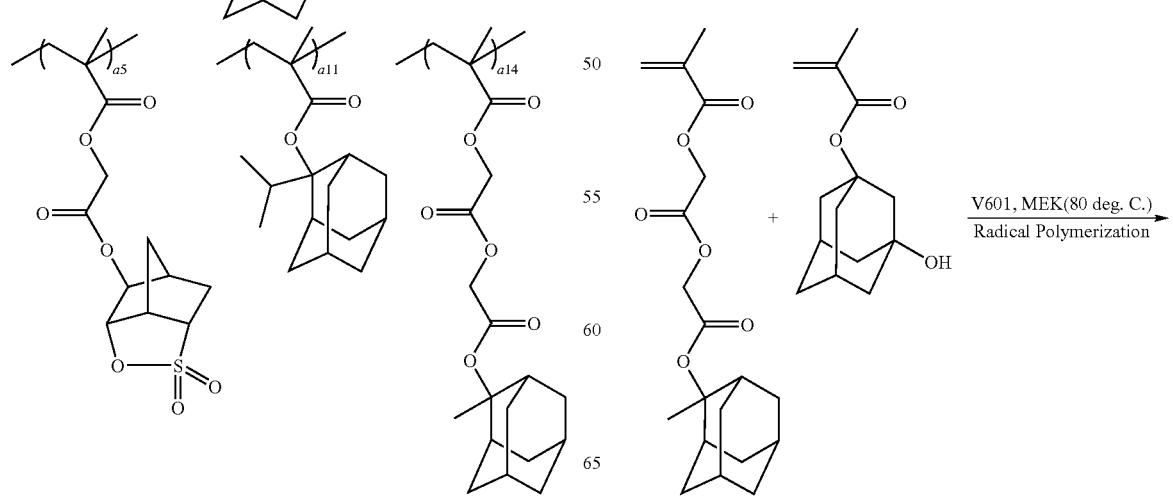

133
-continued
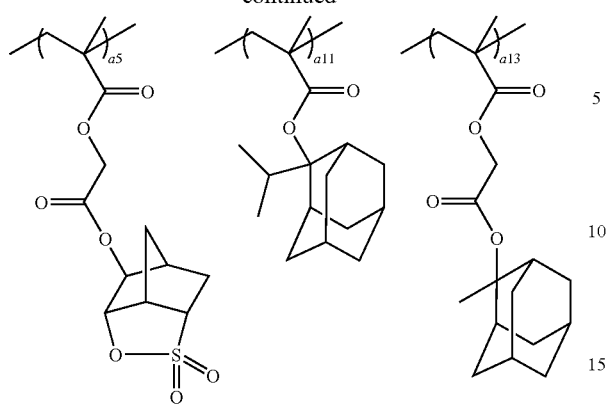
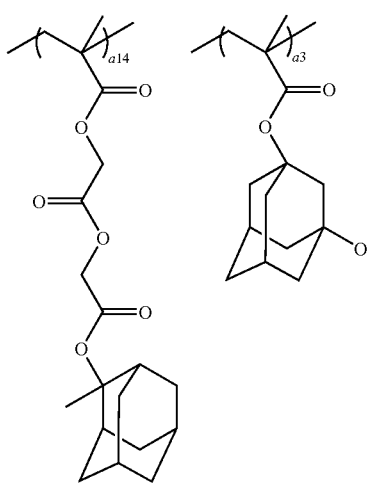
Polymeric compound 18
[Mw: 9,000, Mw/Mn: 1.70, a5/a11/a13/a14/a3 = 38.8/24.3/11.6/7.3/18.0]
Polymer Synthesis Example 19
[Chemical Formula 74]
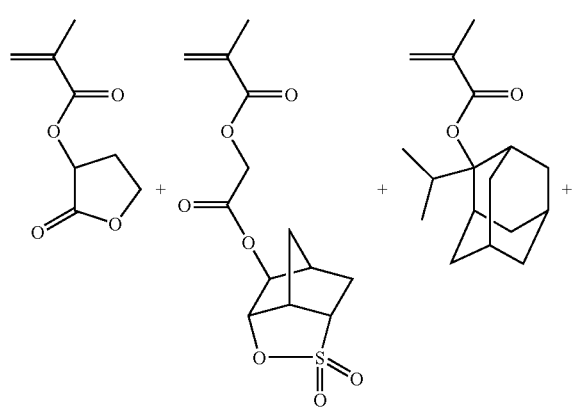
134
-continued
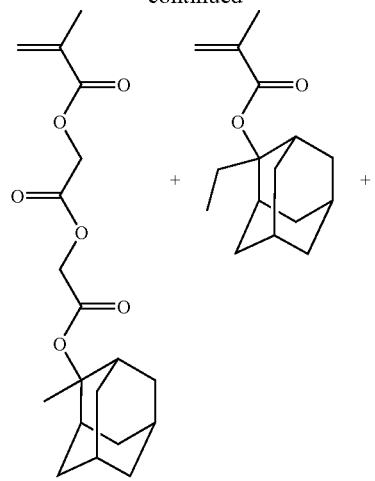
$\xrightarrow{\text{V601, MEK(80 deg. C.)}}{\text{Radical Polymerization}}$
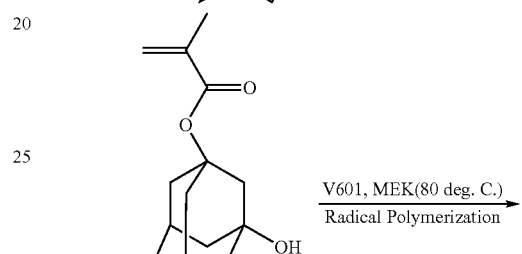
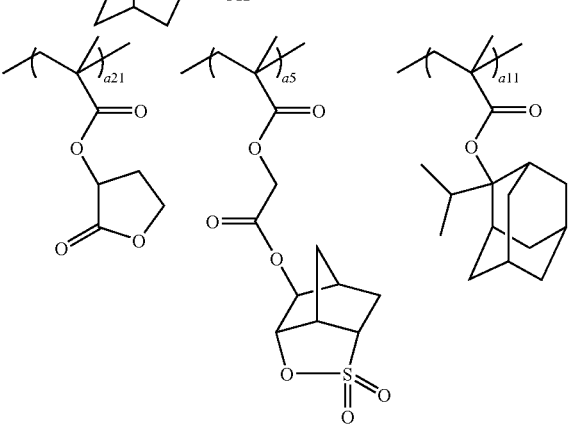
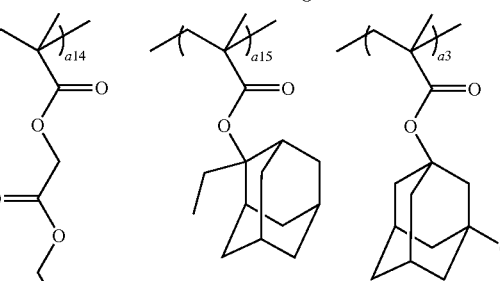
Polymeric compound 19
[Mw: 7,800, Mw/Mn: 1.68, a21/a5/a11/a14/a15/a3 = 17.8/17.3/21.1/8.9/24.2/10.7]

Polymer Synthesis Example 20
[Chemical Formula 75]
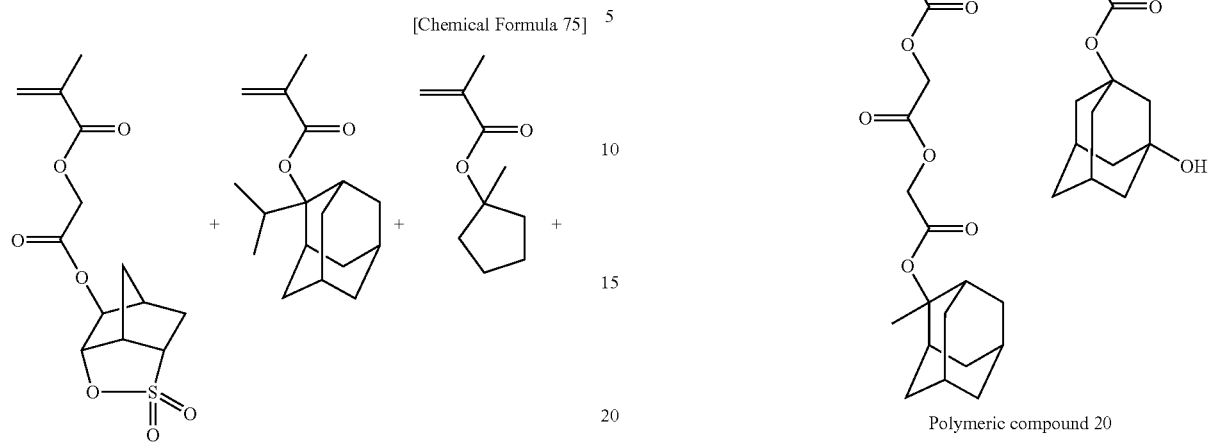
Polymeric compound 20
[Mw: 7,400, Mw/Mn: 1.68, a5/a11/a12/a14/a3 = 35.1/23.1/21.2/8.9/11.7]
Polymer Synthesis Example 21
[Chemical Formula 76]
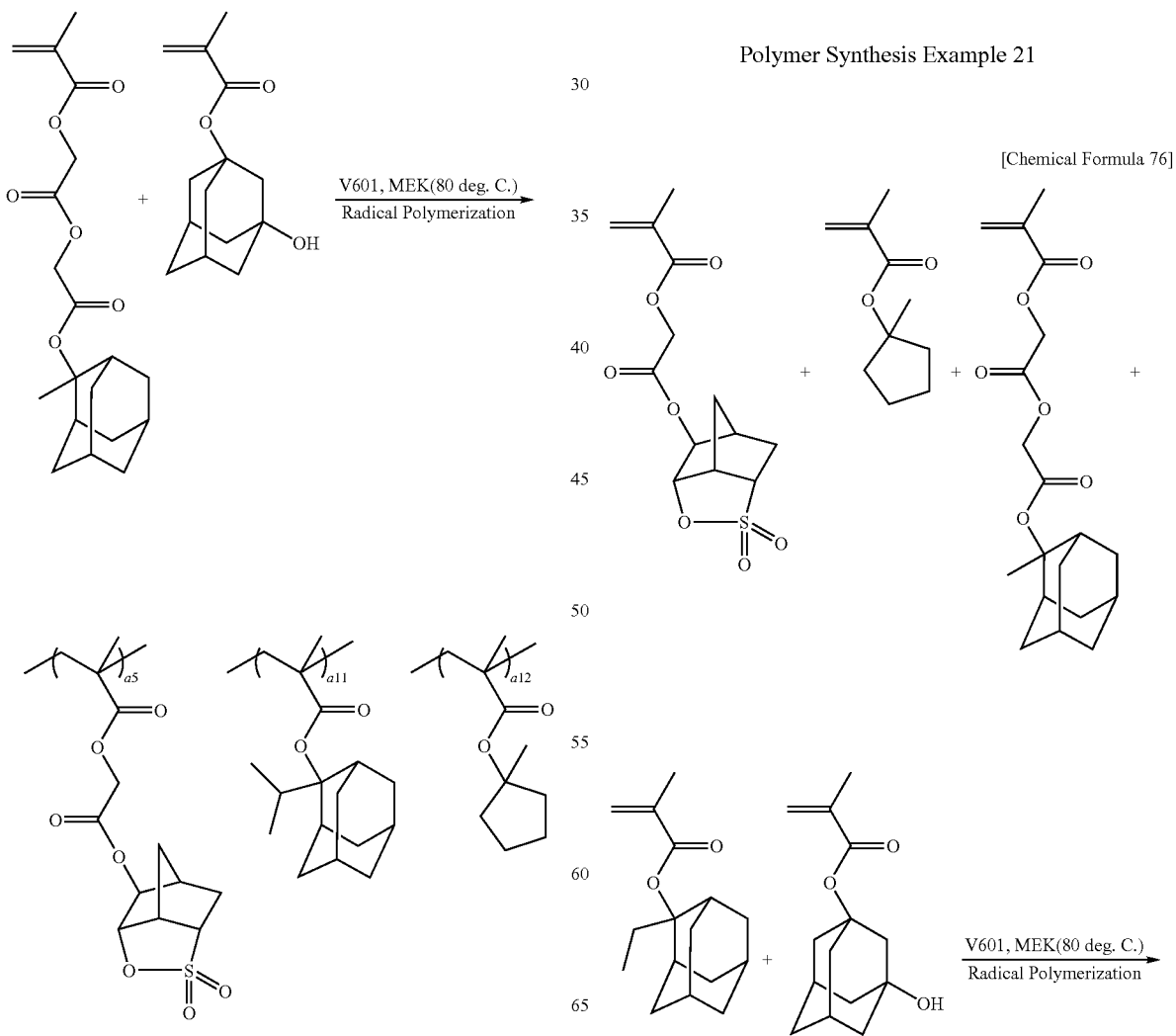

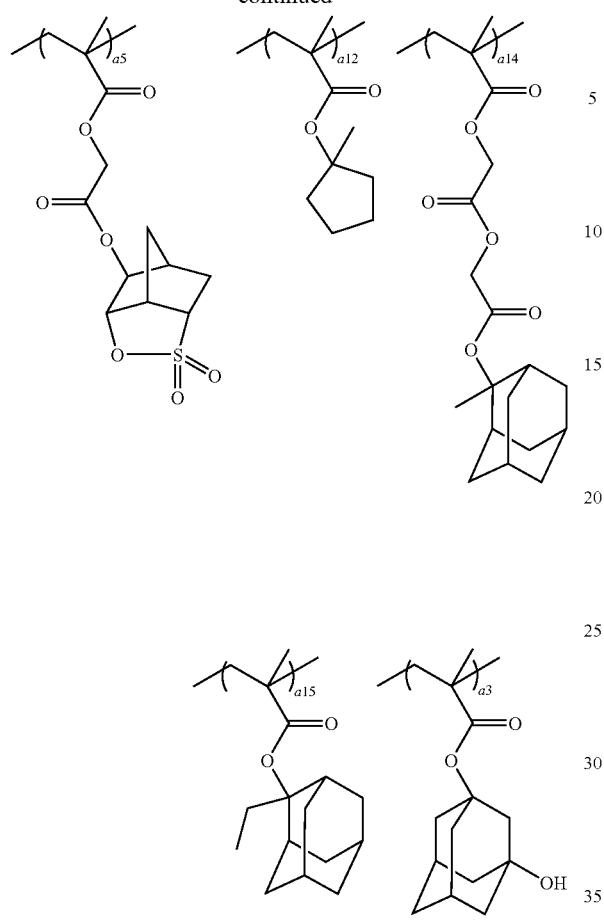
Polymeric compound 21
[Mw: 7,400, Mw/Mn: 1.68, a5/a12/a14/a15/a3 = 35.1/21.2/8.9/23.1/11.7]
Polymer Synthesis Example 22
[Chemical Formula 77]
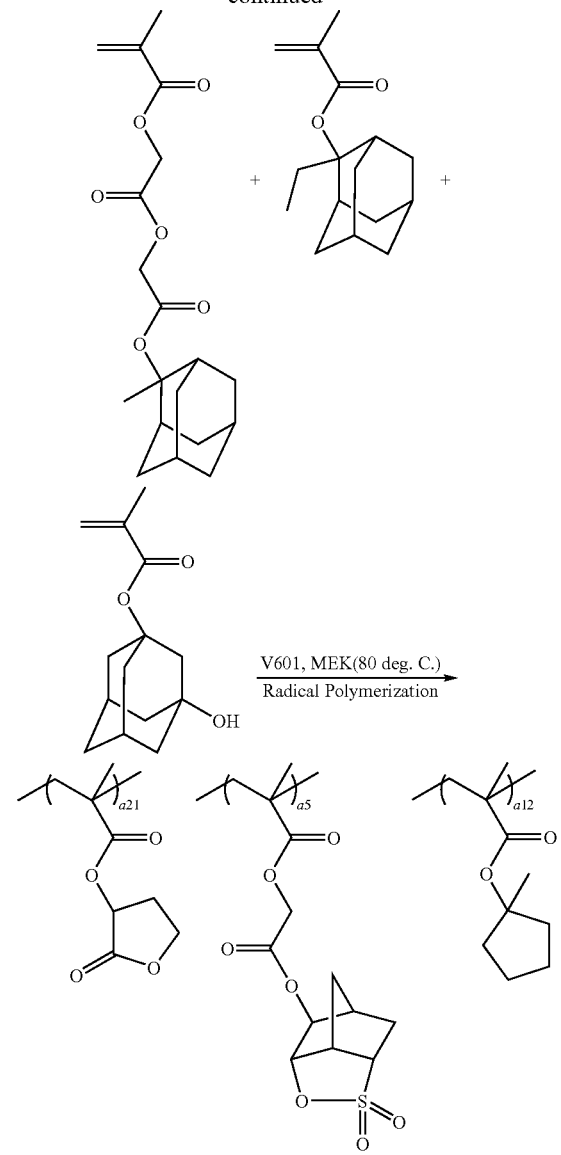
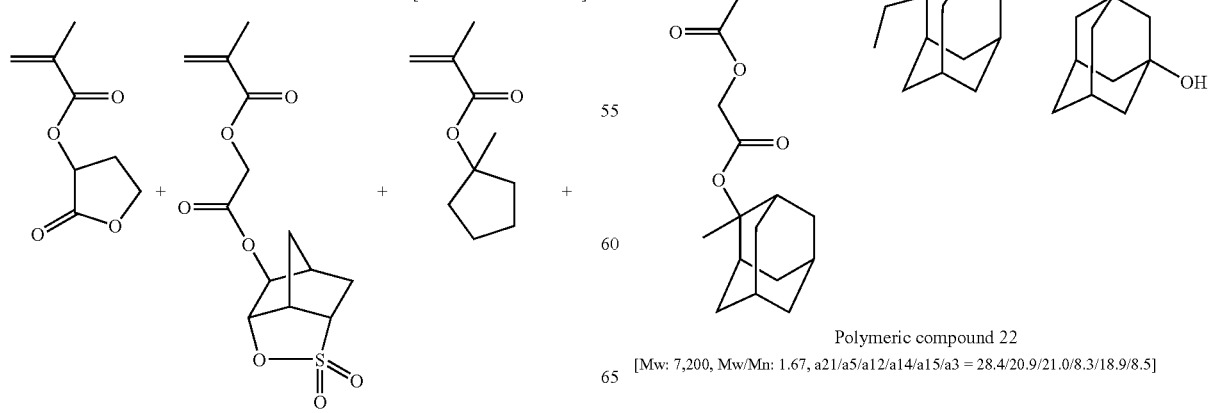
Polymeric compound 22
[Mw: 7,200, Mw/Mn: 1.67, a21/a5/a12/a14/a15/a3 = 28.4/20.9/21.0/8.3/18.9/8.5]

Polymer Synthesis Example 23
[Chemical Formula 78]
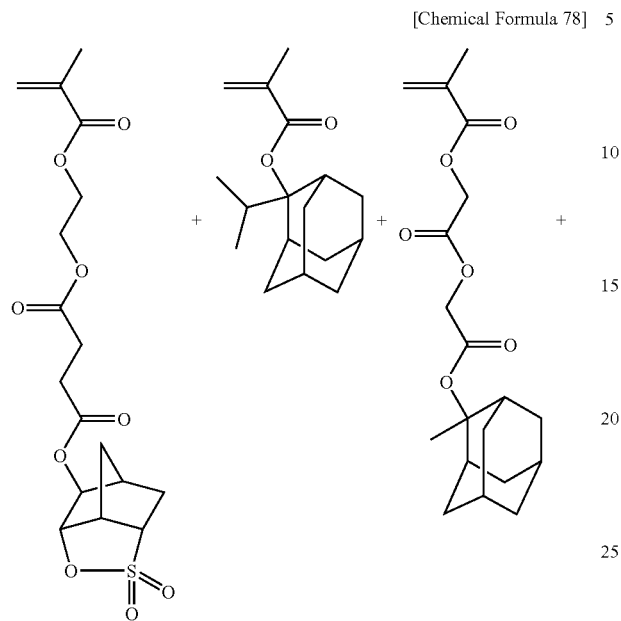
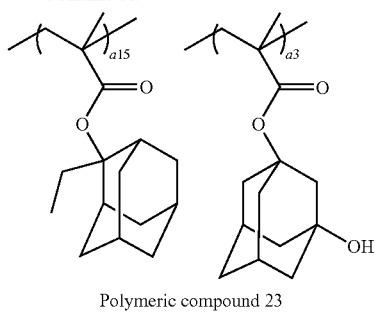
Polymeric compound 23
[Mw: 7,400, Mw/Mn: 1.68, a0/a11/a14/a15/a3 = 30.1/26.1/8.9/25.2/9.7]
Polymer Synthesis Example 24
[Chemical Formula 79]
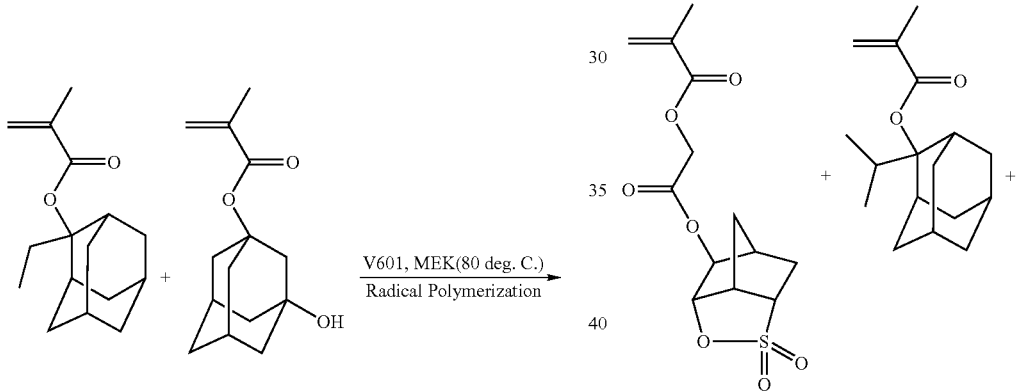
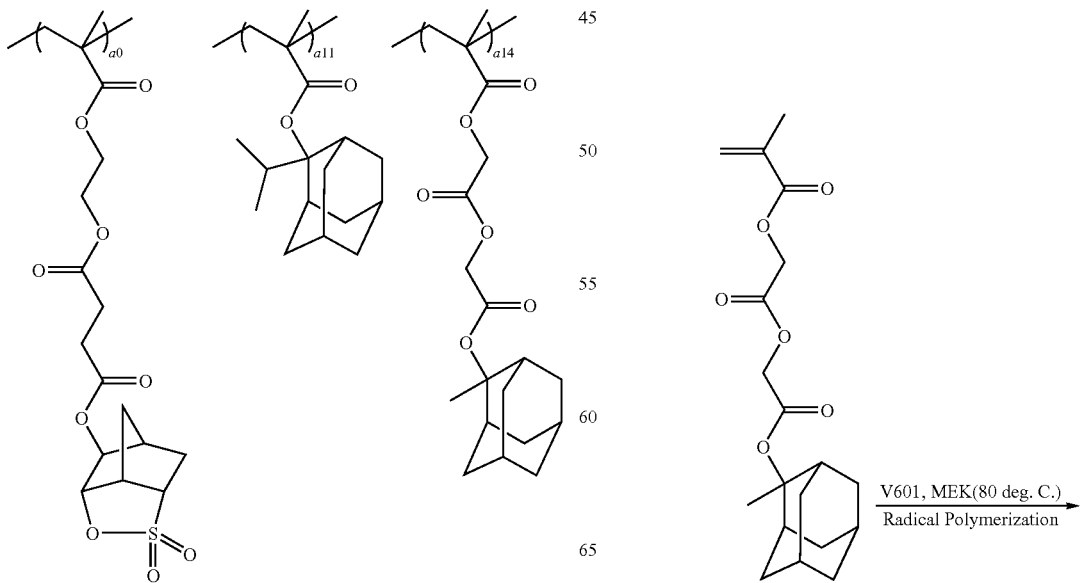

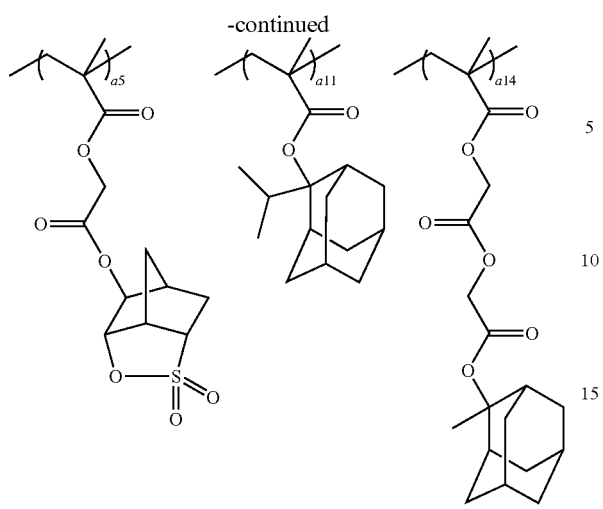
Polymeric compound 24
[Mw: 7,100, Mw/Mn: 1.65, a5/a11/a14/ = 35.9/49.1/15.0]
Polymer Synthesis Example 25
[Chemical Formula 80]
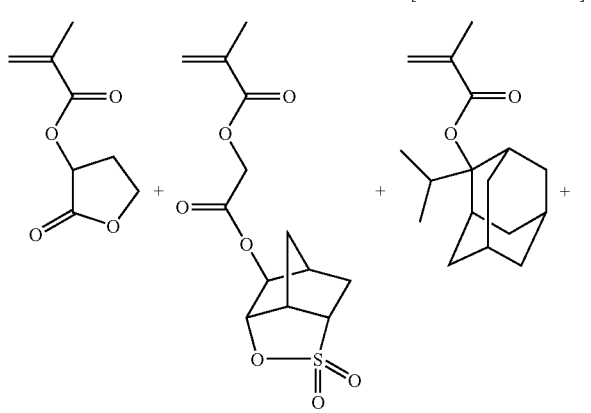
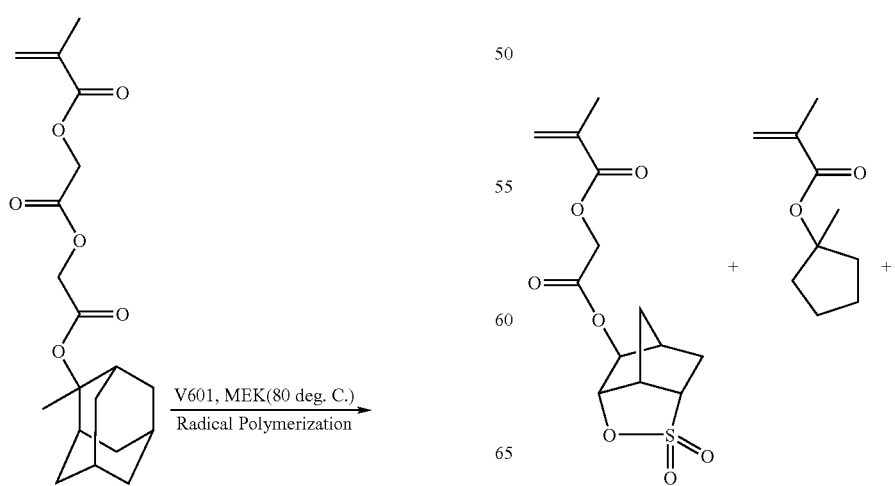
V601, MEK(80 deg. C.)
Radical Polymerization
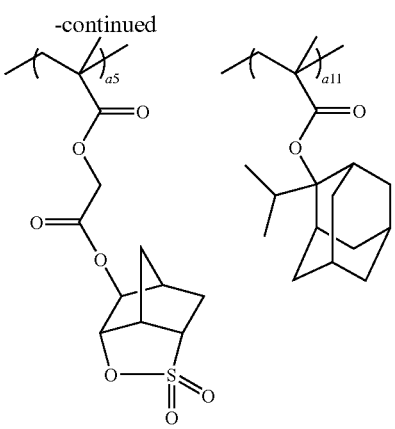
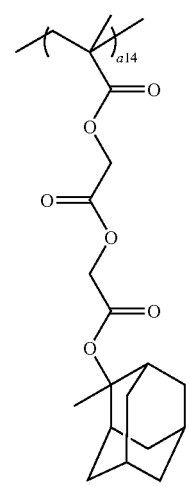
Polymeric compound 25
[Mw: 8,100, Mw/Mn: 1.67, a21/a5/a11/a14/ = 19.5/19.4/48.1/13.0]
Polymer Synthesis Example 26
[Chemical Formula 81]

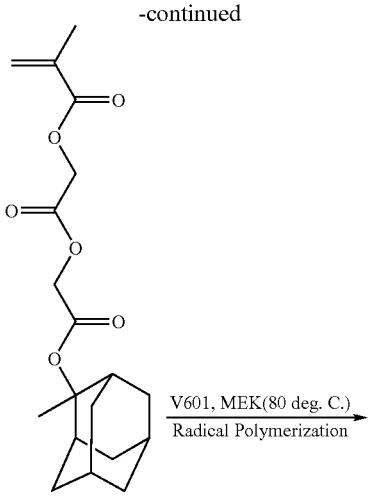
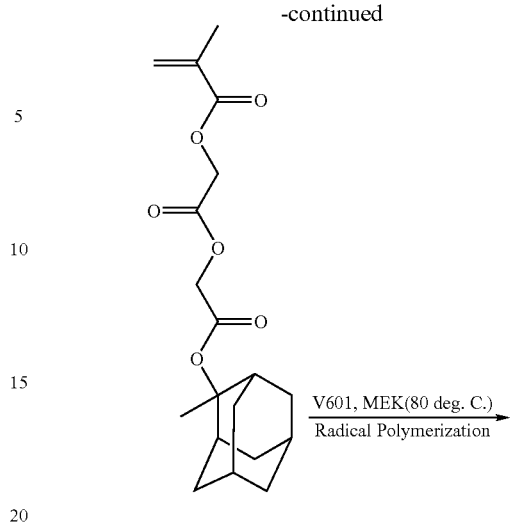
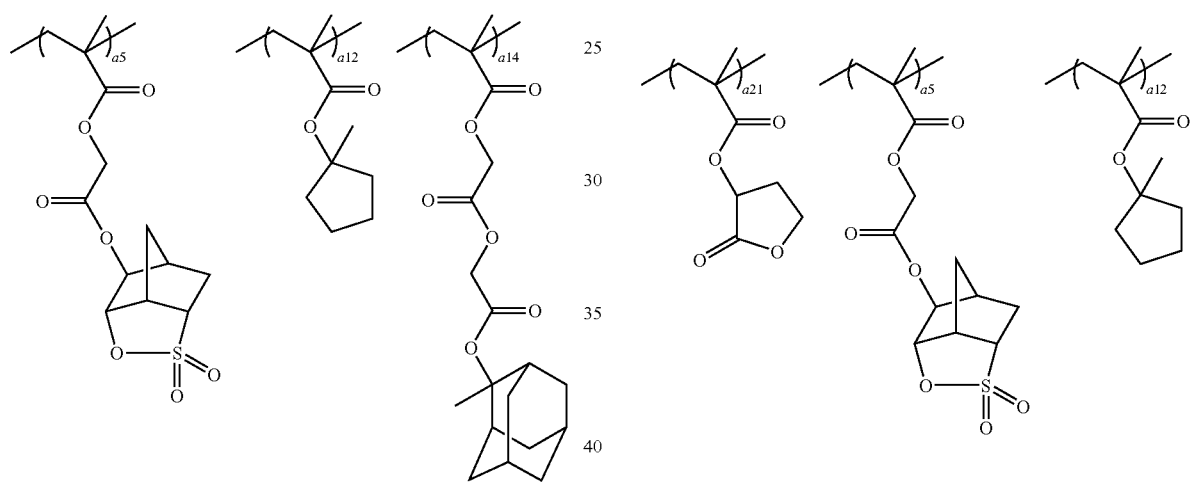
Polymeric compound 26
[Mw: 7,900, Mw/Mn: 1.65, a5/a12/a14/ = 36.9/48.3/14.8]
Polymer Synthesis Example 27
[Chemical Formula 82]
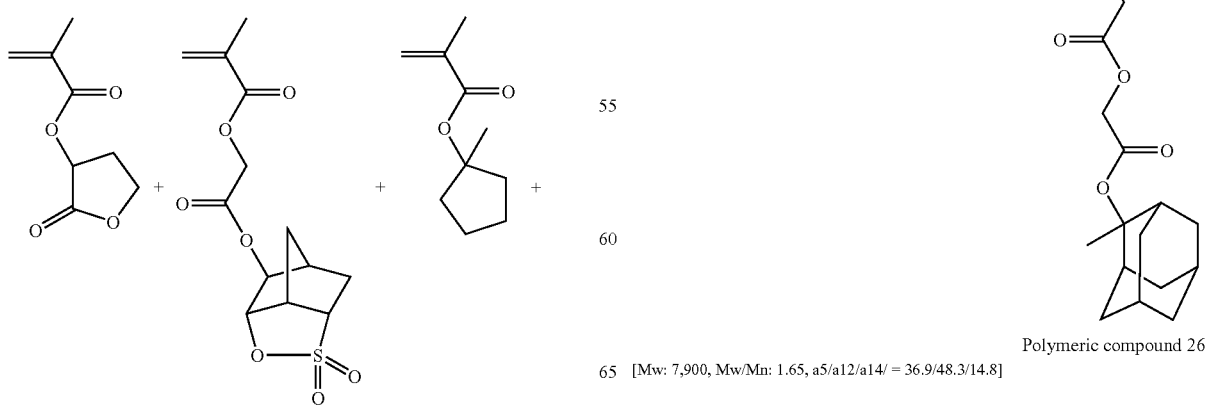
Polymeric compound 26
[Mw: 7,900, Mw/Mn: 1.65, a5/a12/a14/ = 36.9/48.3/14.8]

Polymer Synthesis Example 28
[Chemical Formula 83]
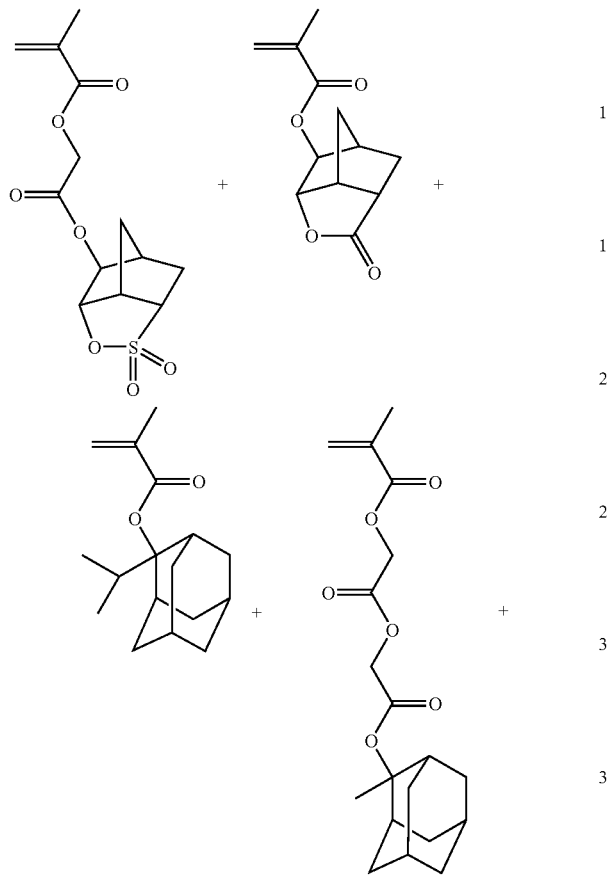
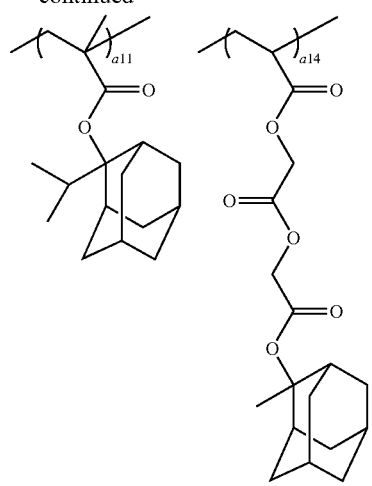
Polymeric compound 28
[Mw: 6,900, Mw/Mn: 1.62, a5/a22/a11/a14/a3 = 26.6/35.2/21.1/10.5/6.6]
Polymer Synthesis Example 29
[Chemical Formula 84]
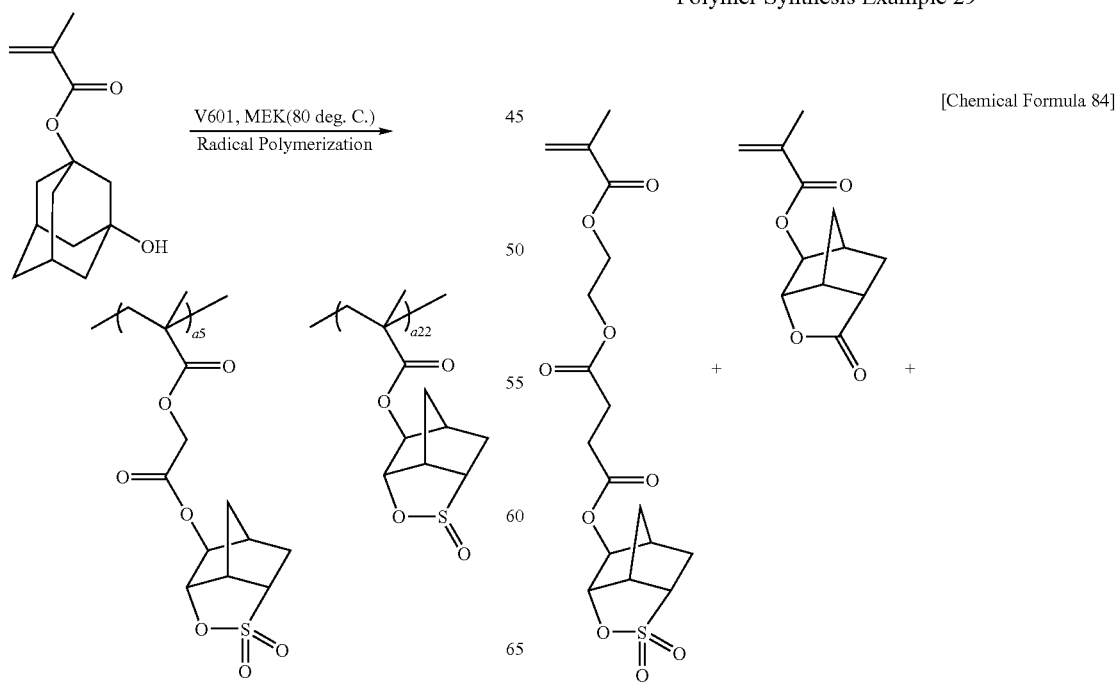

147
-continued
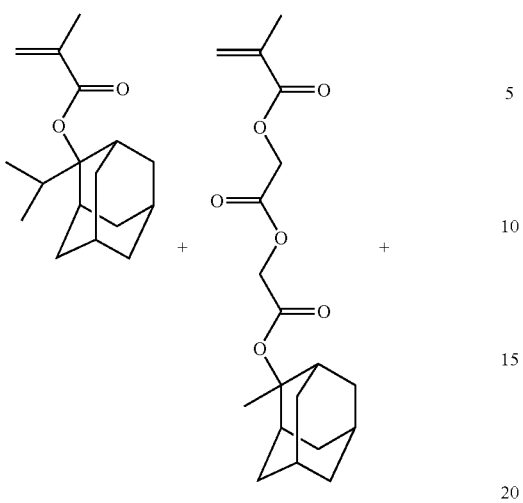
148
-continued
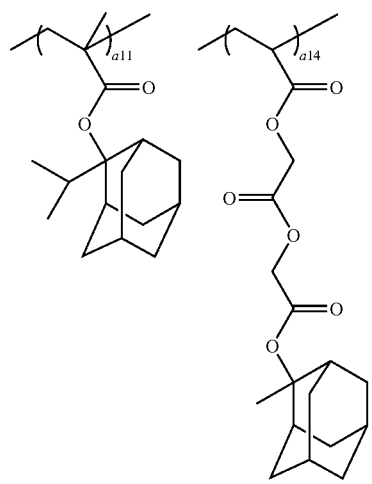
Polymeric compound 29
[Mw: 6,600, Mw/Mn: 1.69, a0/a22/a11/a14/a3 = 20.6/35.2/22.1/9.5/12.6]
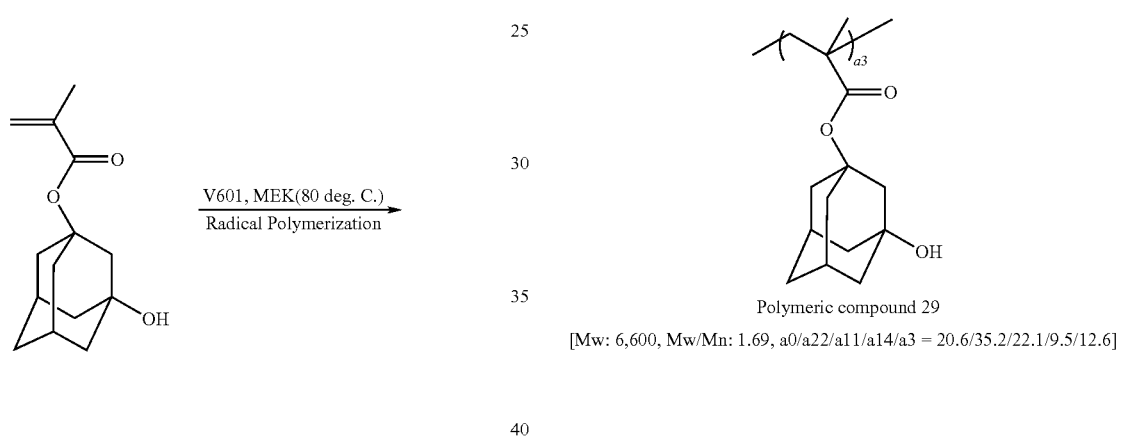
Polymer Synthesis Example 30
[Chemical Formula 85]
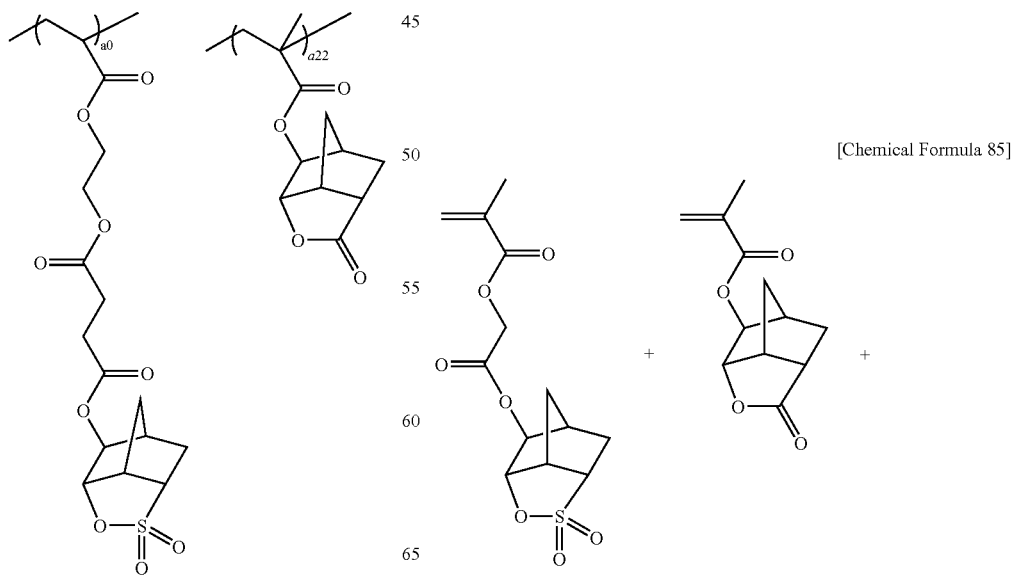

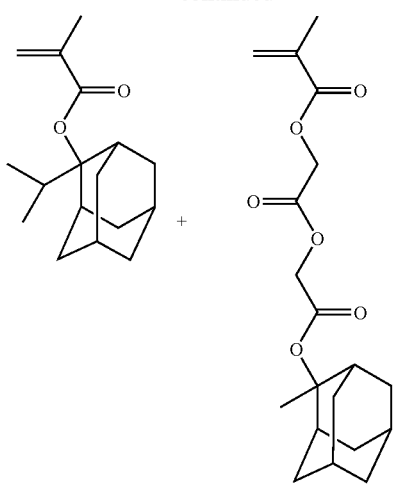
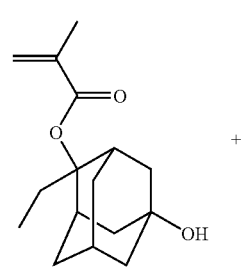
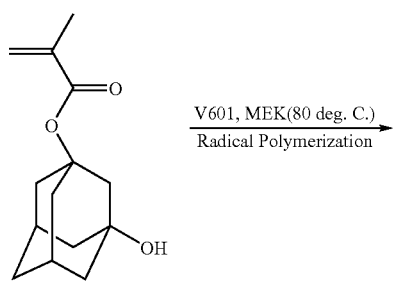
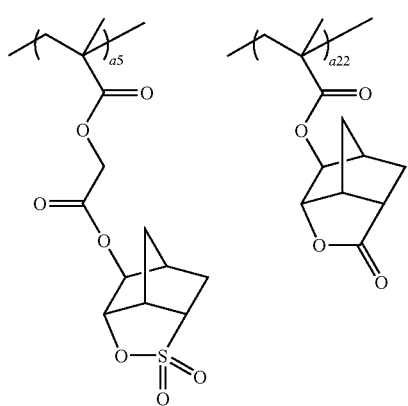
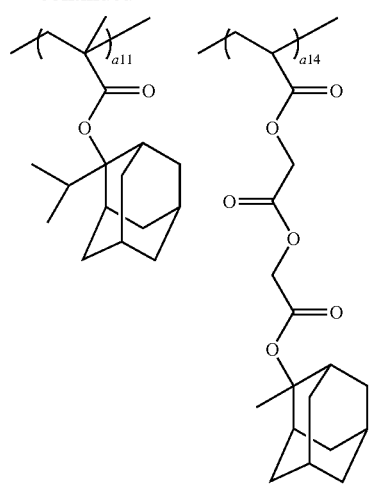
Polymeric compound 30
[Mw: 7,200, Mw/Mn: 1.58, a5/a22/a11/a14/a15/a3 = 24.4/24.4/16.1/6.5/18.2/10.4]
Polymer Synthesis Example 31
[Chemical Formula 86]
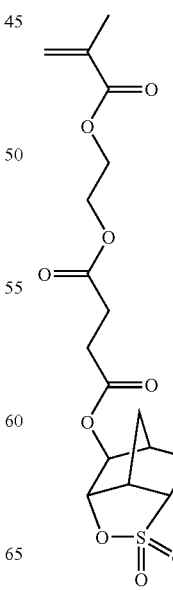

151
-continued
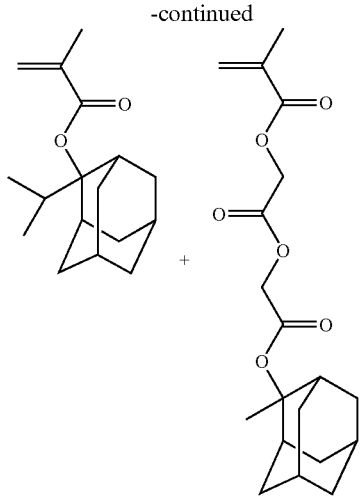
+
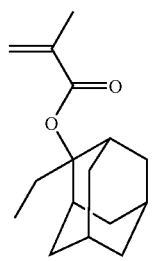
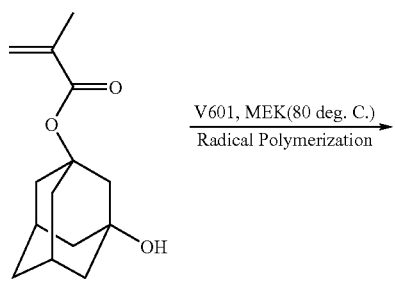
V601, MEK(80 deg. C.)
Radical Polymerization →
152
-continued
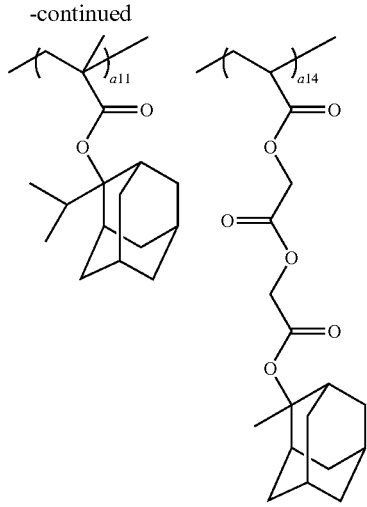
Polymeric compound 31
[Mw: 6,400, Mw/Mn: 1.58, a0/a22/a11/a14/a15/a3 = 20.0/25.7/17.2/7.5/16.2/13.4]
Polymer Synthesis Example 32
[Chemical Formula 87]
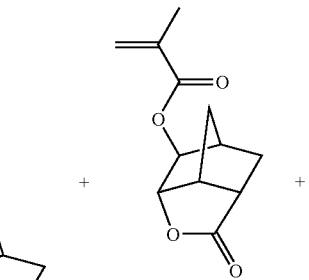
+
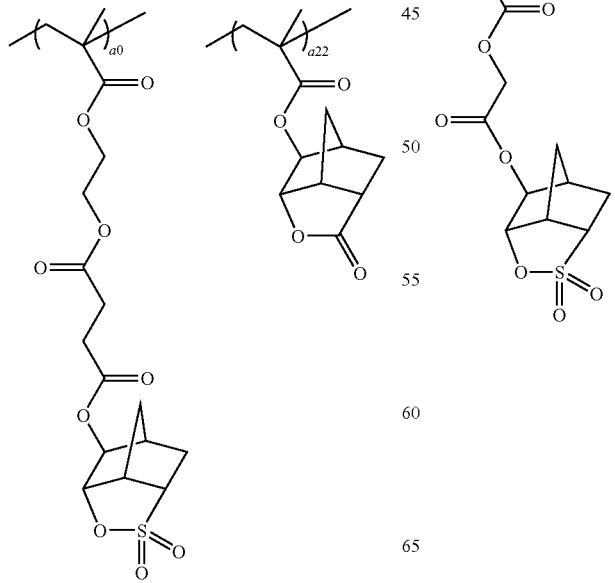
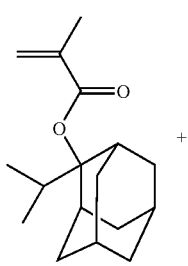
+

153
-continued
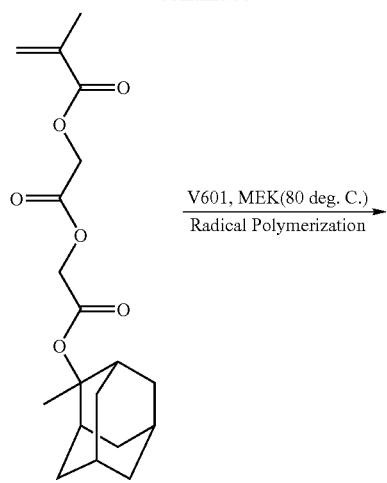
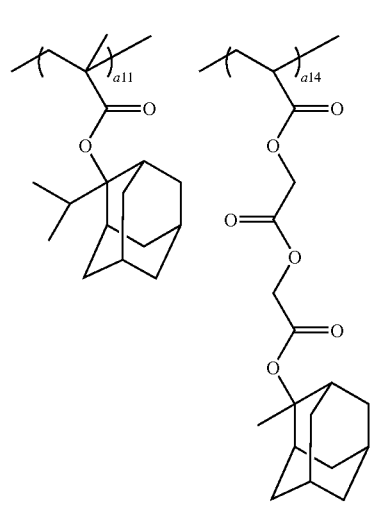
Polymeric compound 32
[Mw: 7,300, Mw/Mn: 1.49, a5/a22/al1/al4 = 35.0/12.8/43.2/8.0]
154
Polymer Synthesis Example 33
[Chemical Formula 88]
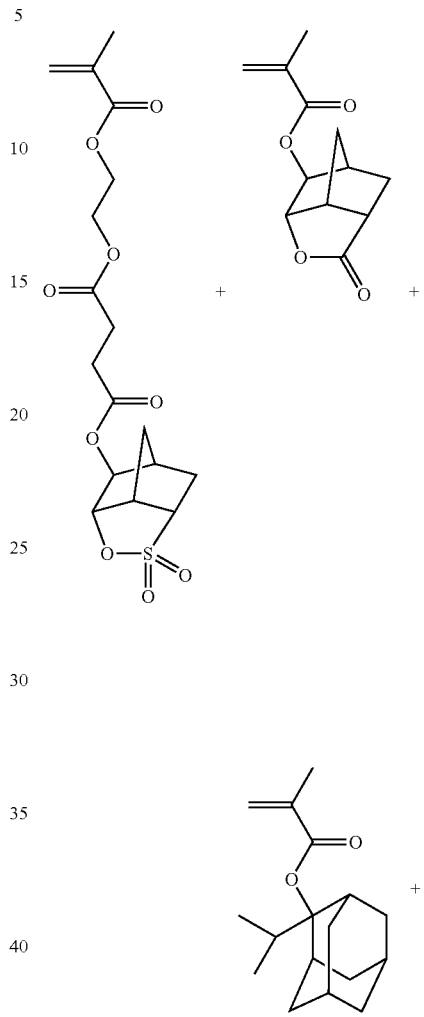
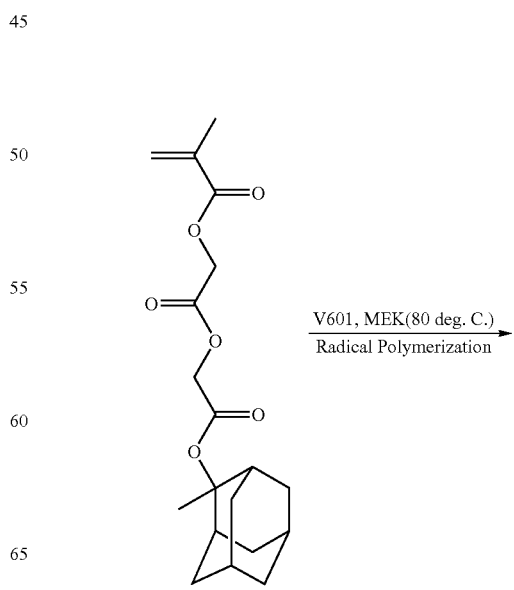

-continued
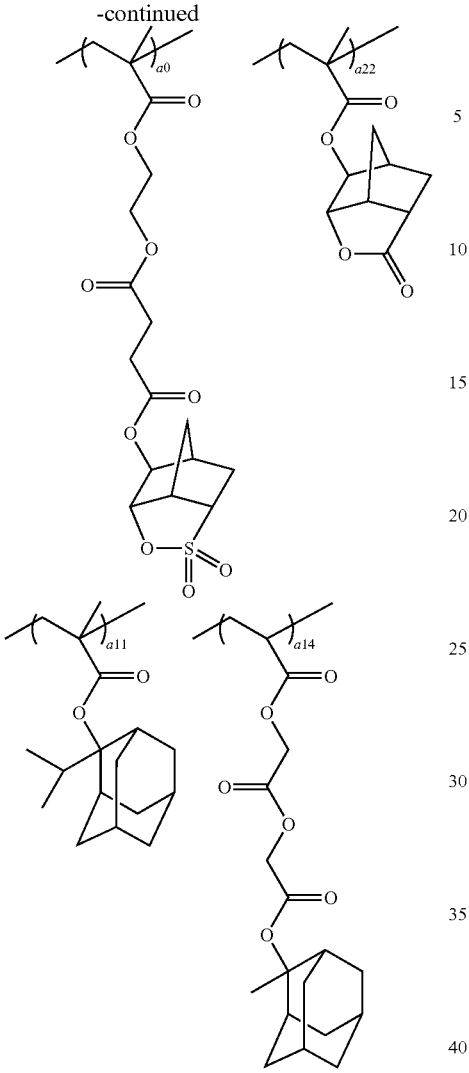
Polymeric compound 33
[MW: 7,500, Mw/Mn: 1.55, a0/a22/a11/a14 = 25.0/37.8/24.2/13.0]
Polymer Synthesis Example 34
[Chemical Formula 89]
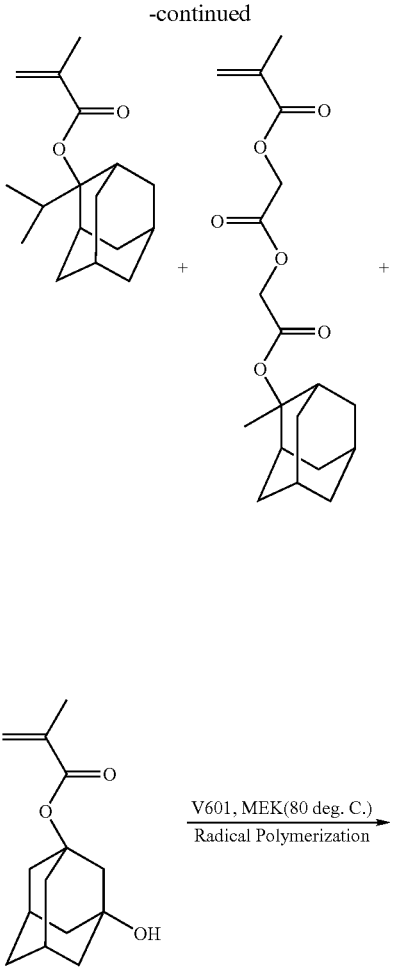
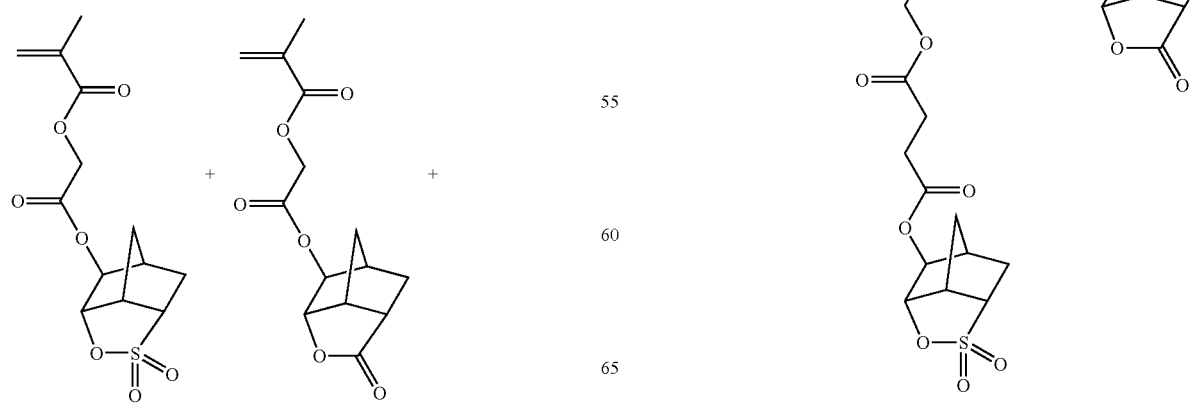

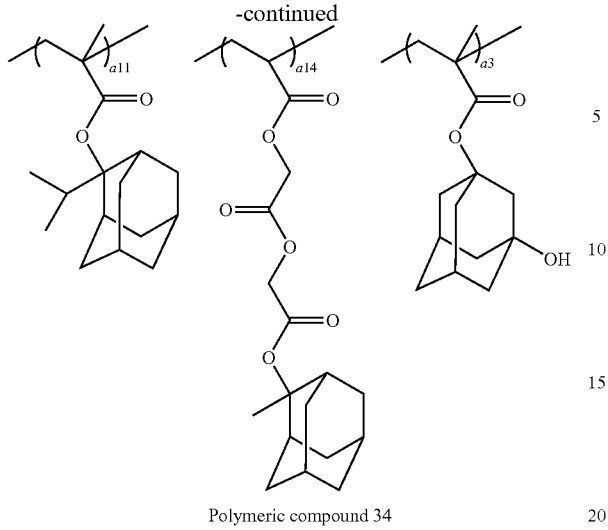
Polymeric compound 34
[Mw: 6,700, Mw/Mn: 1.65, a5/a23/a11/a14/a3 = 26.8/35.4/21.9/10.0/6.3]
Polymer Synthesis Example 35
[Chemical Formula 90]
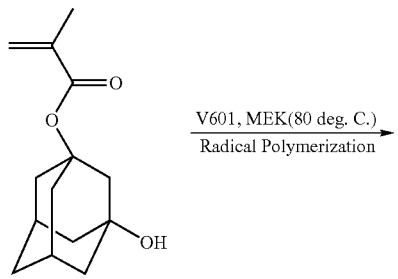
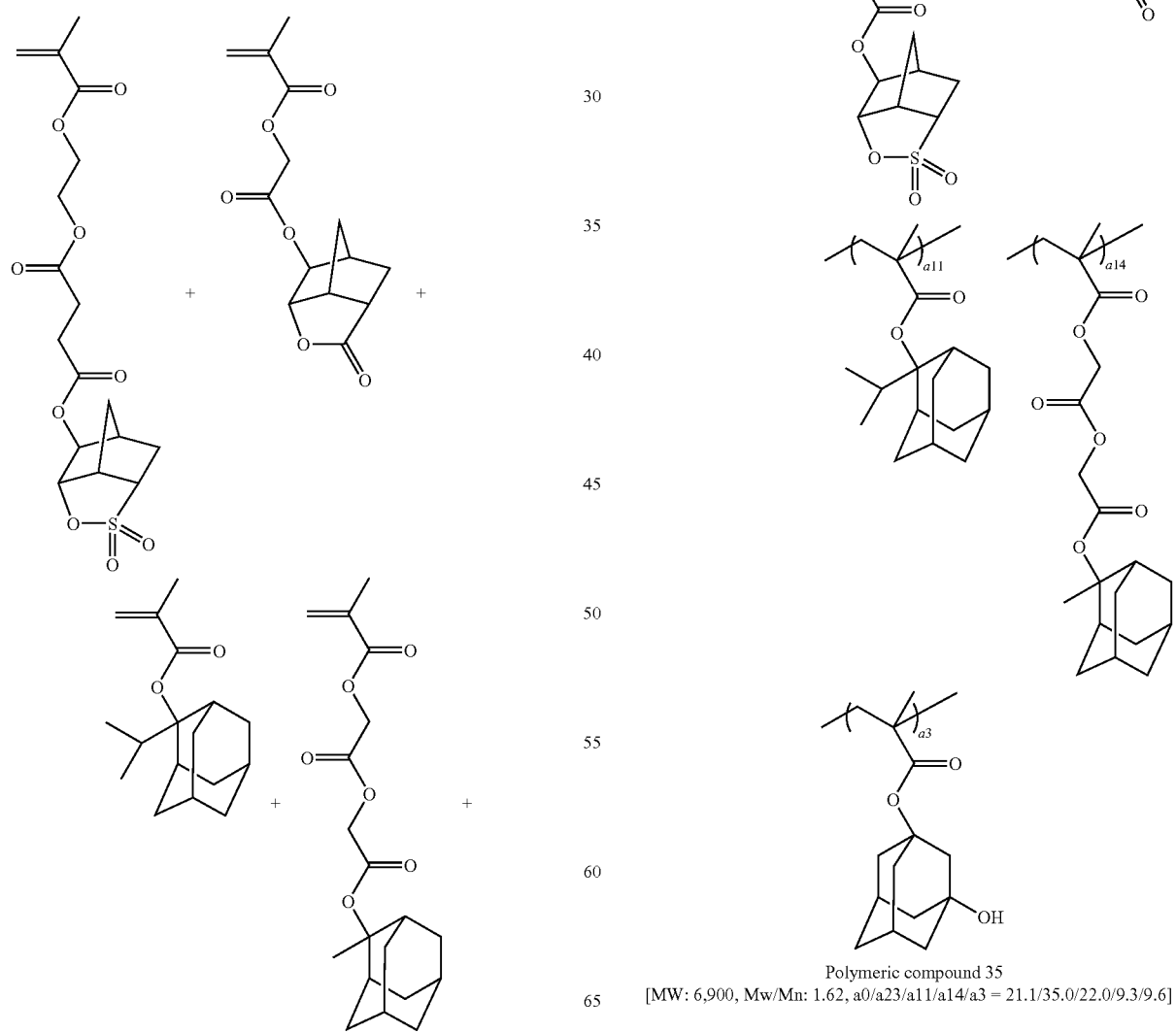
Polymeric compound 35
[MW: 6,900, Mw/Mn: 1.62, a0/a23/a11/a14/a3 = 21.1/35.0/22.0/9.3/9.6]

Polymer Synthesis Example 36
[Chemical Formula 91]
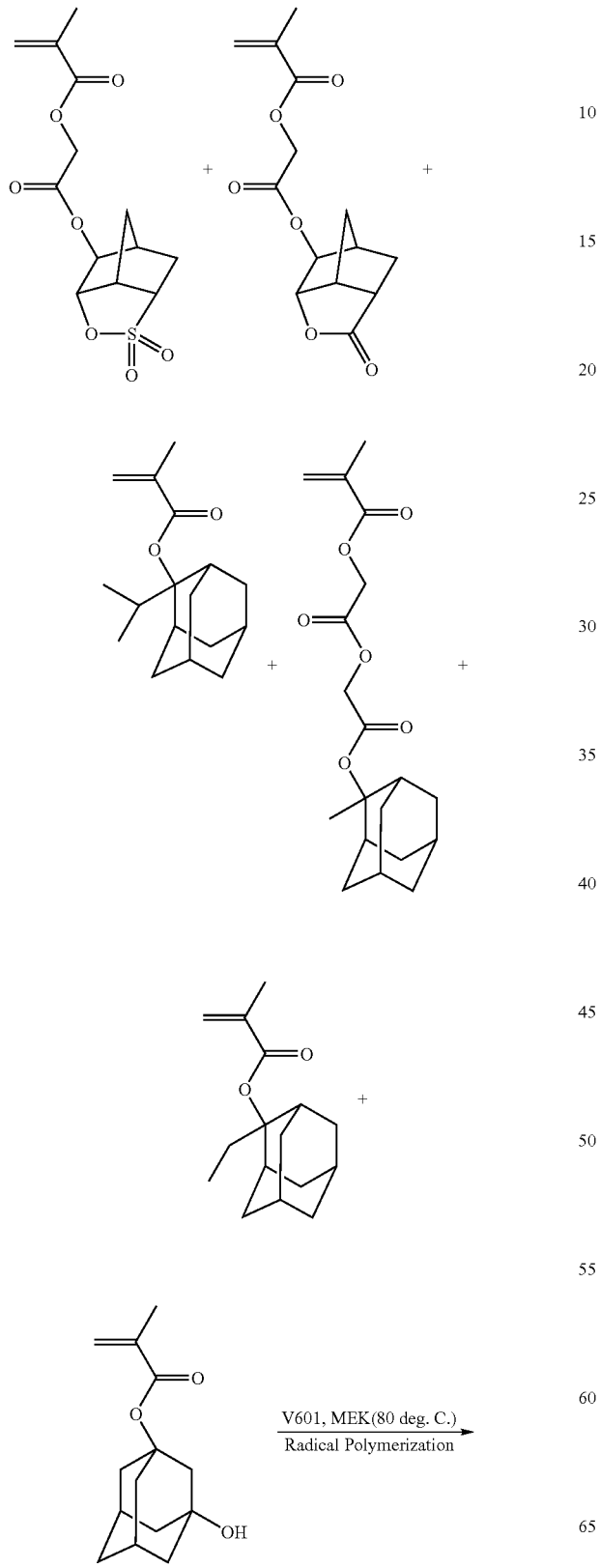
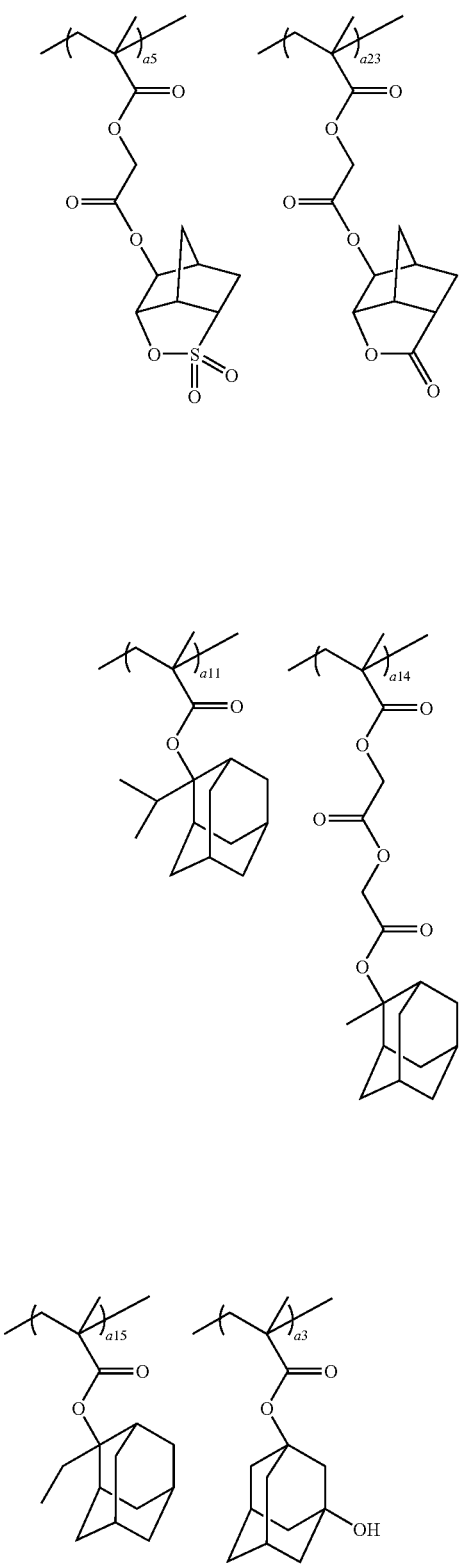
Polymeric compound 36
[MW: 7,000, Mw/Mn: 1.66, a5/a23/a11/a14/a3 = 25.4/20.9/19.1/7.7/17.5/10.4]

Polymer Synthesis Example 37
[Chemical Formula 92]
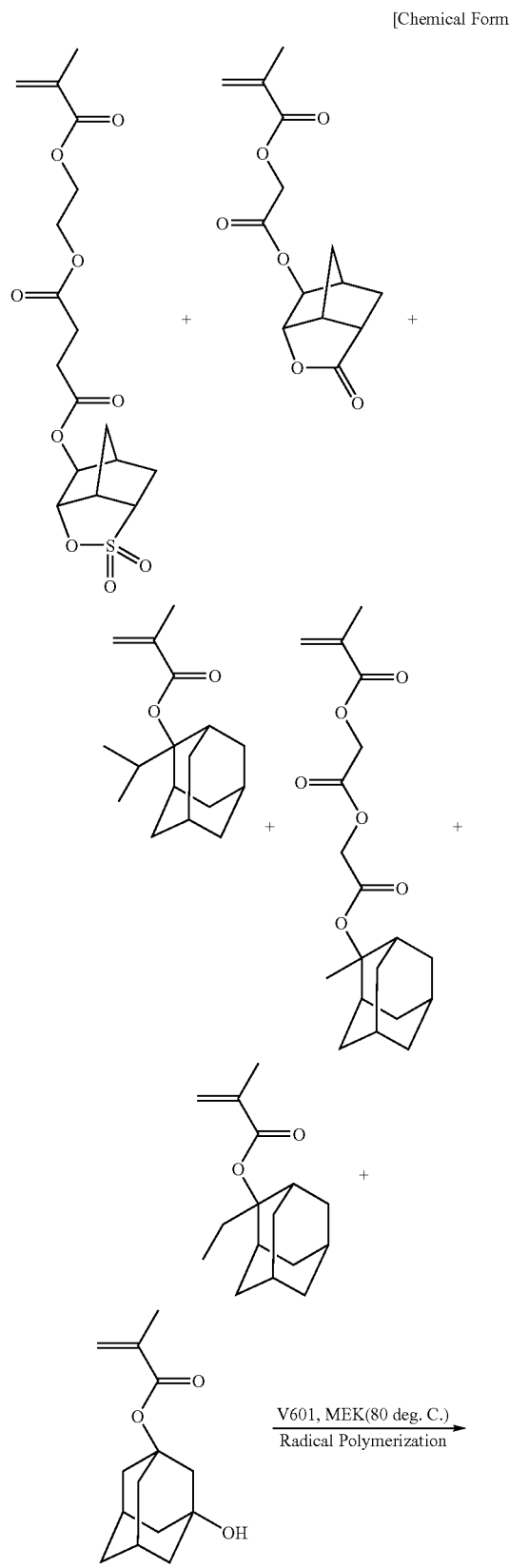
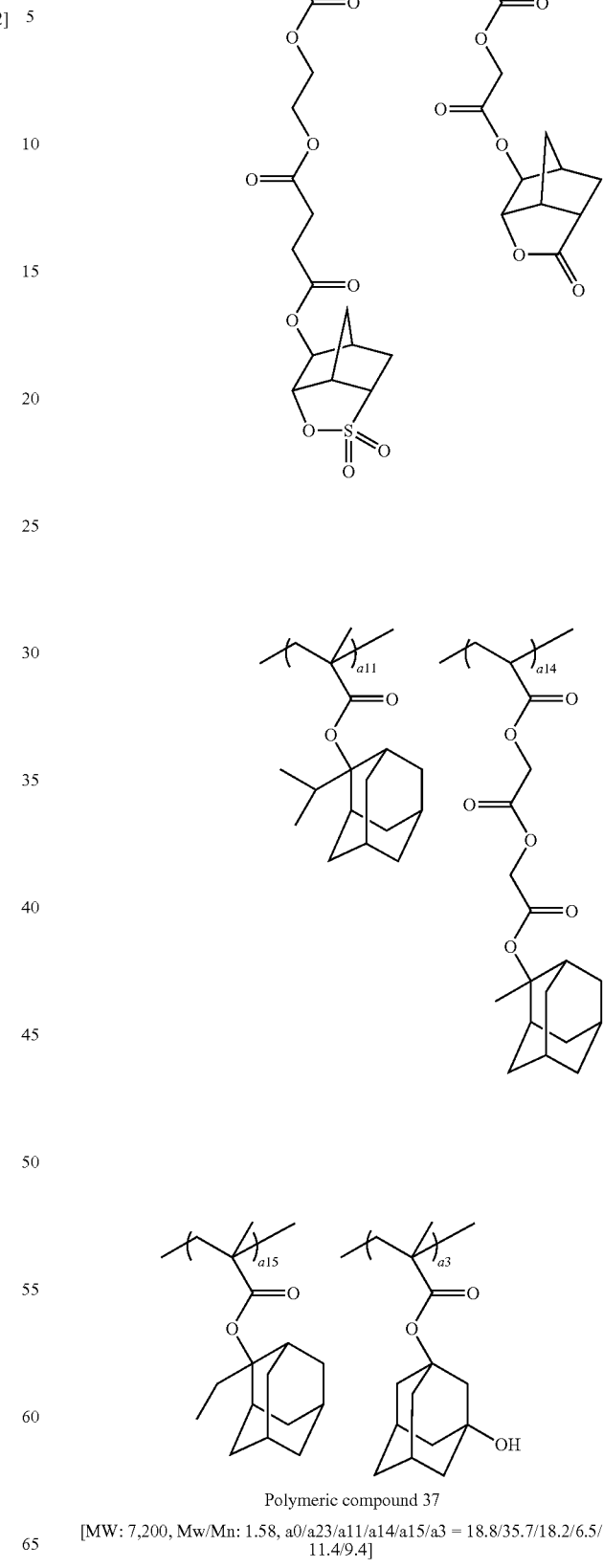
Polymeric compound 37
[MW: 7,200, Mw/Mn: 1.58, a0/a23/a11/a14/a15/a3 = 18.8/35.7/18.2/6.5/11.4/9.4]

Polymer Synthesis Example 38
[Chemical Formula 93]
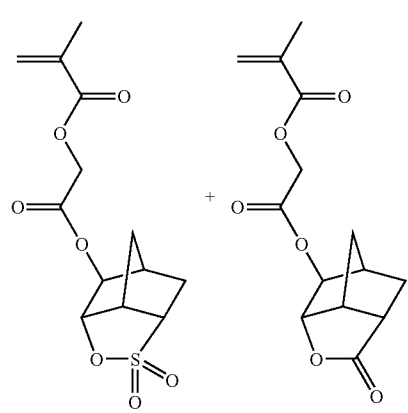
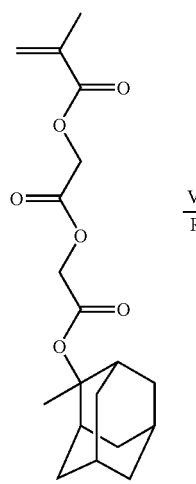
$\xrightarrow{\text{V601, MEK(80 deg. C.)}}$ Radical Polymerization
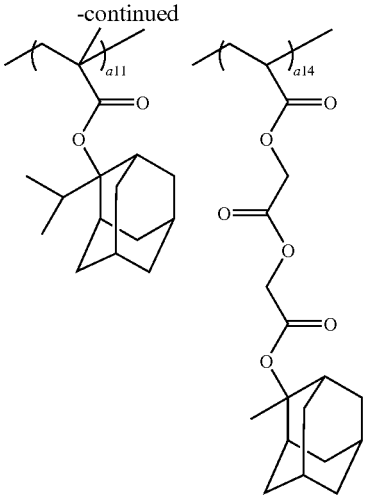
Polymeric compound 38
[Mw: 7,300, Mw/Mn: 1.49, a5/a23/a11/a14 = 35.7/14.8/41.2/8.5]
Polymer Synthesis Example 39
[Chemical Formula 94]
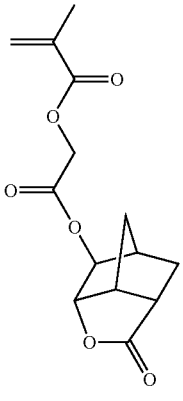
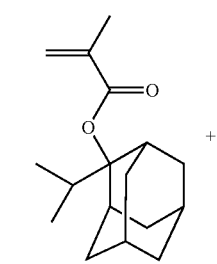

-continued
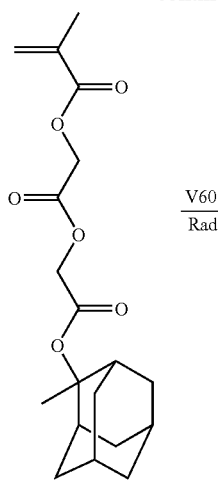
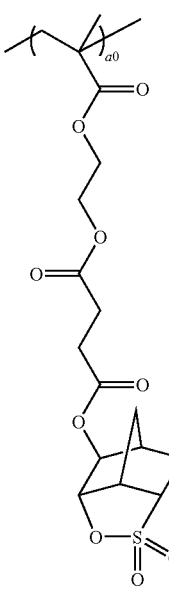
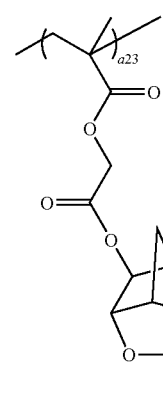
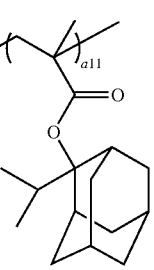
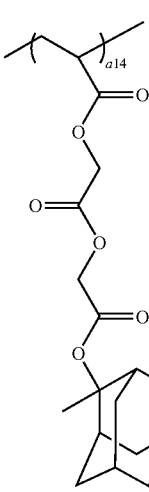
Polymeric compound 39
[MW: 7,000, Mw/Mn: 1.60, a0/a23/a11/a14 = 20.0/38.9/36.1/5.0]
Polymer Synthesis Example 40
[Chemical Formula 95]
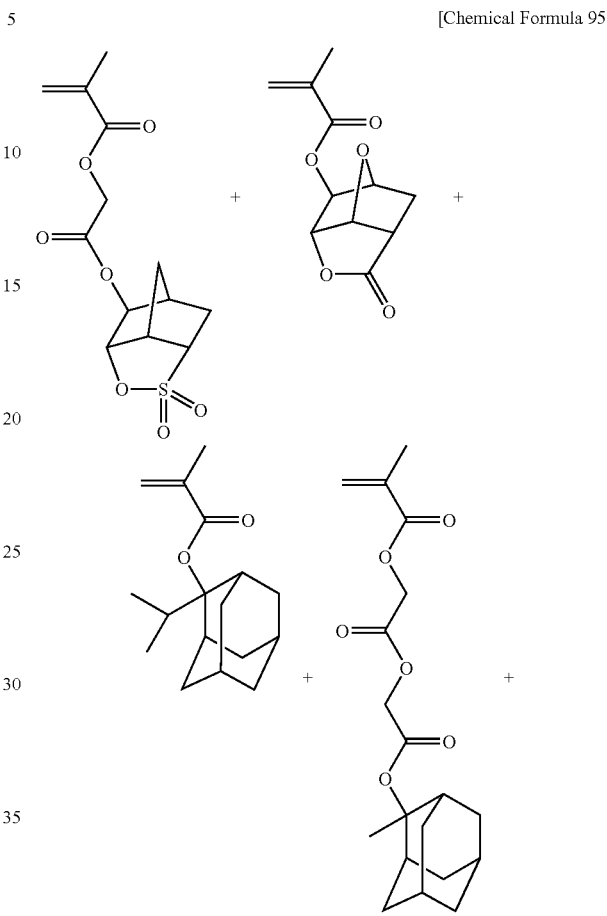
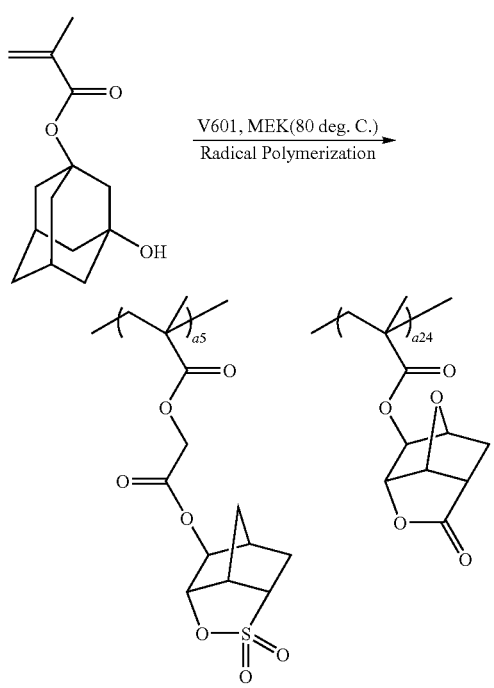

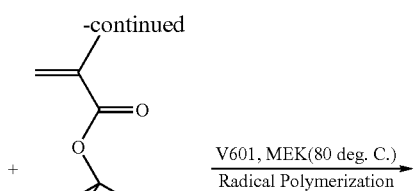
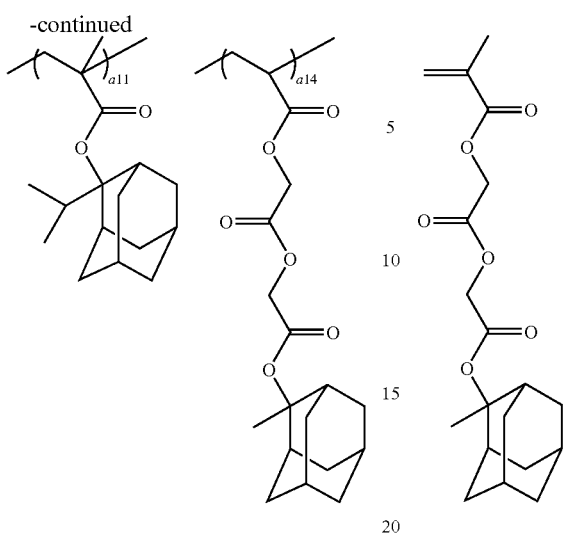
Polymeric compound 40
[Mw: 6,900, Mw/Mn: 1.62, a5/a24/a11/a14/a3 = 26.6/35.2/21.1/10.5/6.6]
Polymer Synthesis Example 41
[Chemical Formula 96]
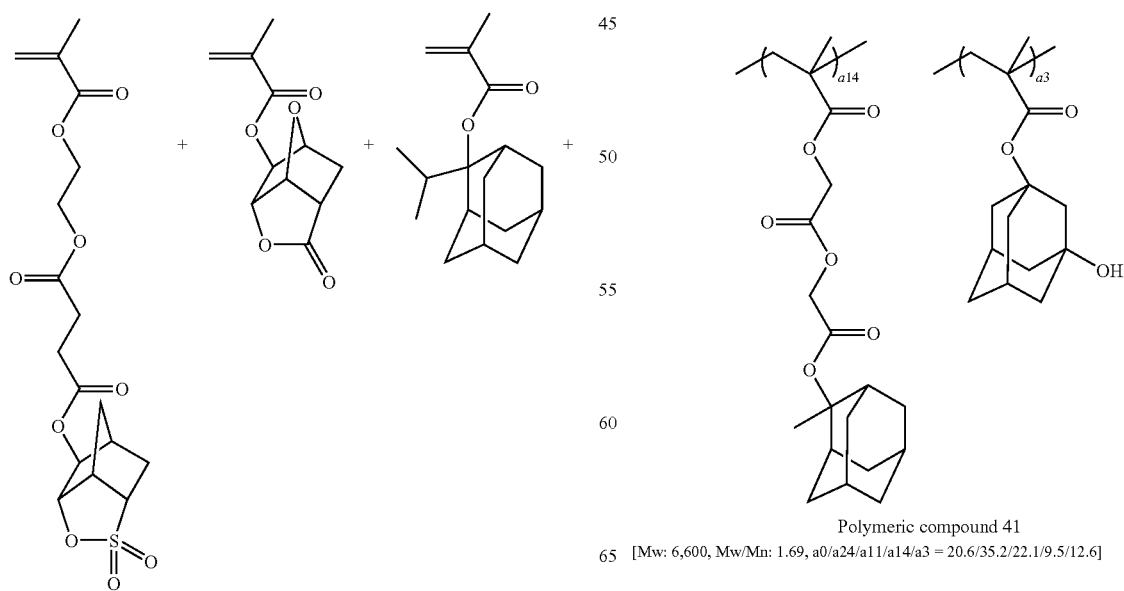
Polymeric compound 41
[Mw: 6,600, Mw/Mn: 1.69, a0/a24/a11/a14/a3 = 20.6/35.2/22.1/9.5/12.6]

Polymer Synthesis Example 42
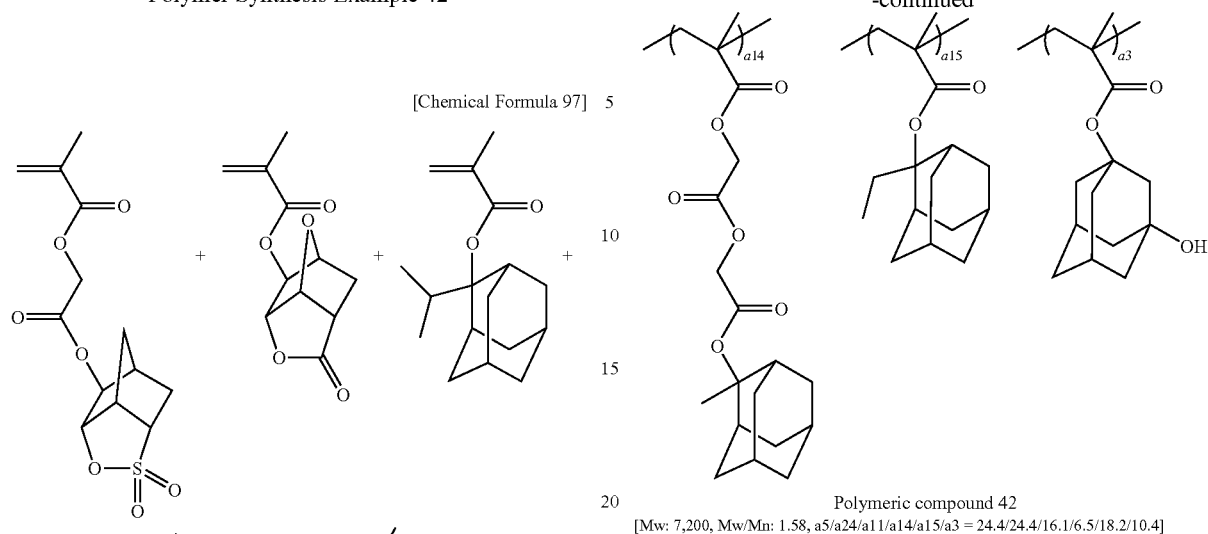
Polymer Synthesis Example 43
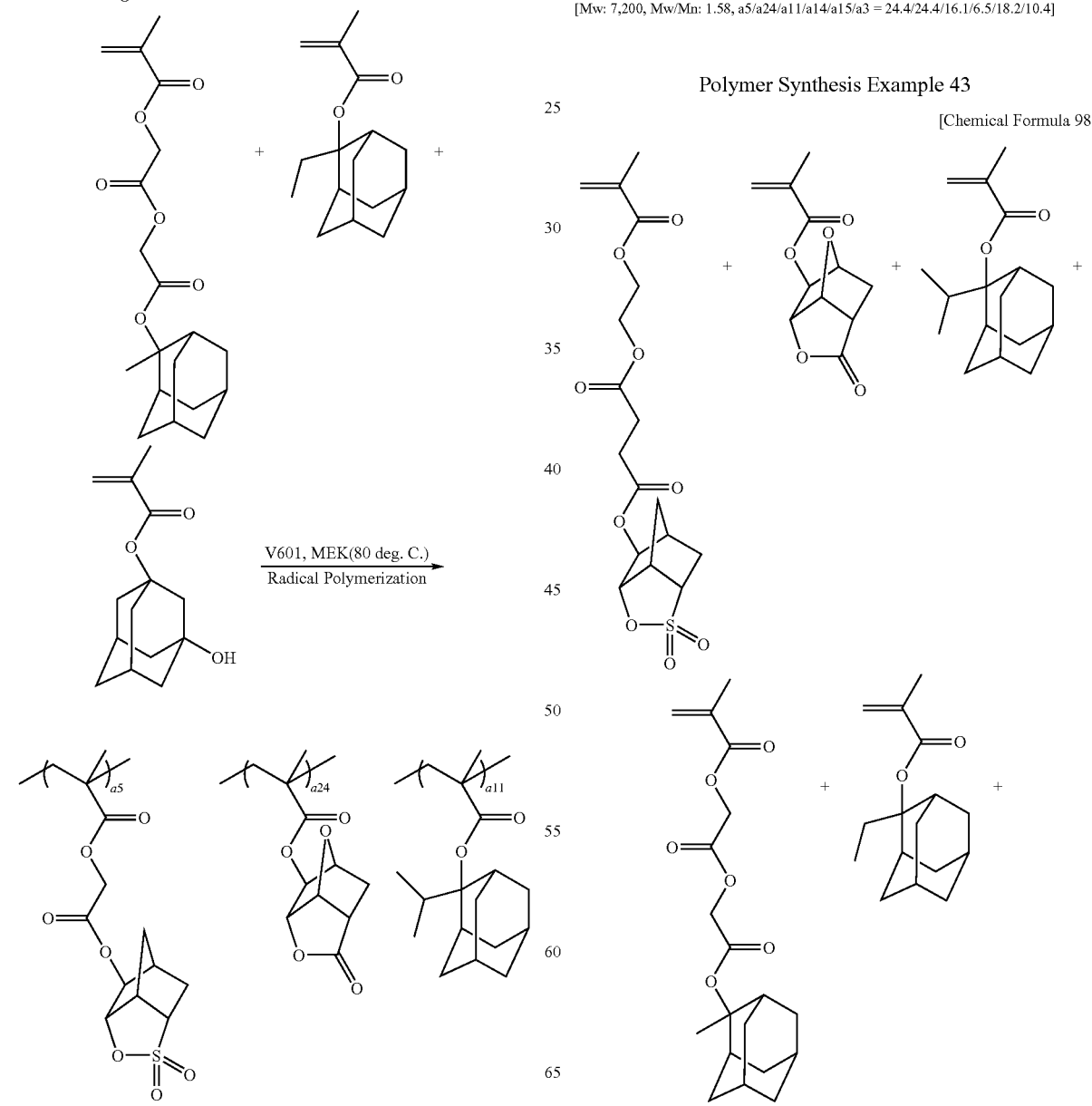
Polymeric compound 42
[Mw: 7,200, Mw/Mn: 1.58, a5/a24/a11/a14/a15/a3 = 24.4/24.4/16.1/6.5/18.2/10.4]

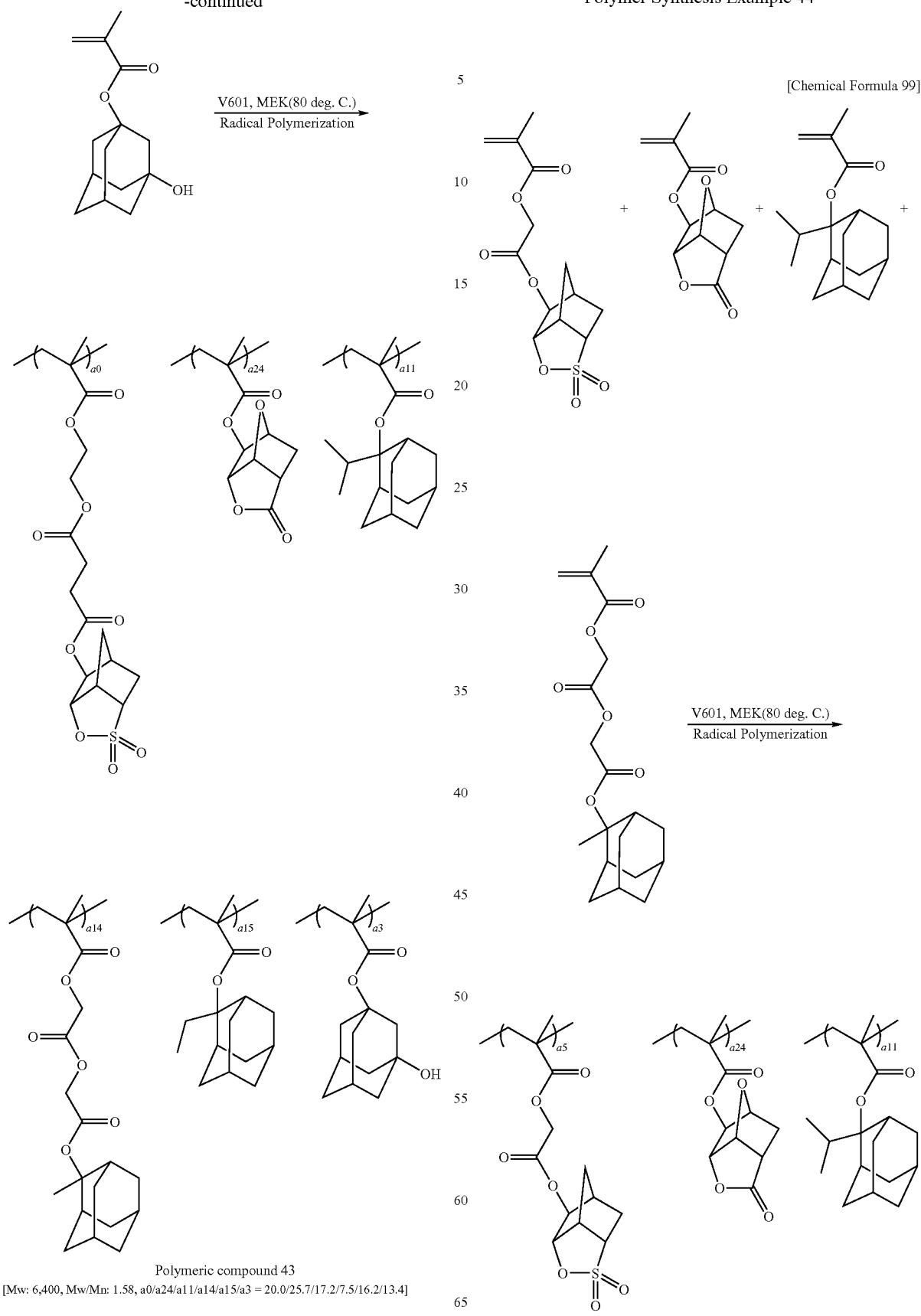

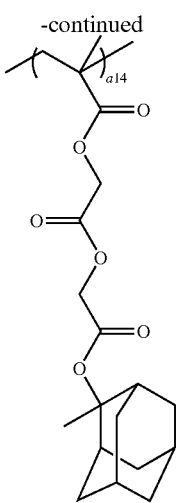
Polymeric compound 44
[Mw: 7,300, Mw/Mn: 1.49, a5/a24/a11/a14 = 35.0/12.8/43.2/8.0]
Polymer Synthesis Example 45
[Chemical Formula 100]
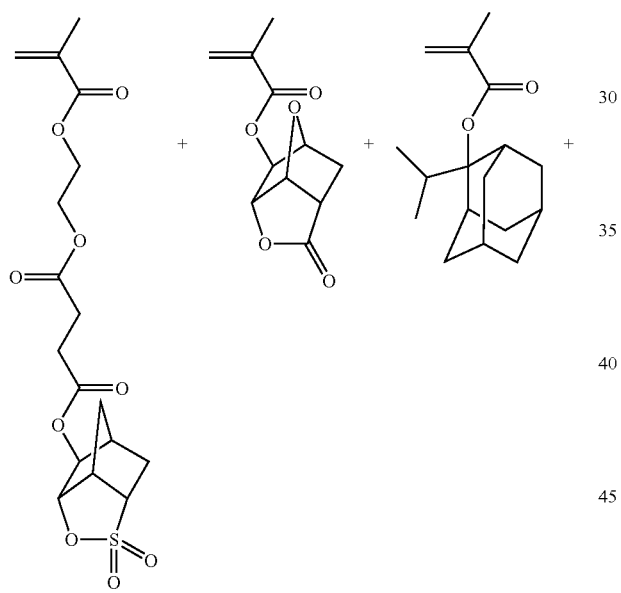
V601, MEK(80 deg. C.)
Radical Polymerization
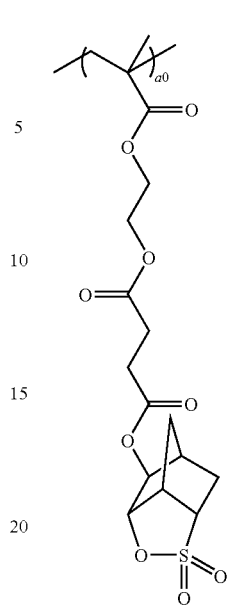
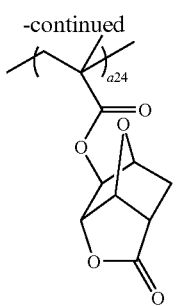
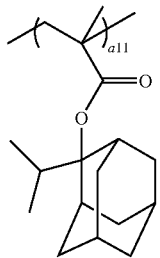
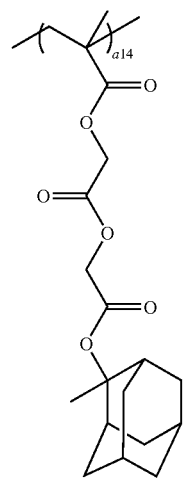
Polymeric compound 45
[Mw: 7,500, Mw/Mn: 1.55, a0/a24/a11/a14 = 25.0/37.8/24.2/13.0]
Polymer Synthesis Example 46
[Chemical Formula 101]
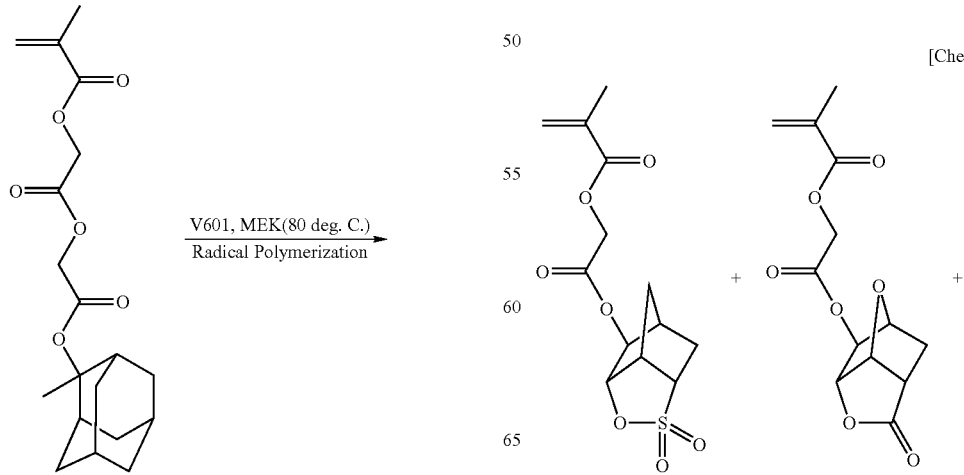

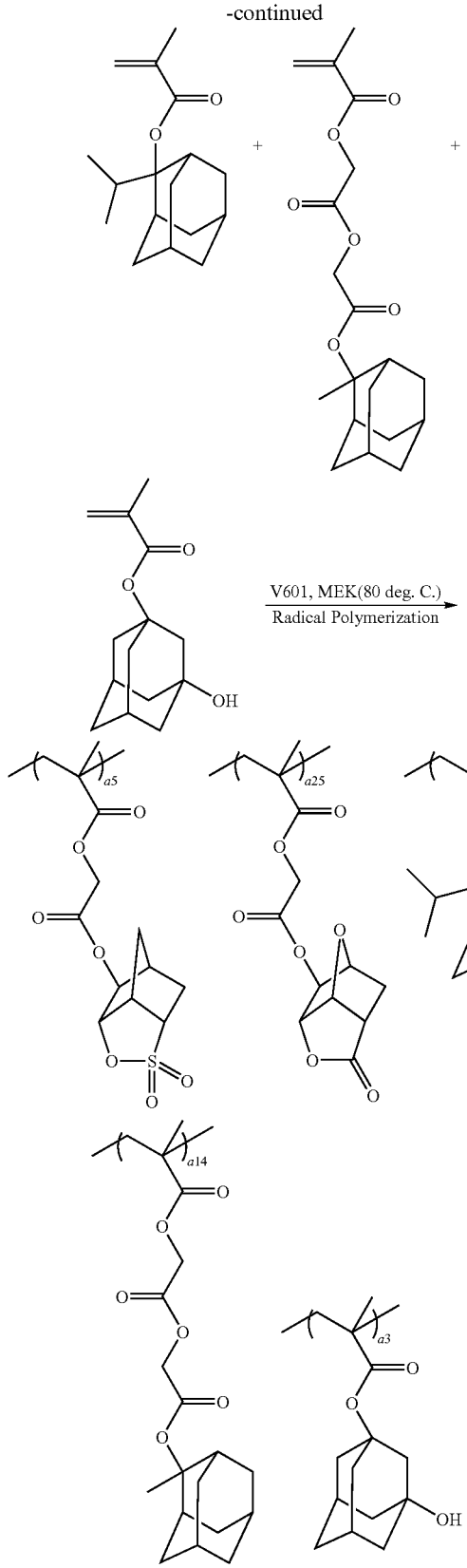
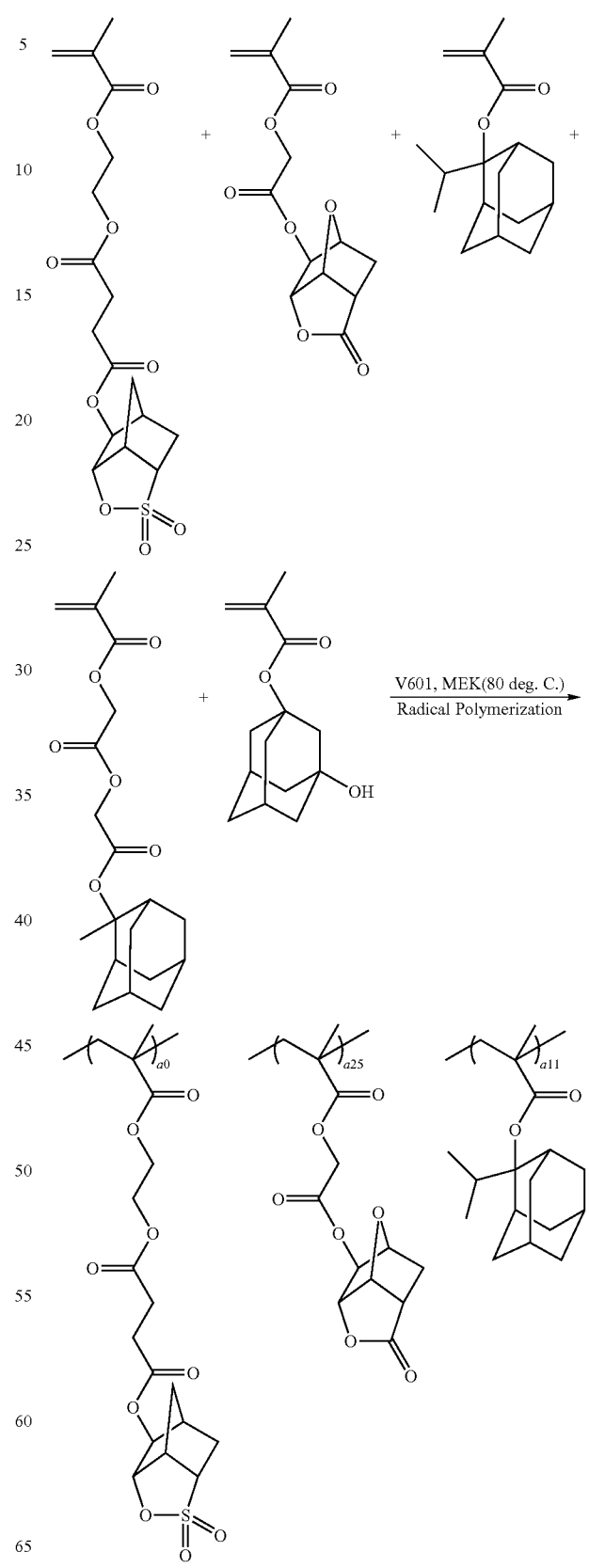
Polymer Synthesis Example 47
[Chemical Formula 102]

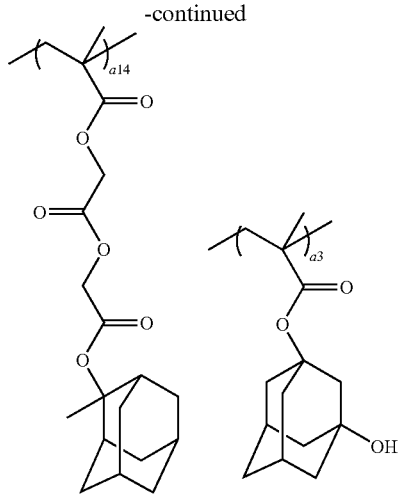
Polymeric compound 47
[Mw: 6,900, Mw/Mn: 1.62, a0/a25/a11/a14/a3 = 21.1/35.0/22.0/9.3/9.6]
Polymer Synthesis Example 48
[Chemical Formula 103]
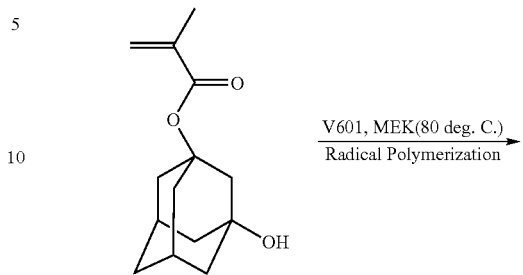
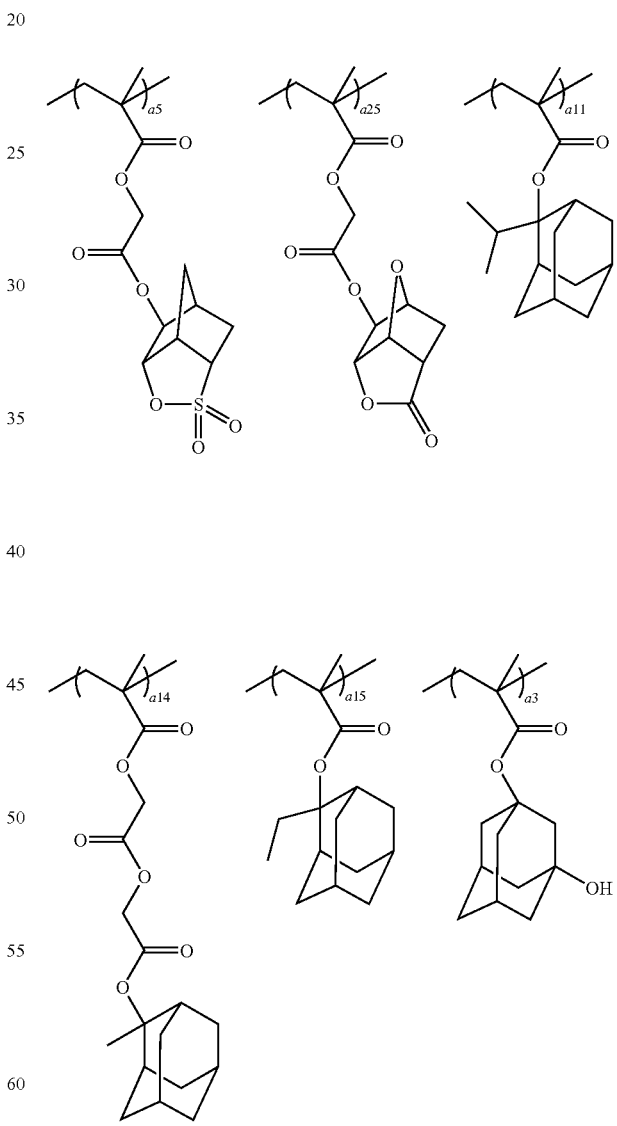
Polymeric compound 48
[Mw: 7,000, Mw/Mn: 1.66, a5/a25/a11/a14/a15/a3 = 25.4/20.9/19.1/7.7/17.5/10.4]

Polymer Synthesis Example 49
[Chemical Formula 104]
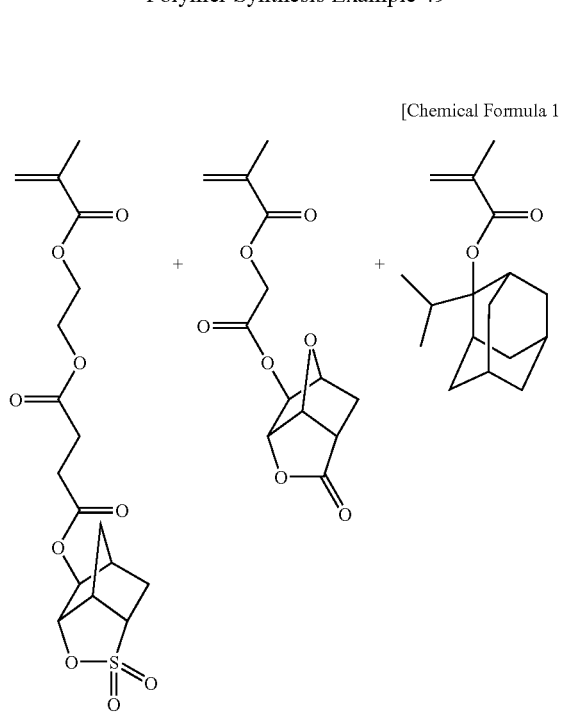
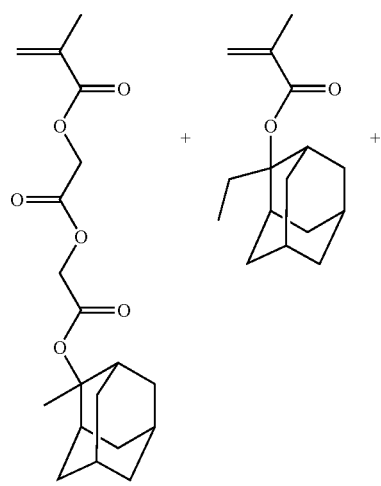
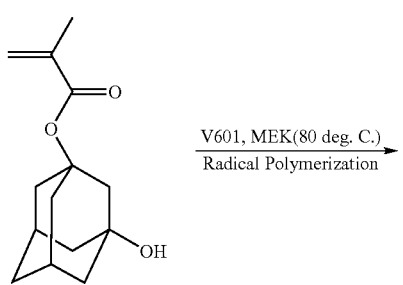
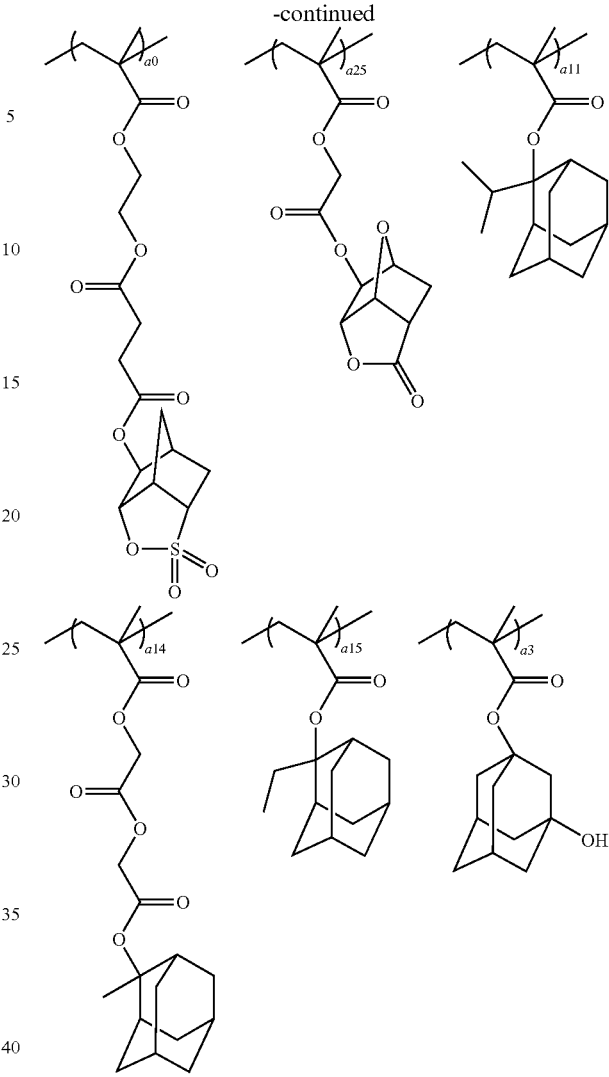
Polymeric compound 49
[Mw: 7,200, Mw/Mn: 1.58, a0/a25/a11/a14/a15/a3 = 18.8/35.7/18.2/6.5/11.4/9.4]
Polymer Synthesis Example 50
[Chemical Formula 105]
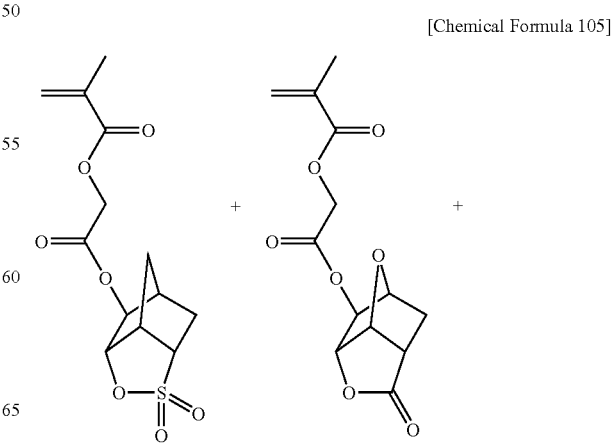

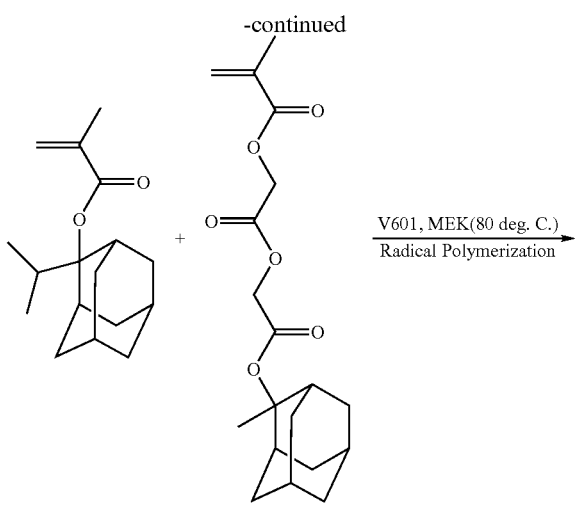
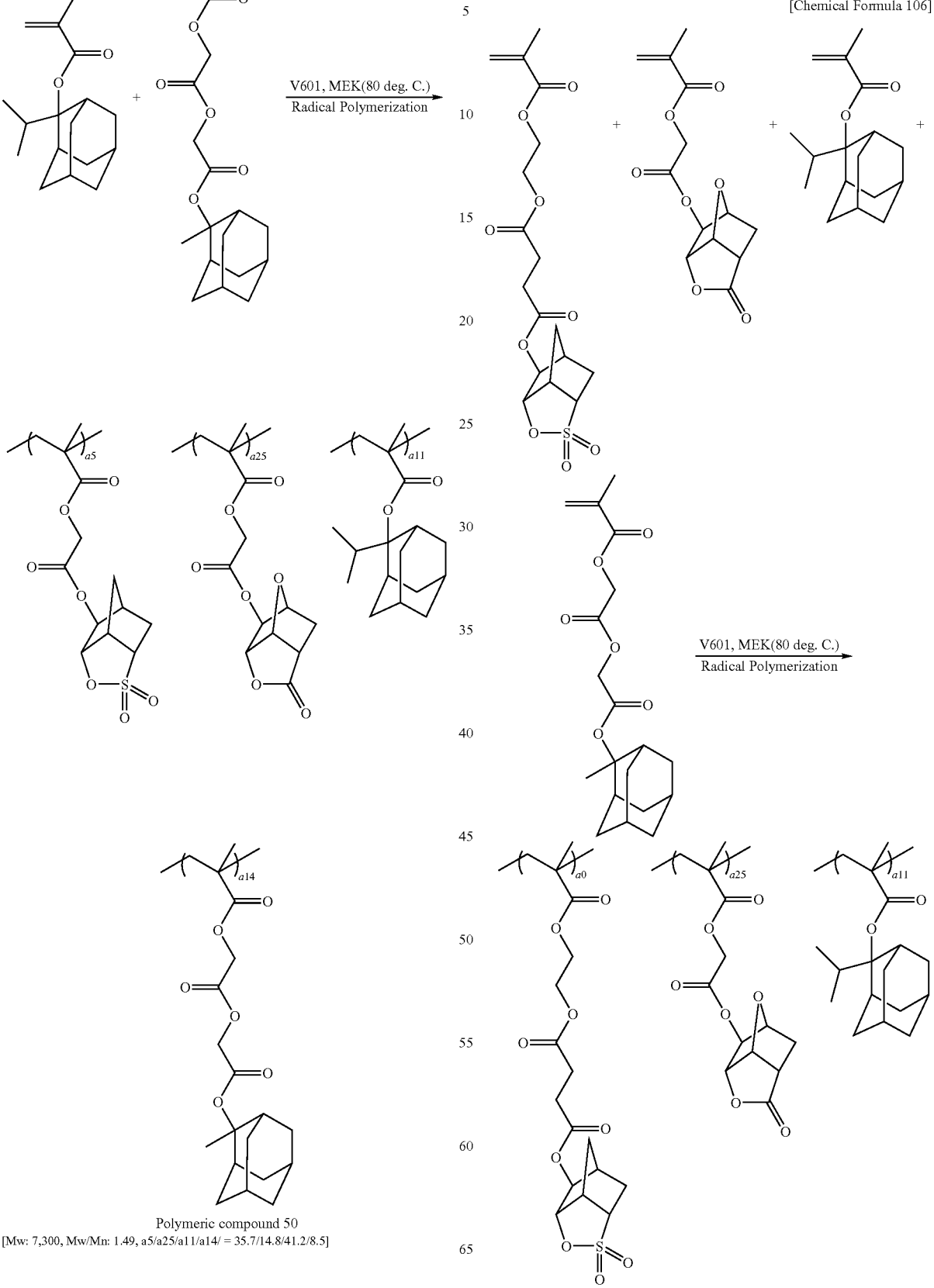
Polymer Synthesis Example 51
[Chemical Formula 106]

-continued

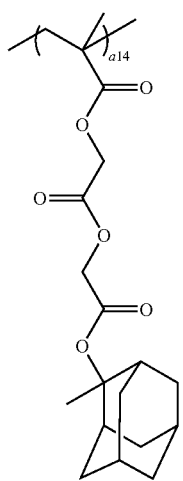

Polymeric compound 51

[Mw: 7,000, Mw/Mn: 1.60, a0/a25/a11/a14 = 20.0/38.9/36.1/5.0]

Polymer Synthesis Example 52

[Chemical Formula 107]

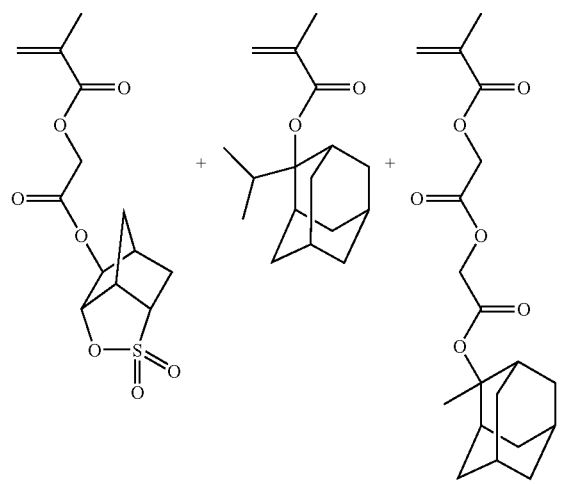

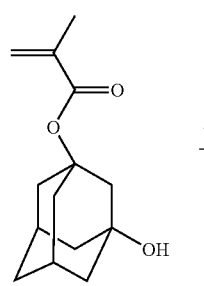

V601, MEK(80 deg. C.)
Radical Polymerization →

-continued

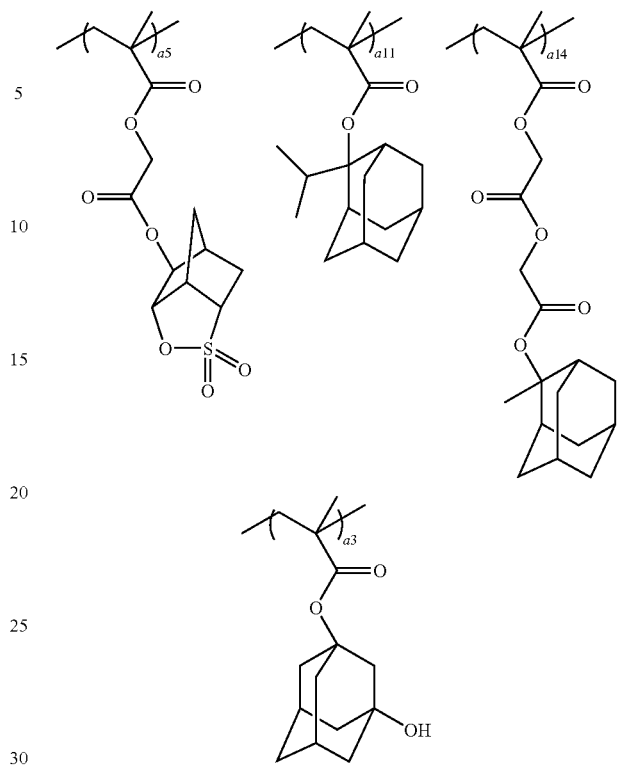

Polymeric compound 52

[Mw: 8,900, Mw/Mn: 1.94, a5/a11/a14/a3 = 30.7/14.3/46.3/8.8]

Examples 1 to 20, Comparative Example 1

Preparation of Resist Compositions

Positive resist compositions were prepared by mixing and dissolving the components listed below in Table 1.

TABLE 1

|  | Component (A) | Component (B) | Component (D) | Component (S) | |
|---|---|---|---|---|---|
| Example 1 | (A)-1 [100] | (B)-1 [9.8] | (D)-1 [0.5] | (S)-1 [900] | (S)-2 [10] |
| Example 2 | (A)-2 [100] | (B)-1 [9.8] | (D)-1 [0.5] | (S)-1 [900] | (S)-2 [10] |
| Example 3 | (A)-3 [100] | (B)-1 [9.8] | (D)-1 [0.5] | (S)-1 [900] | (S)-2 [10] |
| Example 4 | (A)-4 [100] | (B)-1 [9.8] | (D)-1 [0.5] | (S)-1 [900] | (S)-2 [10] |
| Example 5 | (A)-5 [100] | (B)-1 [9.8] | (D)-1 [0.5] | (S)-1 [900] | (S)-2 [10] |
| Example 6 | (A)-6 [100] | (B)-1 [9.8] | (D)-1 [0.5] | (S)-1 [900] | (S)-2 [10] |
| Example 7 | (A)-7 [100] | (B)-1 [9.8] | (D)-1 [0.5] | (S)-1 [900] | (S)-2 [10] |
| Example 8 | (A)-8 [100] | (B)-1 [9.8] | (D)-1 [0.5] | (S)-1 [900] | (S)-2 [10] |
| Example 9 | (A)-9 [100] | (B)-1 [9.8] | (D)-1 [0.5] | (S)-1 [900] | (S)-2 [10] |
| Example 10 | (A)-10 [100] | (B)-1 [9.8] | (D)-1 [0.5] | (S)-1 [900] | (S)-2 [10] |

TABLE 1-continued

| | Component (A) | Component (B) | Component (D) | Component (S) | |
|---|---|---|---|---|---|
| Example 11 | (A)-11 [100] | (B)-1 [9.8] | (D)-1 [0.5] | (S)-1 [900] | (S)-2 [10] |
| Example 12 | (A)-12 [100] | (B)-1 [9.8] | (D)-1 [0.5] | (S)-1 [900] | (S)-2 [10] |
| Example 13 | (A)-13 [100] | (B)-1 [9.8] | (D)-1 [0.5] | (S)-1 [900] | (S)-2 [10] |
| Example 14 | (A)-14 [100] | (B)-1 [9.8] | (D)-1 [0.5] | (S)-1 [900] | (S)-2 [10] |
| Example 15 | (A)-15 [100] | (B)-1 [9.8] | (D)-1 [0.5] | (S)-1 [900] | (S)-2 [10] |
| Example 16 | (A)-16 [100] | (B)-1 [9.8] | (D)-1 [0.5] | (S)-1 [900] | (S)-2 [10] |
| Example 17 | (A)-17 [100] | (B)-1 [9.8] | (D)-1 [0.5] | (S)-1 [900] | (S)-2 [10] |
| Example 18 | (A)-18 [100] | (B)-1 [9.8] | (D)-1 [0.5] | (S)-1 [900] | (S)-2 [10] |
| Example 19 | (A)-19 [100] | (B)-1 [9.8] | (D)-1 [0.5] | (S)-1 [900] | (S)-2 [10] |
| Example 20 | (A)-20 [100] | (B)-1 [9.8] | (D)-1 [0.5] | (S)-1 [900] | (S)-2 [10] |
| Comparative example 1 | (A)-21 [100] | (B)-1 [9.8] | (D)-1 [0.5] | (S)-1 [900] | (S)-2 [10] |

In Table 1, the values in brackets [ ] indicate the amount (in terms of parts by weight) of the component added. Further, the reference characters in Table 1 indicate the following.

(A)-1: the aforementioned polymeric compound 1
(A)-2: the aforementioned polymeric compound 4
(A)-3: the aforementioned polymeric compound 6
(A)-4: the aforementioned polymeric compound 7
(A)-5: the aforementioned polymeric compound 8
(A)-6: the aforementioned polymeric compound 10
(A)-7: the aforementioned polymeric compound 13
(A)-8: the aforementioned polymeric compound 15
(A)-9: the aforementioned polymeric compound 16
(A)-10: the aforementioned polymeric compound 18
(A)-11: the aforementioned polymeric compound 19
(A)-12: the aforementioned polymeric compound 21
(A)-13: the aforementioned polymeric compound 22
(A)-14: the aforementioned polymeric compound 25
(A)-15: the aforementioned polymeric compound 28
(A)-16: the aforementioned polymeric compound 30
(A)-17: the aforementioned polymeric compound 32
(A)-18: the aforementioned polymeric compound 40
(A)-19: the aforementioned polymeric compound 42
(A)-20: the aforementioned polymeric compound 44
(A)-21: the aforementioned polymeric compound 52
(B)-1: an acid generator represented by chemical formula (B)-1 shown below
(D)-1: tri-n-pentylamine (S)-1: a mixed solvent of PGMEA/PGME=6/4 (weight ratio)
(S)-2: γ-butyrolactone

[Chemical Formula 108]

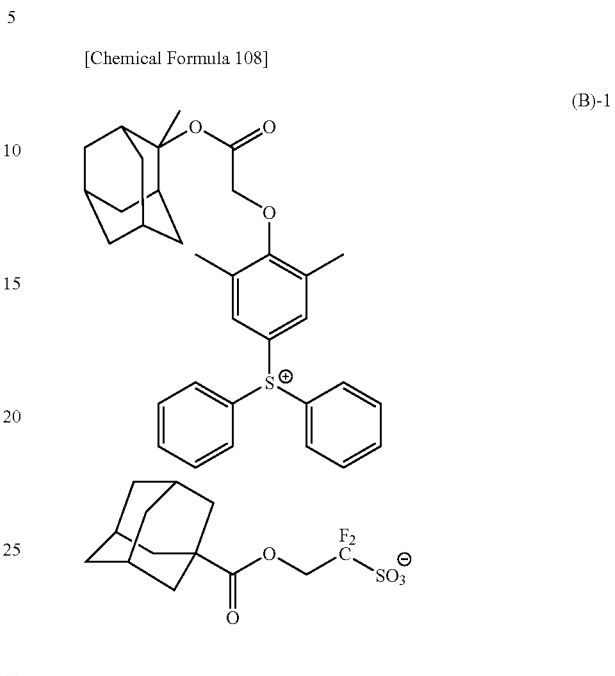

(B)-1

<Evaluation of Heat Resistance>

Using a spinner, each of the positive resist compositions prepared above was applied onto an 8 inch silicon substrate that had been treated with hexamethyldisilazane (HMDS) (at 90° C. for 36 seconds), and a post applied bake (PAB) was conducted on a hot plate at 90° C. for 60 seconds to dry the positive resist composition, thereby forming a resist film having a thickness of 200 nm. This resist film was then selectively irradiated with an ArF excimer laser (193 nm) through a mask pattern, using an ArF exposure apparatus NSR-S302 (manufactured by Nikon Corporation, NA (numerical aperture) =0.60, σ=0.75).

Subsequently, the resist was subjected to post exposure baking (PEB) at 85° C. for 60 seconds, developed for 60 seconds at 23° C. in a 2.38% by weight aqueous solution of tetramethylammonium hydroxide (TMAH), and then rinsed for 15 seconds with pure water. As a result, an isolated hole pattern with a hole diameter of 300 nm was formed within the resist film.

Each of the hole patterns formed in this manner was subjected to a post bake for 60 seconds at a predetermined temperature, and following the post bake, the hole pattern was inspected from above using a scanning electron microscope, and the size (diameter) (nm) of the hole pattern was measured. The results are shown in Table 2. The criteria used for judging the measurements are listed below. The pattern dimensional change was calculated using the following formula:

(1−(hole pattern diameter following post bake/hole pattern diameter upon pattern formation)×100

A: the pattern dimensional change was 10% or less
B: the pattern dimensional change exceeded 10%
C: the pattern collapsed upon heating

TABLE 2

|  | 130° C. | 150° C. | 160° C. |
|---|---|---|---|
| Example 1 | A | A | A |
| Example 2 | A | A | A |
| Example 3 | A | A | B |
| Example 4 | A | A | A |
| Example 5 | A | A | B |
| Example 6 | A | A | A |
| Example 7 | A | A | A |
| Example 8 | A | A | A |
| Example 9 | A | A | A |
| Example 10 | A | A | A |
| Example 11 | A | A | A |
| Example 12 | A | A | A |
| Example 13 | A | A | A |
| Example 14 | A | A | A |
| Example 15 | A | A | A |
| Example 16 | A | A | A |
| Example 17 | A | A | A |
| Example 18 | A | A | A |
| Example 19 | A | A | A |
| Example 20 | A | A | A |
| Comparative example 1 | B | C | C |

From the above results it was confirmed that the more the amount of the structural unit (a0-2) within the component (A1) exceeded the range specified in the present invention, the lower the heat resistance of the positive resist composition containing the polymeric compound (A1) became, and the more likely the resist pattern was to suffer dimensional change upon baking.

While preferred examples of the invention have been described above, the present invention is in no way limited by these examples. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A positive resist composition comprising:
   a base component (A) that exhibits increased solubility in an alkali developing solution under action of acid; and
   an acid-generator component (B) that generates acid upon exposure,
   wherein said base component (A) comprising a polymeric compound (A1) containing a structural unit (a0-1) represented by general formula (a0-1) shown below, a structural unit (a0-2) represented by general formula (a0-2) shown below, and a structural unit (a1-0-1) represented by general formula (a1-0-1) shown below, and relative to a combined total of all structural units that constitute said polymeric compound (A1), a proportion of said structural unit (a0-1) is within a range from 10 to 40 mol %, a proportion of said structural unit (a0-2) is within a range from 5 to 20 mol %, and a proportion of said structural unit (a1-0-1) is within a range from 10 to 55 mol %:

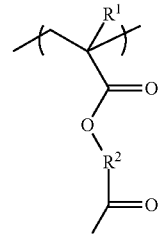
(a0-1)

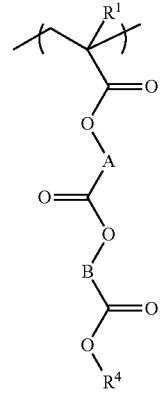
(a0-2)

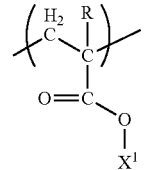
(a1-0-1)

wherein each of $R^1$ and R independently represents a hydrogen atom, an alkyl group of 1 to 5 carbon atoms, or a halogenated alkyl group of 1 to 5 carbon atoms, $R^2$, A and B each represents a divalent linking group, $R^3$ represents a cyclic group containing —$SO_2$— within a ring skeleton thereof, and $R^4$ and $X^1$ each represents an acid-dissociable, dissolution-inhibiting group.

2. The positive resist composition according to claim 1, wherein $R^3$ represents a cyclic group containing —O—$SO_2$— within the ring skeleton thereof.

3. The positive resist composition according to claim 2, wherein $R^3$ is represented by general formula (3-1) shown below:

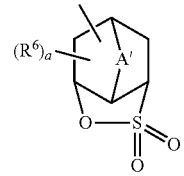
(3-1)

wherein A' represents an oxygen atom, a sulfur atom, or an alkylene group of 1 to 5 carbon atoms which may contain an oxygen atom or a sulfur atom, a represents an integer of 0 to 2, $R^6$ represents an alkyl group, an alkoxy group, a halogenated alkyl group, a hydroxyl group, —COOR", —OC(=O)R", a hydroxyalkyl group or a cyano group, and R" represents a hydrogen atom or an alkyl group.

4. The positive resist composition according to claim 1, wherein said polymeric compound (A1) further comprises a structural unit (a3) derived from an acrylate ester containing a polar group-containing aliphatic hydrocarbon group.

5. The positive resist composition according to claim 1, further comprising: a nitrogen-containing organic compound (D).

6. A method of forming a resist pattern, comprising:
applying a positive resist composition according to claim 1 to a substrate to form a resist film on said substrate;
conducting exposure of said resist film; and
alkali-developing said resist film to form a resist pattern.

7. A polymeric compound (A1) comprising:
a structural unit (a0-1) represented by general formula (a0-1) shown below;
a structural unit (a0-2) represented by general formula (a0-2) shown below; and
a structural unit (a1-0-1) represented by general formula (a1-0-1) shown below,
wherein relative to a combined total of all structural units that constitute said polymeric compound (A1), a proportion of said structural unit (a0-1) is within a range from 10 to 40 mol %, a proportion of said structural unit (a0-2) is within a range from 5 to 20 mol %, and a proportion of said structural unit (a1-0-1) is within a range from 10 to 55 mol %:

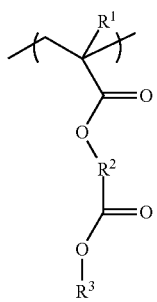

(a0-1)

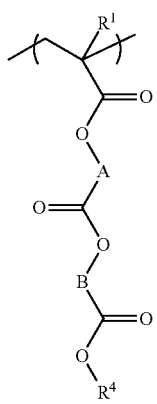

(a0-2)

-continued

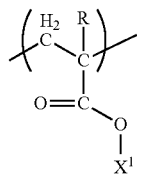

(a1-0-1)

wherein each of $R^1$ and R independently represents a hydrogen atom, an alkyl group of 1 to 5 carbon atoms, or a halogenated alkyl group of 1 to 5 carbon atoms, $R^2$, A and B each represents a divalent linking group, $R^3$ represents a cyclic group containing —$SO_2$— within a ring skeleton thereof, and $R^4$ and $X^1$ each represents an acid-dissociable, dissolution-inhibiting group.

8. The polymeric compound according to claim 7, wherein $R^3$ represents a cyclic group containing —O—$SO_2$— within the ring skeleton thereof.

9. The polymeric compound according to claim 8, wherein $R^3$ is represented by general formula (3-1) shown below:

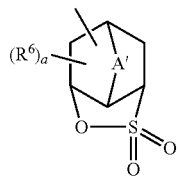

(3-1)

wherein A' represents an oxygen atom, a sulfur atom, or an alkylene group of 1 to 5 carbon atoms which may contain an oxygen atom or a sulfur atom, a represents an integer of 0 to 2, $R^6$ represents an alkyl group, an alkoxy group, a halogenated alkyl group, a hydroxyl group, —COOR", —OC(=O)R", a hydroxyalkyl group or a cyano group, and R" represents a hydrogen atom or an alkyl group.

10. The polymeric compound according to claim 7, further comprising:
a structural unit (a3) derived from an acrylate ester containing a polar group-containing aliphatic hydrocarbon group.

* * * * *

UNITED STATES PATENT AND TRADEMARK OFFICE
CERTIFICATE OF CORRECTION

PATENT NO. : 8,232,041 B2
APPLICATION NO. : 12/694037
DATED : July 31, 2012
INVENTOR(S) : Takahiro Dazai et al.

It is certified that error appears in the above-identified patent and that said Letters Patent is hereby corrected as shown below:

In the Specifications:

In Column 7, Line 48, After "and" insert --a--.

In Column 48, Line 1 (Approx.), Change "(a1-3-9" to --(a1-3-9)--.

In Column 48, Line 35-50 (Approx.),

Change " 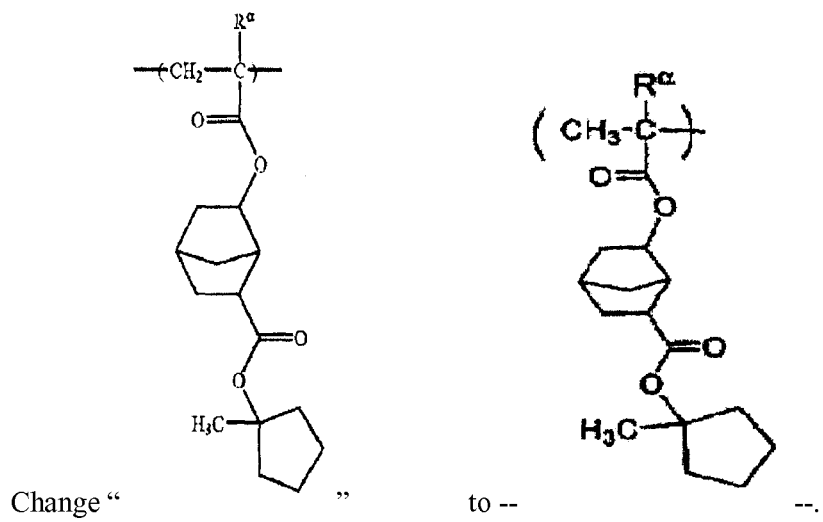 to -- --.

In Column 60, Lines 5-11 (Approx.),

Change " 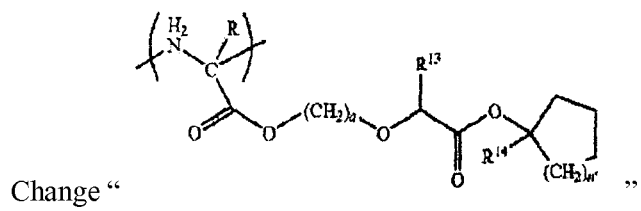 "

Signed and Sealed this
Eighteenth Day of June, 2013

Teresa Stanek Rea
*Acting Director of the United States Patent and Trademark Office*

CERTIFICATE OF CORRECTION (continued)
U.S. Pat. No. 8,232,041 B2

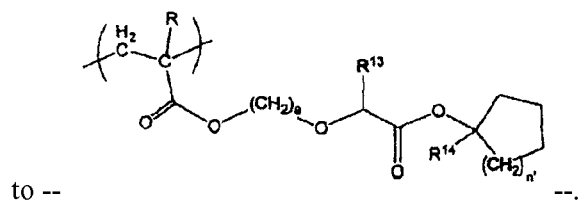

to -- --.

In Column 75, Lines 45-44 (Approx.),

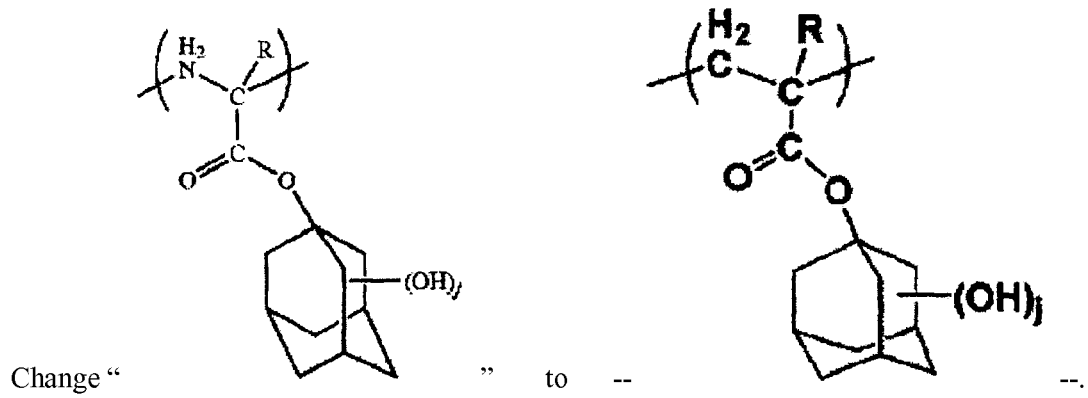

Change " " to -- --.

In Column 75, Lines 56-66 (Approx.),

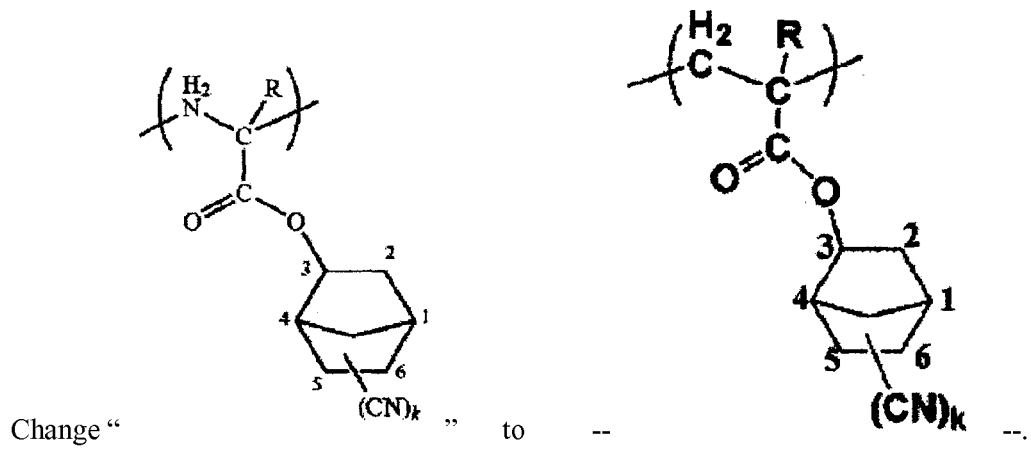

Change " " to -- --.

In Column 76, Lines 2-15 (Approx.),
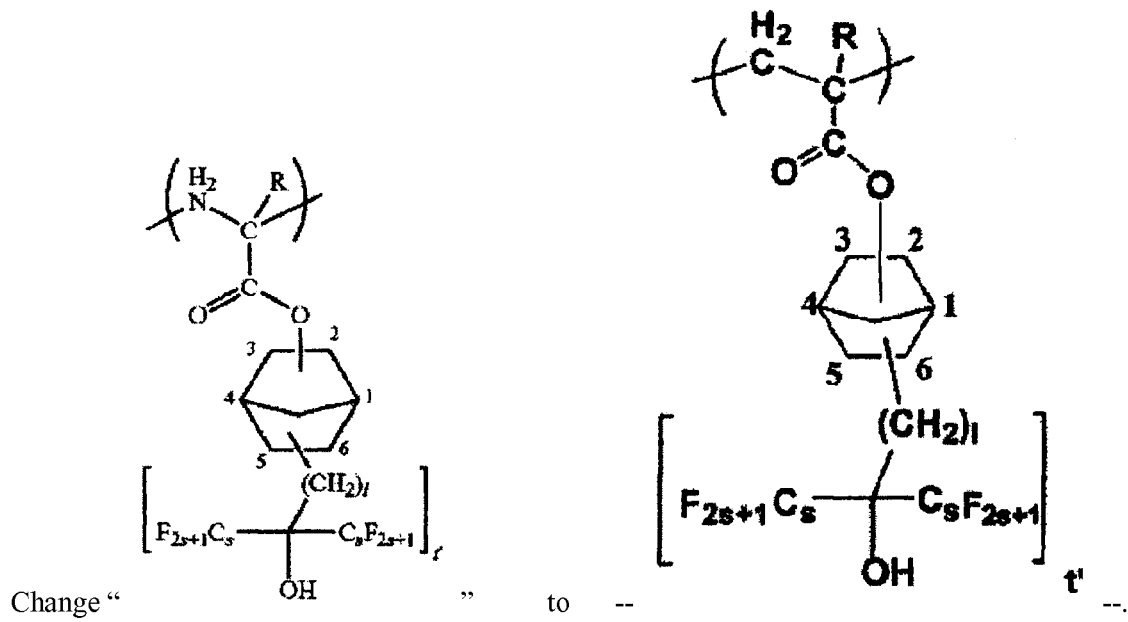
Change " " to -- --.
In Column 76, Line 21 (Approx.), Change "l represents" to --1 represents--.
In Column 76, Line 35, Change "l is" to --1 is--.
In Column 79, Lines 47-54 (Approx.),
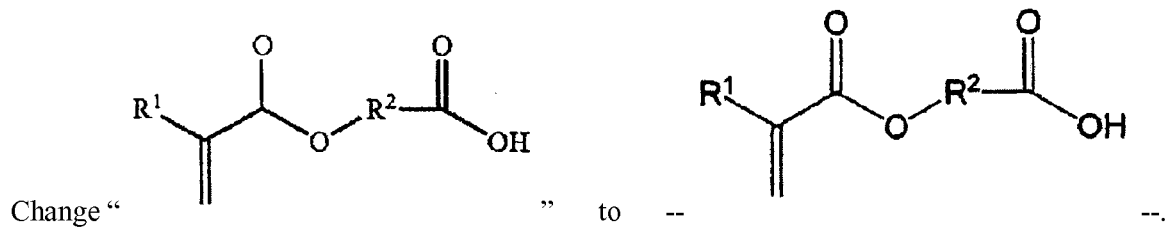
Change " " to -- --.
In Column 84, Line 43, Change "–C(CH$_3$)CH$_2$CH$_2$CH$_3$)–" to -- –C(CH$_3$)(CH$_2$CH$_2$CH$_3$)– --.
In Column 87, Line 43-49 (Approx.),
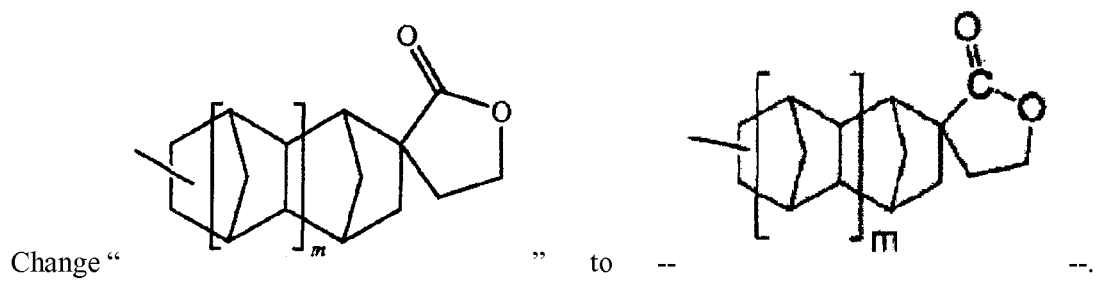
Change " " to -- --.
In Column 89, Lines 11-12, Change "–CH(CF$_3$CH$_2$–," to -- –CH(CF$_3$)CH$_2$–, --.

CERTIFICATE OF CORRECTION (continued)
U.S. Pat. No. 8,232,041 B2

In Column 96, Line 29 (Approx.), Change "(isopropylsulfonyloxyimino)" to --α-(isopropylsulfonyloxyimino)--.

In Column 96, Line 33 (Approx.), Change "(isopropylsulfonyloxyimino)" to --α-(isopropylsulfonyloxyimino)--.

In Column 102, Line 45, Change "as long at" to --as long as--.

In Column 105, Line 45 (Approx.), Change "2 L" to --2L--.

In Column 106, Line 12 (Approx.), Change "2 L" to --2L--.

In Column 123, Lines 45-63 (Approx.),

Change " " to -- --.

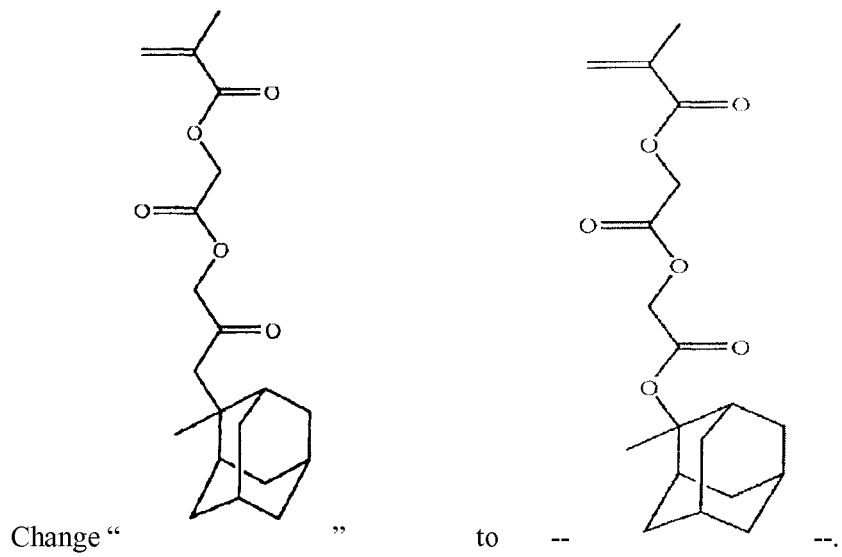

In Column 124, Lines 20-38 (Approx.),

Change " " to -- --.

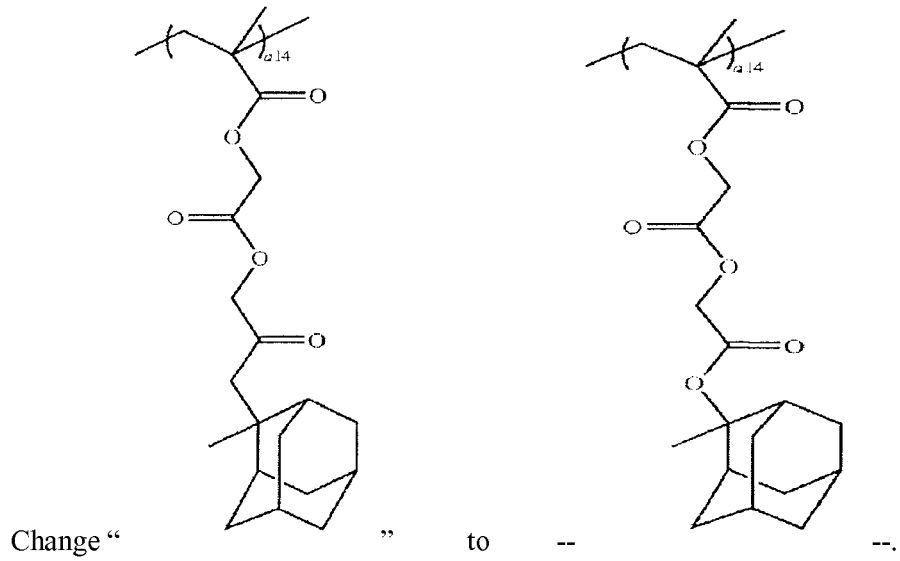

CERTIFICATE OF CORRECTION (continued)
U.S. Pat. No. 8,232,041 B2

In Column 144, Line 64 (Approx.), Change "26" to --27--.

In Column 145, Lines 51-62 (Approx.),

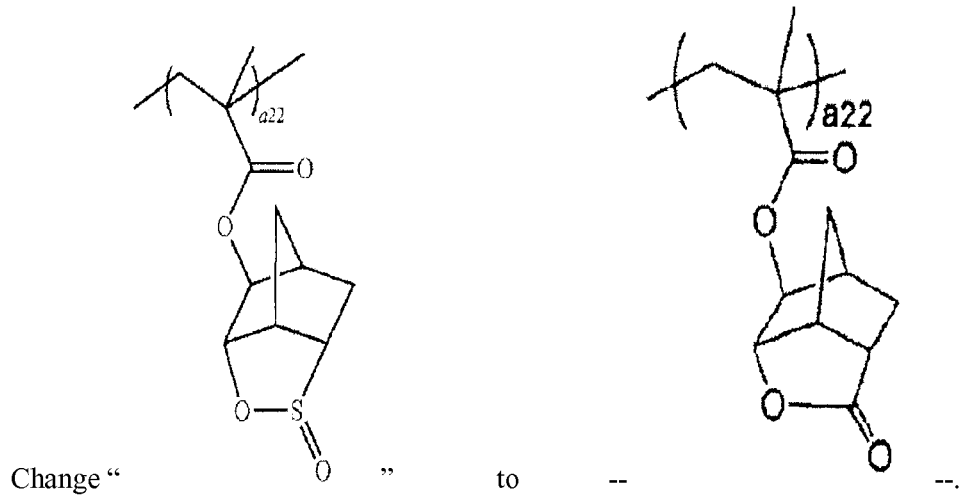

Change " " to -- --.

In Column 149, Lines 24-34 (Approx.),

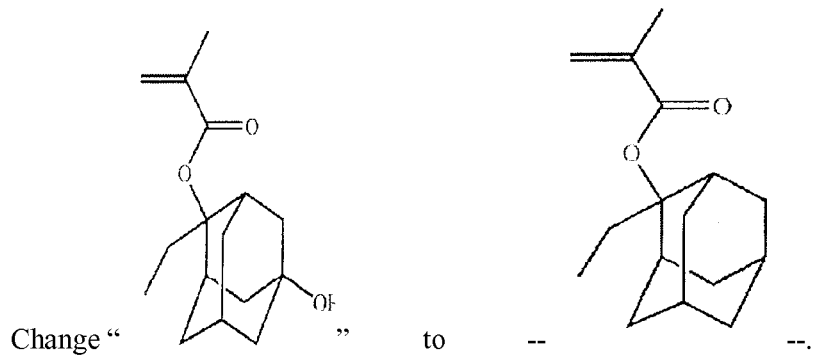

Change " " to -- --.

In Column 156, Lines 45-66 (Approx.),
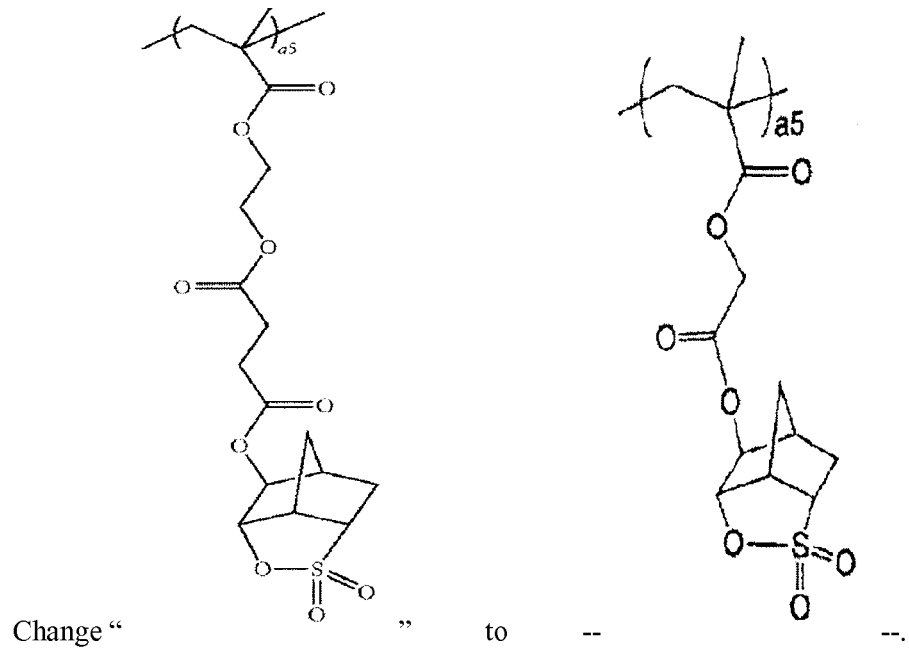
Change " " to -- --.
In Column 156, Lines 45-55 (Approx.),
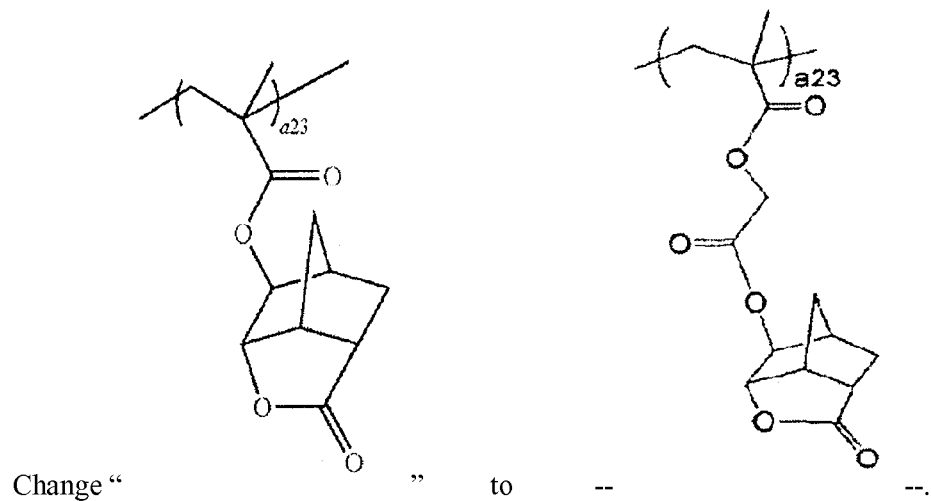
Change " " to -- --.